(12) United States Patent
Min et al.

(10) Patent No.: US 12,107,122 B2
(45) Date of Patent: *Oct. 1, 2024

(54) INTEGRATED CIRCUIT DEVICES

(71) Applicant: Samsung Electronics Co., Ltd., Suwon-si (KR)

(72) Inventors: Sunki Min, Seoul (KR); Donghyun Roh, Suwon-si (KR); Chaeho Na, Changwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/307,074

(22) Filed: Apr. 26, 2023

(65) Prior Publication Data

US 2023/0261047 A1    Aug. 17, 2023

Related U.S. Application Data

(63) Continuation of application No. 17/379,051, filed on Jul. 19, 2021, now Pat. No. 11,670,676.

(30) Foreign Application Priority Data

Dec. 24, 2020    (KR) .......................... 10-2020-0183522

(51) Int. Cl.
    *H01L 29/06* (2006.01)
    *H01L 21/8234* (2006.01)
    (Continued)

(52) U.S. Cl.
    CPC ............ *H01L 29/0649* (2013.01); *H01L 21/823481* (2013.01); *H01L 21/823878* (2013.01); *H01L 27/088* (2013.01); *H01L 27/092* (2013.01)

(58) Field of Classification Search
    CPC ........... H01L 29/0649; H01L 29/66439; H01L 29/0673; H01L 29/66545;
    (Continued)

(56) References Cited

U.S. PATENT DOCUMENTS 6,737,330 B2 *   5/2004   Park ................... H01L 21/76224
                                                                257/E21.546
8,211,779 B2 *   7/2012   Eun .................... H01L 21/76232
                                                                257/E21.546
(Continued)

FOREIGN PATENT DOCUMENTS

KR      1020160132523       11/2016

*Primary Examiner* — Dao H Nguyen
(74) *Attorney, Agent, or Firm* — Myers Bigel, P.A.

(57) ABSTRACT

An integrated circuit device includes: a fin-type active region on a substrate and including a fin top surface at a first level; a gate line on the fin-type active region; and an insulating structure on a sidewall of the fin-type active region. The insulating structure includes: a first insulating liner in contact with a sidewall of the fin-type active region; a second insulating liner on the first insulating liner and including an uppermost portion at a second level c than the first level; a lower buried insulating layer facing the sidewall of the fin-type active region and including a first top surface facing the gate line at a third level lower than the second level; and an upper buried insulating layer between the lower buried insulating layer and the gate line and including a second top surface at a fourth level equal to or higher than the second level.

20 Claims, 53 Drawing Sheets

(51) Int. Cl.
*H01L 21/8238* (2006.01)
*H01L 27/088* (2006.01)
*H01L 27/092* (2006.01)

(58) Field of Classification Search
CPC ..... H01L 21/823481; H01L 21/823878; H01L 21/823431; H01L 27/088; H01L 27/092; H01L 27/0886
See application file for complete search history.

(56) References Cited

U.S. PATENT DOCUMENTS

| | | |
|---|---|---|
| 9,490,348 B2 | 11/2016 | Ching et al. |
| 9,564,353 B2 * | 2/2017 | Huang ................... H01L 21/762 |
| 9,899,388 B2 | 2/2018 | Kim et al. |
| 9,953,885 B2 | 4/2018 | Yuan et al. |
| 10,121,875 B1 * | 11/2018 | Ho ....................... H01L 29/6653 |
| 10,246,774 B2 | 4/2019 | Van Cleemput |
| 10,396,205 B2 * | 8/2019 | Kim ................ H01L 21/823431 |
| 11,670,676 B2 * | 6/2023 | Min .................... H01L 29/0673 |
| | | 257/386 |
| 2010/0090290 A1 | 4/2010 | Sheen et al. |
| 2017/0114459 A1 | 4/2017 | Saly et al. |
| 2022/0406650 A1 * | 12/2022 | Meyer ............. H01L 21/823807 |

\* cited by examiner

X2 - X2'

(I) X2 - X2'

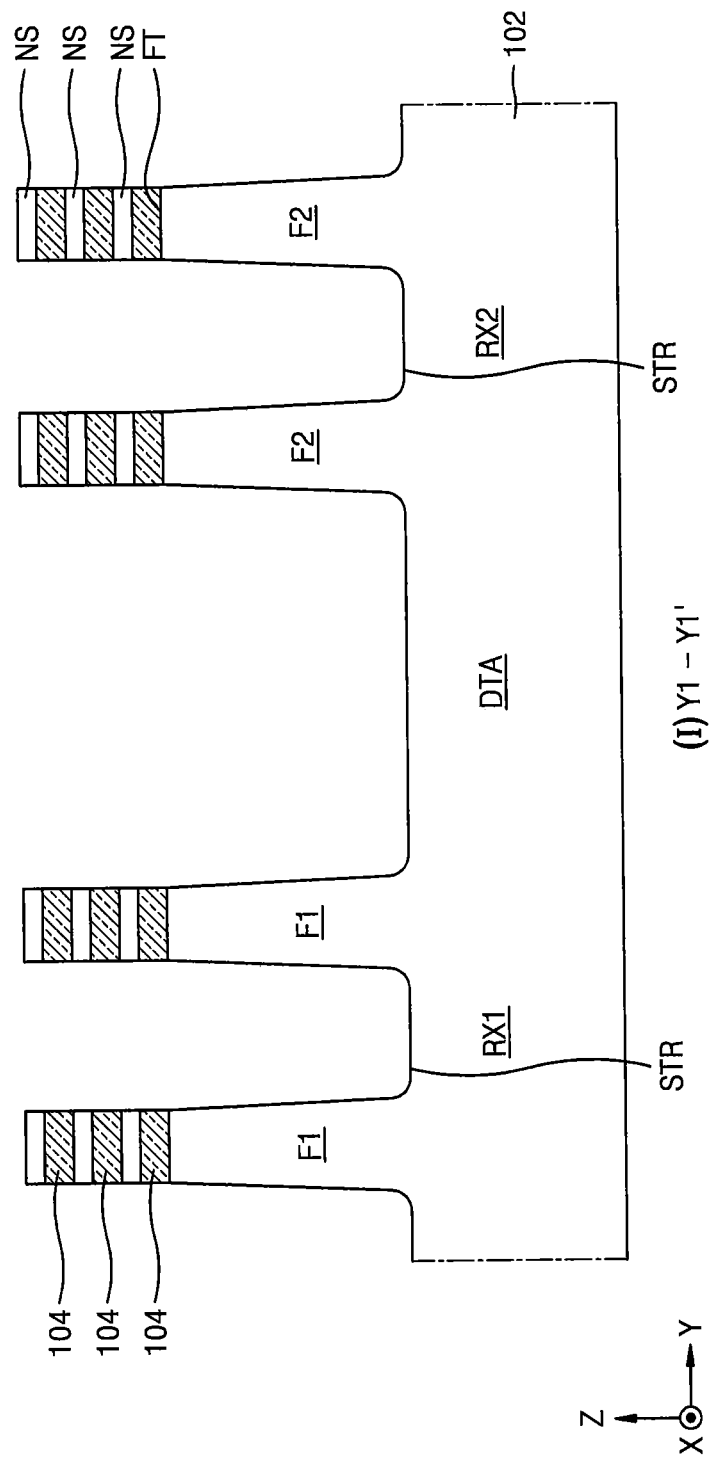

(I) X1 – X1'

(I) X2 - X2'

(I) X2 – X2'

(I) X1 - X1'

(I) X2 - X2'

(I) X1 - X1'

(I) X2 – X2'

(II) Y4 − Y4'

(I) X1 – X1'

(I) X2 - X2'

(II) Y4 - Y4'

(I) X1 - X1'

(I) X2 - X2'

(II) Y4 - Y4'

(I) X1 – X1'

(I) X2 - X2'

(I) X1 – X1'

(I) X2 - X2'

(I) X1 – X1'

(I) X2 - X2'

INTEGRATED CIRCUIT DEVICES

CROSS-REFERENCE TO RELATED APPLICATION

This application is a continuation of and claims priority to U.S. patent application Ser. No. 17/379,051, filed Jul. 19, 2021, which is based on and claims priority under 35 U.S.C. § 119 to Korean Patent Application No. 10-2020-0183522, filed on Dec. 24, 2020, in the Korean Intellectual Property Office, the disclosures of which are incorporated by reference herein in their entirety.

BACKGROUND

The inventive concepts relate to integrated circuit devices, and more particularly, to integrated circuit devices including a field-effect transistor.

Recently, as down-scaling of integrated circuit devices is rapidly progressing, it is beneficial for an integrated circuit device to secure not only a fast operation speed but also accuracy of operation. In addition, as the degree of integration of integrated circuit device increases and the size of integrated circuit devices is reduced, there is a need for the development of a new structure capable of improving the performance and reliability of a nanosheet field-effect transistor.

SUMMARY

The inventive concepts provide integrated circuit devices having a structure capable of improving the performance of a transistor and reducing power consumption by reducing parasitic capacitance between adjacent conductive regions.

According to an aspect of the inventive concepts, there is provided an integrated circuit device including a fin-type active region extending in a first horizontal direction on a substrate and including a fin top surface at a first level; a gate line extending in a second horizontal direction crossing the first horizontal direction on the fin-type active region; and an insulating structure between the substrate and the gate line and on a sidewall of the fin-type active region, wherein the insulating structure includes a first insulating liner in contact with a sidewall of the fin-type active region; a second insulating liner on the sidewall of the fin-type active region with the first insulating liner therebetween and including an uppermost portion at a second level that is closer to a bottom surface of the substrate than the first level; a lower buried insulating layer on the sidewall of the fin-type active region with the first insulating liner and the second insulating liner therebetween and including a first top surface facing the gate line at a third level that is closer to the bottom surface of the substrate than the second level; and, an upper buried insulating layer between the lower buried insulating layer and the gate line and including a second top surface at a fourth level that is at a same distance or farther from the bottom surface of the substrate than the second level.

According to another aspect of the inventive concepts, there is provided an integrated circuit device including a substrate including a device region and an inter-device isolation region defining the device region; a fin-type active region extending in a first horizontal direction in the device region and including a fin top surface at a first level; a nanosheet stack including at least one nanosheet on the fin top surface and spaced apart from the fin top surface in a vertical direction, each nanosheet of the nanosheet stack having a different vertical distance from the fin top surface; a gate line on the at least one nanosheet on the fin-type active region, the gate line extending in a second horizontal direction crossing the first horizontal direction in the device region and the inter-device isolation region; a first insulating structure between the substrate and the gate line in the device region and on a sidewall of the fin-type active region; and a second insulating structure between the substrate and the gate line in the inter-device isolation region, wherein the first insulating structure includes a first insulating liner in contact with the sidewall of the fin-type active region; a second insulating liner on the sidewall of the fin-type active region with the first insulating liner therebetween and including an uppermost portion at a second level that is closer to a bottom surface of the substrate than the first level; a first lower buried insulating layer on the sidewall of the fin-type active region with the first insulating liner and the second insulating liner therebetween, and comprising a first top surface facing the gate line at a third level that is closer to the bottom surface of the substrate than the second level; and a first upper buried insulating layer between the first lower buried insulating layer and the gate line and comprising a second top surface at a fourth level that is at a same distance or farther from the bottom surface of the substrate than the second level.

According to another aspect of the inventive concepts, there is provided an integrated circuit device including a substrate including a first region and a second region spaced apart from each other, the substrate further including a first device isolation trench disposed in the first region and a second device isolation trench disposed in the second region, a first fin-type active region defined by the first device isolation trench in the first region, at least one nanosheet on a first fin top surface of the first fin-type active region and spaced apart from the first fin top surface in a vertical direction, a second fin-type active region defined by the second device isolation trench in the second region and including a second fin top surface higher, relative to a bottom surface of the substrate, than the first fin top surface; a first insulating structure on a sidewall of the first fin-type active region in the first region, and a second insulating structure on a sidewall of the second fin-type active region in the second region, wherein each of the first insulating structure and the second insulating structure device regions a first insulating liner in contact with the substrate; a second insulating liner on the first insulating liner and including an uppermost portion at a second level that is lower, relative to the bottom surface of the substrate, than a first level of the first fin top surface; a lower buried insulating layer on the second insulating liner and including a first top surface at a third level that is lower, relative to the bottom surface of the substrate, than the second level; and an upper buried insulating layer on the uppermost portion of the second insulating liner and the first top surface of the lower buried insulating layer and including a second top surface at a fourth level that is equal to or higher, relative to the bottom surface of the substrate, than the second level.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
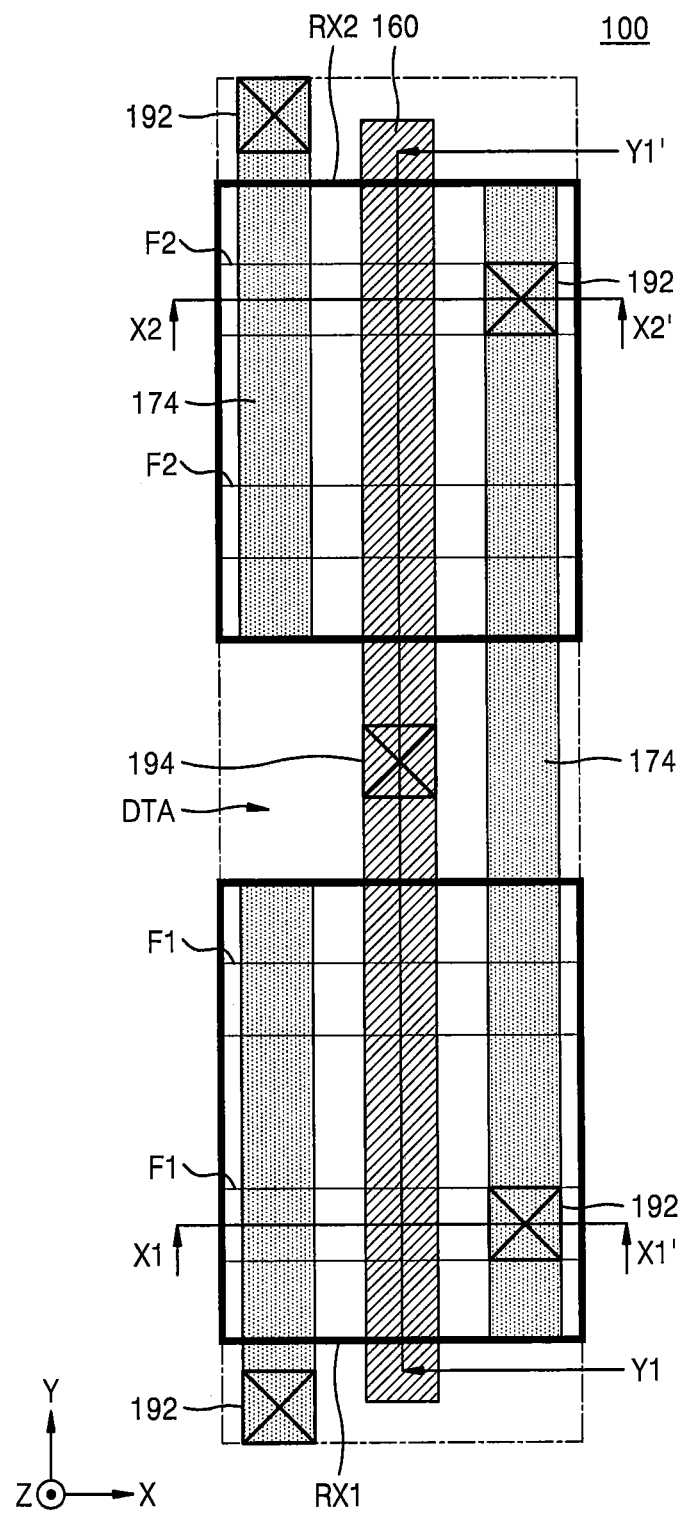
FIG. 1 is a plan layout diagram of some components of an integrated circuit device according to an embodiment of the inventive concepts.

Hereinafter, embodiments of the inventive concepts will be described in detail with reference to the accompanying drawings. The same reference numerals are used for the same elements in the drawings, and redundant descriptions thereof are omitted.

Figure 2A:
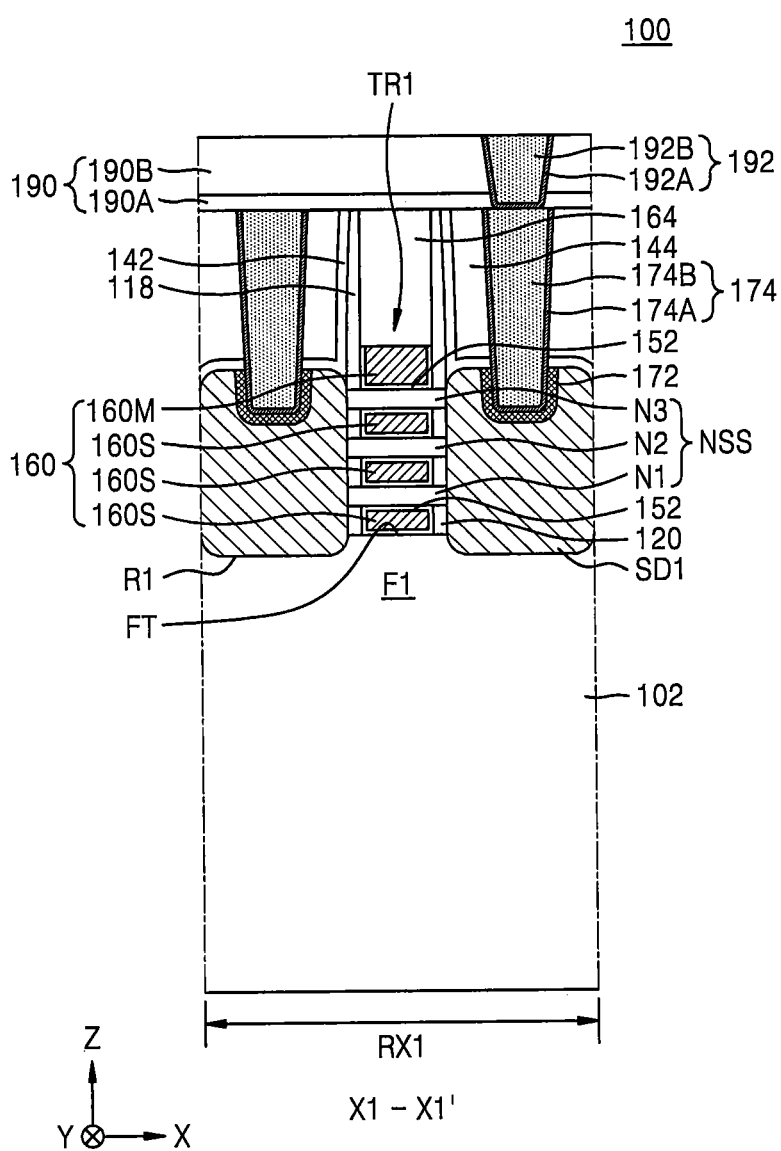
FIG. 2A is a cross-sectional view showing a partial configuration of a cross-section taken along line X1-X1' of FIG. 1.
Figure 2B:
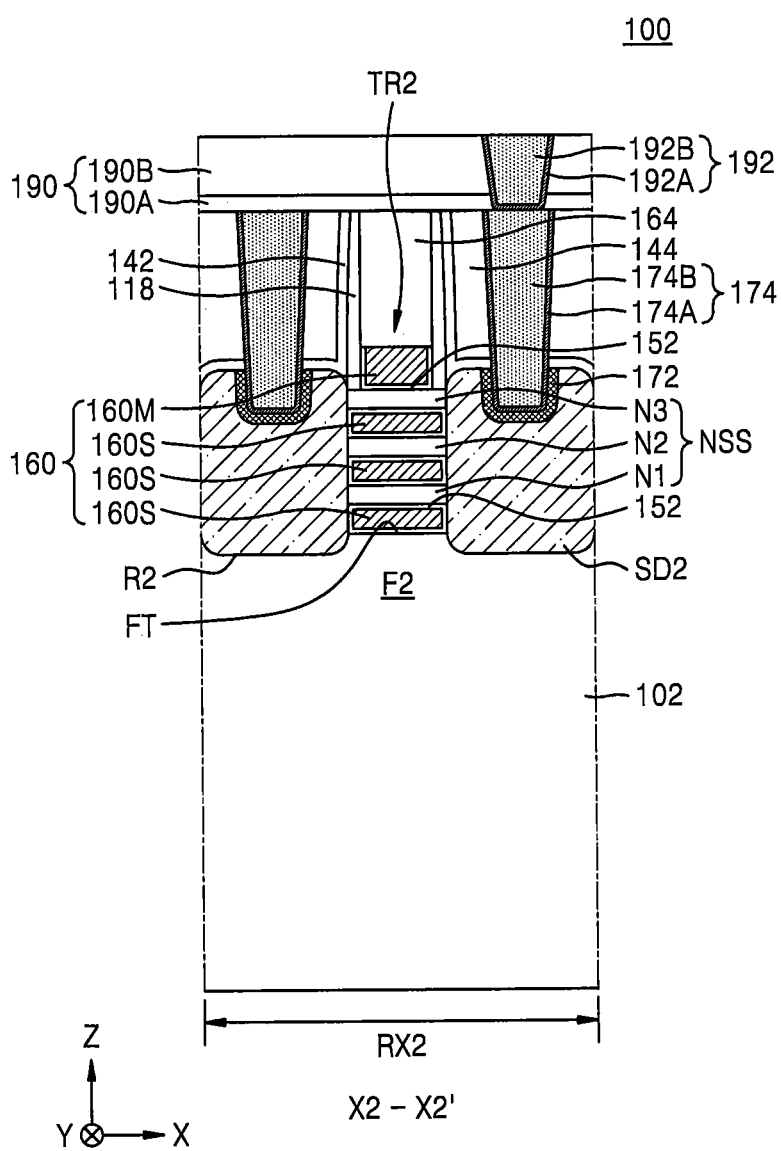
FIG. 2B is a cross-sectional view showing a partial configuration of a cross-section taken along line X2-X2' of FIG. 1.
Figure 2C:
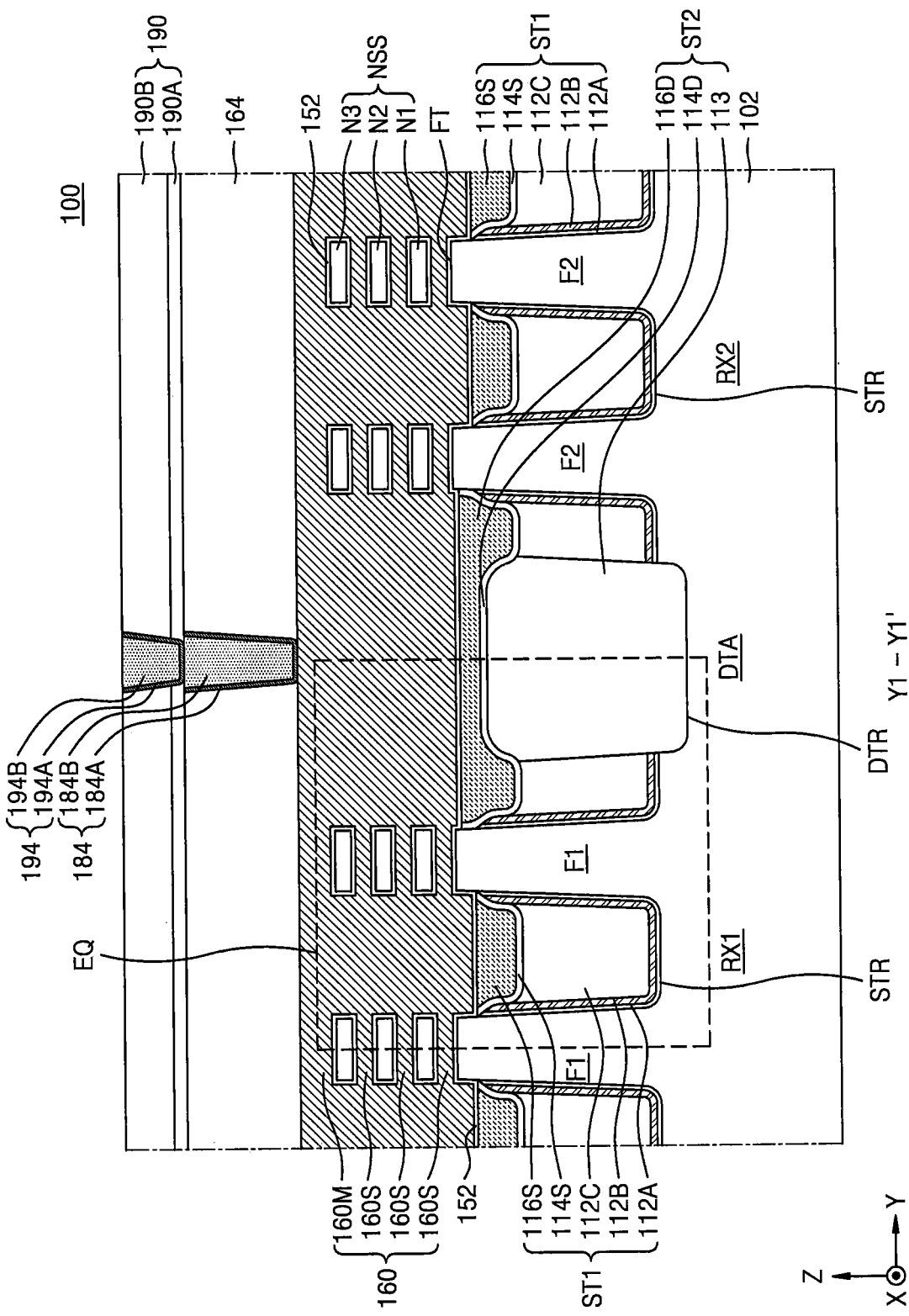
FIG. 2C is a cross-sectional view showing a partial configuration of a cross-section taken along line Y1-Y1' of FIG. 1.
Figure 2D:
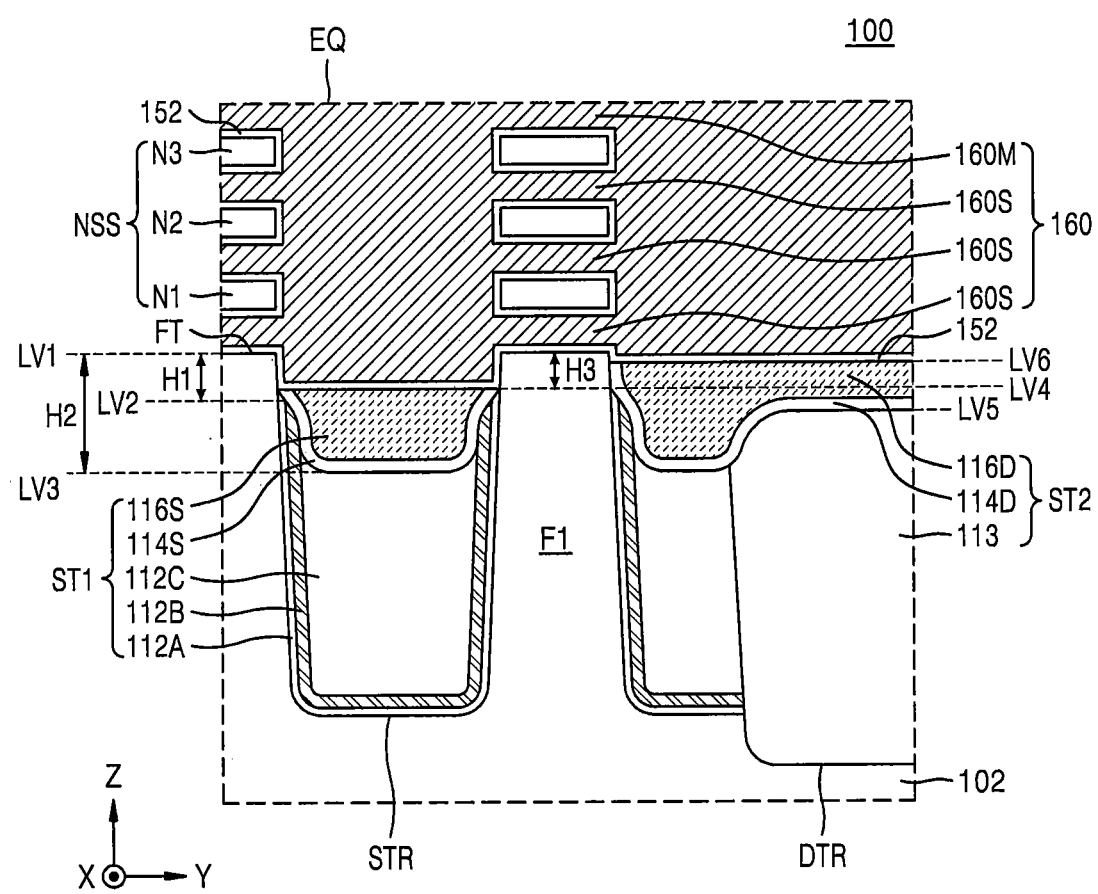
FIG. 2D is an enlarged cross-sectional view of some components included in a region indicated as "EQ" in FIG. 2C.

FIG. 1 is a plan layout diagram of some components of an integrated circuit device according to an embodiment of the inventive concepts. FIG. 2A is a cross-sectional view showing a partial configuration of a cross-section taken along line X1-X1' of FIG. 1, FIG. 2B is a cross-sectional view showing a partial configuration of a cross-section taken along line X2-X2' of FIG. 1, FIG. 2C is a cross-sectional view showing a partial configuration of a cross-section taken along line Y1-Y1' of FIG. 1, and FIG. 2D is an enlarged cross-sectional view of some components included in a region indicated as "EQ" in FIG. 2C.

Referring to FIGS. 1 and 2A to 2D, the integrated circuit device 100 may include a first device region RX1 and a second device region RX2, and a substrate 102 including an inter-device isolation area DTA therebetween. A deep trench DTR may be formed in the substrate 102 in the inter-device isolation area DTA. The first device region RX1 and the second device region RX2 may be defined by the deep trench DTR.

The substrate 102 may include a semiconductor such as Si or Ge, or a compound semiconductor such as SiGe, SiC, GaAs, InAs, InGaAs, or InP. The terms "SiGe", "SiC", "GaAs", "InAs", "InGaAs", and "InP" as used herein mean materials including elements included in the respective terms, and are not equations representing stoichiometric relationships. The substrate 102 may include a conductive region, for example, a well doped with an impurity, or a structure doped with an impurity.

In the first device region RX1 and the second device region RX2, a plurality of fin-type active regions F1 and F2 may protrude from the substrate 102 in a vertical direction (e.g., a Z direction). The plurality of fin-type active regions F1 and F2 may extend parallel to each other in a first horizontal direction (e.g., an X direction). The plurality of fin-type active regions F1 and F2 may be defined by device isolation trenches STR formed in the substrate 102 in the first device region RX1 and the second device region RX2, respectively.

The plurality of fin-type active regions F1 and F2 may include the plurality of first fin-type active regions F1 arranged in the first device region RX1 and the plurality of second fin-type active regions F2 arranged in the second device region RX2. Each of the plurality of fin-type active regions F1 and F2 may have a fin top surface FT of a first level LV1. The term "level" as used herein means a height in a vertical direction (e.g., the Z direction or −Z direction) from a bottom surface of the substrate 102. FIG. 1 illustrates two first fin-type active regions F1 disposed in the first device region RX1 and two second fin-type active regions F2 disposed in the second device region RX2, but one or three or more fin-type active regions F1 and F2 may be disposed in the first device region RX1 and the second device region RX2, respectively.

On the plurality of fin-type active regions F1 and F2, a gate line 160 extends long in a second horizontal direction (e.g., a Y direction) crossing the first horizontal direction (X direction). FIG. 1 illustrates a configuration in which one gate line 160 is disposed on the plurality of fin-type active regions F1 and F2, but the number of gate lines 160 on the plurality of fin-type active regions F1 and F2 is not limited thereto. For example, a plurality of gate lines 160 may be disposed on each of the plurality of fin-type active regions F1 and F2.

A first insulating structure ST1 may be filled in the device isolation trench STR in the first device region RX1 and the second device region RX2. The first insulating structure ST1 may be disposed between the substrate 102 and the gate line 160 and may cover a sidewall of each of the plurality of fin-type active regions F1 and F2.

The first insulating structure ST1 may include a first insulating liner 112A, a second insulating liner 112B, a first lower buried insulating layer 112C, a first upper insulating liner 114S, and a first upper buried insulating layer 116S that are sequentially stacked on the substrate 102.

The first insulating liner 112A may contact sidewalls of each of the plurality of fin-type active regions F1 and F2. An uppermost portion of the first insulating liner 112A may be equal to or lower (e.g., closer to the substrate 102) than the first level LV1 of the fin top surface FT. The second insulating liner 112B may be on and/or face the sidewall of each of the plurality of fin-type active regions F1 and F2 with the first insulating liner 112A therebetween. As used herein, the term "and/or" includes any and all combinations of one or more of the associated listed items. The second insulating liner 112B may have an uppermost portion of a second level LV2 lower (e.g., closer to the substrate 102) than the first level LV1.

The first lower buried insulating layer 112C may be on and/or face the sidewall of each of the plurality of fin-type active regions F1 and F2 with the first insulating liner 112A and the second insulating liner 112B therebetween. A top surface of the first lower buried insulating layer 112C facing the gate line 160 may non-linearly extend in the second horizontal direction (e.g., the Y direction) at a level lower than the second level LV2. A top surface of the first lower buried insulating layer 112C facing the gate line 160 may have a concave shape toward the gate line 160. A lowermost portion of the top surface of the first lower buried insulating layer 112C may be a third level LV3 lower than the second level LV2.

A first height H1 that is a distance in the vertical direction (e.g., the Z direction) from the fin top surface FT of each of the plurality of fin-type active regions F1 and F2 to the second level LV2 that is a level of the uppermost portion of the second insulating liner 112B may be greater than zero. A second height H2 that is a distance in the vertical direction (e.g., the Z direction) from the fin top surface FT of each of the plurality of fin-type active regions F1 and F2 to the third level LV3 that is a level of a lowermost portion of the top surface of the first lower buried insulating layer 112C may be greater than the first height H1.

The first upper insulating liner 114S may be interposed between the second insulating liner 112B and the first upper buried insulating layer 116S, and between the first lower buried insulating layer 112C and the first upper buried insulating layer 116S. The first upper insulating liner 114S may include a portion in contact with an uppermost portion of the second insulating liner 112B and a portion in contact with a top surface of the first lower buried insulating layer 112C.

The first upper buried insulating layer 116S may be interposed between the first lower buried insulating layer 112C and the gate line 160. The first upper insulating liner 114S may be interposed between a top surface of the first lower buried insulating layer 112C and a bottom surface of the first upper buried insulating layer 116S.

A top surface of the first upper buried insulating layer 116S may extend flatly in the horizontal direction (e.g., the X direction and the Y direction) at a fourth level LV4 higher (e.g., farther from the substrate 102) than the second level LV2. The bottom surface of the first upper buried insulating layer 116S may face the top surface of the first lower buried insulating layer 112C with the first upper insulating liner 114S therebetween, and have a convex shape toward the substrate 102 corresponding to a concave shape of the top surface of the first lower buried insulating layer 112C.

A third height H3 that is a distance in the vertical direction (e.g., the Z direction) from the fin top surface FT of each of the plurality of fin-type active regions F1 and F2 to the fourth level LV4 that is a level of the top surface of the first upper buried insulating layer 116S may be greater than or equal to zero. In some embodiments, the third height H3 may be equal to or smaller than the first height H1. That is, the level of the top surface of the first upper buried insulating layer 116S may be equal to or higher than the level of the uppermost portion of the second insulating liner 112B.

In some embodiments, the first insulating liner 112A and the second insulating liner 112B may include different materials. For example, the first insulating liner 112A may include a silicon oxide layer, and the second insulating liner 112B may include a silicon nitride layer.

In some embodiments, each of the first lower buried insulating layer 112C and the first upper insulating liner 114S may include a silicon oxide layer. The first upper buried insulating layer 116S may include a silicon oxide layer including at least one impurity element selected from a nitrogen (N) atom and/or a fluorine (F) atom. Expressions such as "at least one of," when preceding a list of elements, modify the entire list of elements and do not modify the individual elements of the list. In some embodiments, a density of the silicon oxide layer constituting the first lower buried insulating layer 112C may be lower than a density of each of the first upper insulating liner 114S and the first upper buried insulating layer 116S.

A second insulating structure ST2 may be disposed between the substrate 102 and the gate line 160 in the inter-device isolation area DTA. The second insulating structure ST2 may fill in a deep trench DTR. The second insulating structure ST2 may be spaced apart from the plurality of fin-type active regions F1 and F2 in the second horizontal direction (e.g., the Y direction).

The second insulating structure ST2 may include a second lower buried insulating layer 113, a second upper insulating liner 114D, and a second upper buried insulating layer 116D that are sequentially stacked on the substrate 102.

At least a part of a top surface of the second lower buried insulating layer 113 may be at a level higher than the top surface of the first lower buried insulating layer 112C. The top surface of the first lower buried insulating layer 112C may have an uppermost portion of a fifth level LV5 higher than the third level LV3.

The second upper buried insulating layer 116D may be interposed between the second lower buried insulating layer 113 and the gate line 160. The second upper insulating liner 114D may be interposed between the top surface of the second lower buried insulating layer 113 and the bottom surface of the second upper buried insulating layer 116D.

The second upper buried insulating layer 116D may have a top surface that extends flatly in the horizontal direction (e.g., the X and the Y directions) at a sixth level LV6 higher than the fourth level LV4 that is a level of a top surface of the first upper buried insulating layer 116S.

The top surface of the second lower buried insulating layer 113 may have a convex shape toward the gate line 160. A bottom surface of the second upper buried insulating layer 116D may face the top surface of the second lower buried insulating layer 113 with the second upper insulating liner 114D therebetween, and have a concave shape toward the substrate 102 corresponding to a convex shape of the top surface of the second lower buried insulating layer 113.

Each of the second lower buried insulating layer 113 and the second upper insulating liner 114D may include a silicon oxide layer. In some embodiments, a density of the silicon oxide layer constituting each of the second lower buried insulating layer 113 and the second upper insulating liner 114D may be higher than a density of the silicon oxide layer constituting the first lower buried insulating layer 112C. The second upper buried insulating layer 116D may include a silicon oxide layer including at least one impurity element selected from a nitrogen (N) atom and a fluorine (F) atom. In some embodiments, the first upper insulating liner 114S and the second upper insulating liner 114D may include the same material, and the first upper buried insulating layer 116S and the second upper buried insulating layer 116D may include the same material. In some embodiments, a content of the impurity element in each of the first upper buried insulating layer 116S and the second upper buried insulating layer 116D may be about 0.1 atomic % to about 20 atomic %, but is not limited thereto.

The gate line 160 may extend in the second horizontal direction (e.g., the Y direction) on the plurality of fin-type active regions F1 and F2, the first insulating structure ST1, and the second insulating structure ST2. A plurality of nanosheet stacks NSS may be disposed on the fin top surface FT of each of the plurality of fin-type active regions F1 and F2 in regions where the plurality of fin-type active regions F1 and F2 and the gate line 160 cross each other. The plurality of nanosheet stacks NSS may face the fin top surface FT at positions spaced apart from the plurality of fin-type active regions F1 and F2 in the vertical direction (e.g., the Z direction), respectively.

The plurality of nanosheet stacks NSS may include a plurality of nanosheets N1, N2, and N3 overlapping each other in the vertical direction (e.g., the Z direction) on the fin top surface FT of each of the fin-type active regions F1 and F2. The term "nanosheet" as used herein refers to a conductive structure having a cross-section substantially perpendicular to a direction in which a current flows in the conductive structure. It should be understood that the nanosheets may include nanowires. The plurality of nanosheets N1, N2, and N3 may have different vertical distances (e.g., Z-direction distances) from the fin top surface FT. The plurality of nanosheets N1, N2, and N3 may include the first nanosheet N1, the second nanosheet N2, and the third nanosheet N3 that are sequentially stacked on the fin top surface FT of the fin-type active regions F1 and F2.

The number of the nanosheet stacks NSS and the gate lines 160 disposed on one fin-type active region F1 or F2 is not limited to those in the figures. For example, one or a plurality of nanosheet stacks NSS and one or a plurality of gate lines 160 may be disposed on one fin-type active region F1 or F2.

FIGS. 2A to 2D illustrate a case in which each of the plurality of nanosheet stacks NSS includes the three nanosheets N1, N2, and N3, but the embodiments of the inventive concepts are not limited thereto. The number of nanosheets constituting the nanosheet stack NSS is not particularly limited. For example, each of the plurality of nanosheet stacks NSS may include one, two, or four or more nanosheets. Each of the plurality of nanosheets N1, N2, and N3 may have a channel region. For example, each of the plurality of nanosheets N1, N2, and N3 may have a thickness selected within a range of about 4 nm to about 6 nm, but is not limited thereto. Here, the thickness of the plurality of nanosheets N1, N2, and N3 means a size along the vertical direction (e.g., the Z direction). In some embodiments, the plurality of nanosheets N1, N2, and N3 may have substantially the same thickness in the vertical direction (e.g., the Z direction). In some embodiments, at least some of the plurality of nanosheets N1, N2, and N3 may have different thicknesses along a vertical direction (e.g., the Z direction).

As shown in FIGS. 2A and 2B, each of the plurality of nanosheets N1, N2, and N3 included in one nanosheet stack NSS may have the same size in the first horizontal direction (e.g., the X direction). In some embodiments, at least some of the plurality of nanosheets N1, N2, and N3 included in one nanosheet stack NSS may have different sizes in the first horizontal direction (e.g., the X direction). For example, among the plurality of nanosheets N1, N2, and N3 in the first horizontal direction (e.g., the X direction), a length of each of the first nanosheet N1 and the second nanosheet N2 relatively close to the fin top surface FT may be smaller than a length of the third nanosheet N3 farthest from the fin top surface FT.

As illustrated in FIG. 2A, a plurality of first recesses R1 may be formed in the top surface of the first fin-type active region F1 in the first device region RX1, and as illustrated in FIG. 2B, a plurality of second recesses R2 may be formed in the top surface of the second fin-type active region F2 in the second device region RX2. FIGS. 2A and 2B illustrate a case where a level of a lowermost surface of each of the plurality of first and second recesses R1 and R2 is lower than the level of the fin top surface FT of the plurality of fin-type active regions F1 and F2, but the embodiments of the inventive concepts are not limited thereto. The level of the lowermost surface of each of the plurality of first and second recesses R1 and R2 may be the same as or similar to the level of the fin top surface FT of the fin-type active regions F1 and F2.

As shown in FIGS. 2A and 2B, a plurality of first source/drain regions SD1 may be formed on the plurality of first recesses R1 in the first device region RX1, and a plurality of second source/drain regions SD2 may be formed on the plurality of second recesses R2 in the second device region RX2.

The gate line 160 may surround each of the plurality of nanosheets N1, N2, and N3 while covering the plurality of nanosheet stacks NSS on the plurality of fin-type active regions F1 and F2. A plurality of transistors may be formed on parts of the substrate 102 where the plurality of fin-type active regions F1 and F2 and the gate line 160 cross each other. In some embodiments, the first device region RX1 may be an NMOS transistor region, and the second device region RX2 may be a PMOS transistor region. A plurality of NMOS transistors TR1 may be formed in parts of the first device region RX1 where the first fin-type active region F1 and the gate line 160 cross each other, and a plurality of PMOS transistors TR2 may be formed in parts of the second device region RX2 where the active region F2 and the gate line 160 cross each other.

The gate line 160 may include a main gate portion 160M and a plurality of sub gate portions 160S. The main gate portion 160M may cover the top surface of the nanosheet stack NSS and extend long in (e.g., have a longitudinal axis extending in) the second horizontal direction (e.g., the Y direction). The plurality of sub gate portions 160S may be integrally connected to the main gate portion 160M, and disposed between the plurality of nanosheets N1, N2, and N3, and between the fin-type active regions F1 and F2 and the first nanosheet N1.

The gate line 160 may include a metal, a metal nitride, a metal carbide, or a combination thereof. The metal may be selected from Ti, W, Ru, Nb, Mo, Hf, Ni, Co, Pt, Yb, Tb, Dy, Er, and/or Pd. The metal nitride may be selected from TiN and/or TaN. The metal carbide may be TiAlC. In some embodiments, the gate line 160 may have a structure in which a metal nitride layer, a metal layer, a conductive capping layer, and a gap-fill metal layer are sequentially stacked. The metal nitride layer and the metal layer may include at least one metal selected from Ti, Ta, W, Ru, Nb, Mo, and/or Hf. The gap-fill metal layer may include a W layer and/or an Al layer. The plurality of gate lines 160 may include at least one work function metal-containing layer. The at least one work function metal-containing layer may include at least one metal selected from Ti, W, Ru, Nb, Mo, Hf, Ni, Co, Pt, Yb, Tb, Dy, Er, and/or Pd. In some embodiments, the gate line 160 may have a stack structure of TiAlC/TiN/W, a stack structure of TiN/TaN/TiAlC/TiN/W, or a stack structure of TiN/TaN/TiN/TiAlC/TiN/W, but is not limited to the above examples. In some embodiments, the gate line 160 may have different stack structures in the first device region RX1 and the second device region RX2.

A gate dielectric layer 152 may be interposed between the plurality of nanosheets N1, N2, and N3 and the gate line 160. The gate dielectric layer 152 may include portions respectively covering surfaces of the plurality of nanosheets N1, N2, and N3, portions covering sidewalls of the main gate portion 160M, portions respectively covering the fin top surfaces FT of the plurality of fin-type active regions F1 and F2, portions covering the top surface of the first insulating structure ST1, and portions covering the top surface of the second insulating structure ST2.

In some embodiments, the gate dielectric layer 152 may include a material different from a material of each of the first upper insulating liner 114S, the second upper insulating liner 114D, the first upper buried insulating layer 116S, and the second upper buried insulating layer 116D. For example, the gate dielectric layer 152 may include a high dielectric layer. The high dielectric layer may include a material having a higher dielectric constant than that of a silicon oxide layer. For example, the high dielectric layer may have a dielectric constant of about 10 to about 25. The high dielectric layer may include hafnium oxide, but is not limited thereto.

The plurality of nanosheets N1, N2, and N3 may include semiconductor layers of the same element. In an example, each of the plurality of nanosheets N1, N2, and N3 may include a Si layer. In the first device region RX1, the plurality of nanosheets N1, N2, and N3 may be doped with a dopant having the same conductivity type as that of the first source/drain region SD1. In the second device region RX2, the plurality of nanosheets N1, N2, and N3 may be doped with a dopant having the same conductivity type as that of the second source/drain region SD2. For example, the plurality of nanosheets N1, N2, and N3 in the first device region RX1 may include a Si layer doped with an n-type dopant, and the plurality of nanosheets N1, N2, and N3 in the second device region RX2 may include a Si layer doped with a p-type dopant.

On each of the plurality of fin-type active regions F1 and F2, the first insulating structure ST1, and the second insulating structure ST2, both sidewalls of the gate line 160 may be covered with a plurality of outer insulating spacers 118 (see FIG. 2A and FIG. 2B). The plurality of outer insulating spacers 118 may cover both sidewalls of the main gate portion 160M on the top surface of the plurality of nanosheet stacks NSS. Each of the plurality of outer insulating spacers 118 may be spaced apart from the gate line 160 with the gate dielectric layer 152 therebetween. The plurality of outer insulating spacers 118 may include silicon nitride, silicon oxide, SiCN, SiBN, SiON, SiOCN, SiBCN, SiOC, or a combination thereof. The terms "SiCN", "SiBN", "SiON", "SiOCN", "SiBCN", and "SiOC" as used herein mean materials including elements included in the respective terms, and are not equations representing stoichiometric relationships.

As illustrated in FIG. 2A, a plurality of inner insulating spacers 120 may be interposed between the plurality of nanosheets N1, N2, and N3, and between the fin top surface FT of the first fin-type active region F1 and the first nanosheet N1 in the first device region RX1. The plurality of inner insulating spacers 120 may be interposed between the plurality of sub gate portions 160S and the first source/drain regions SD1 in the first horizontal direction (e.g., the X direction).

In the first horizontal direction (e.g., the X direction), both sidewalls of each of the plurality of sub gate portions 160S in the first device region RX1 may be covered with the inner insulating spacer 120 with the gate dielectric layer 152 therebetween. Each of the plurality of sub gate portions 160S in the first device region RX1 may be spaced apart from the first source/drain regions SD1 with the gate dielectric layer 152 and the inner insulating spacer 120 therebetween. Each of the plurality of inner insulating spacers 120 may contact the first source/drain region SD1. At least some of the plurality of inner insulating spacers 120 may overlap the outer insulating spacer 118 in the vertical direction (e.g., the Z direction). The inner insulating spacer 120 may include silicon nitride, silicon oxide, SiCN, SiBN, SiON, SiOCN, SiBCN, SiOC, or a combination thereof. The inner insulating spacer 120 may further include an air gap. In some embodiments, the inner insulating spacer 120 and the outer insulating spacer 118 may include the same material. In some embodiments, the outer insulating spacer 118 and the inner insulating spacer 120 may include different materials.

In the first horizontal direction (e.g., the X direction), the plurality of first source/drain regions SD1 in the first device region RX1 may respectively face the plurality of sub gate portions 160S with the inner insulating spacer 120 therebetween. The plurality of first source/drain regions SD1 may not include a portion in contact with the gate dielectric layer 152.

As illustrated in FIG. 2B, both sidewalls of each of the plurality of sub gate portions 160S in the second device region RX2 in the first horizontal direction (e.g., the X direction) may be spaced apart from the second source/drain area SD2 with the gate dielectric layer 152 therebetween. In the second device region RX2, the gate dielectric layer 152 may include a portion in contact with the second source/drain region SD2. In the first horizontal direction (e.g., the X direction), the plurality of second source/drain regions SD2 may respectively face the nanosheet stack NSS and the plurality of sub gate portions 160S.

As illustrated in FIGS. 2A to 2C, the gate line 160 and the gate dielectric layer 152 may be covered with a capping insulating pattern 164. The capping insulating pattern 164 may include a silicon nitride layer.

In the first device region RX1, the main gate portion 160M of the gate line 160 may be spaced apart from the first source/drain region SD1 with the outer insulating spacer 118 therebetween. In the second device region RX2, the main gate portion 160M of the gate line 160 may be spaced apart from the second source/drain region SD2 with the outer insulating spacer 118 therebetween.

When the first device region RX1 is an NMOS transistor region and the second device region RX2 is a PMOS transistor region, the plurality of first source/drain regions SD1 in the first device region RX1 may include a Si layer doped with an n-type dopant or a SiC layer doped with an n-type dopant, and the plurality of second source/drain regions SD2 in the second device region RX2 may include a SiGe layer doped with a p-type dopant. The n-type dopant may be selected from P (phosphorus), As (arsenic), and Sb (antimony). The p-type dopant may be selected from B (boron) and Ga (gallium).

The plurality of first source/drain regions SD1 in the first device region RX1 and the plurality of second source/drain regions SD2 in the second device region RX2 may have different shapes and sizes. However, the embodiments of the inventive concepts are not limited thereto, and the plurality of first and second source/drain regions SD1 and SD2 having various shapes and sizes in the first device region RX1 and the second device region RX2 may be formed.

As illustrated in FIGS. 2A and 2B, the plurality of first and second source/drain regions SD1 and SD2 may be covered with an insulating liner 142. The insulating liner 142 may conformally cover the surfaces of the plurality of first and second source/drain regions SD1 and SD2 and the outer insulating spacer 118. The insulating liner 142 may include SiN, SiCN, SiBN, SiON, SiOCN, SiBCN, SiOC, SiO$_2$, or a combination thereof.

In the first device region RX1 and the second device region RX2, the first and second source/drain regions SD1 and SD2 may be covered with an inter-gate insulating layer 144. The insulating liner 142 may be interposed between the inter-gate insulating layer 144 and the first and second source/drain regions SD1 and SD2. The inter-gate insulating layer 144 may be formed of a silicon nitride layer, a silicon oxide layer, SiON, SiOCN, or a combination thereof. The plurality of capping insulating patterns 164 and the inter-gate insulating layer 144 between each of the plurality of capping insulating patterns 164 may be covered with the interlayer insulating layer 190. The interlayer insulating layer 190 may include an etch stop layer 190A and an insulating layer 190B. The etch stop layer 190A may include silicon carbide (SiC), SiN, nitrogen-doped silicon carbide (SiC:N), SiOC, AlN, AlON, AlO, AlOC, or a combination thereof. The insulating layer 190B may include an oxide layer, a nitride layer, an ultra low-k (ULK) layer having an ultra low dielectric constant K of about 2.2 to about 2.4, or a combination thereof. For example, the insulating layer 190B may include a tetraethylorthosilicate (TEOS) layer, a high density plasma (HDP) layer, a boro-phospho-silicate glass (BPSG) layer, a flowable chemical vapor deposition (FCVD) oxide layer, a SiON layer, a SiN layer, a SiOC layer, a SiCOH layer, or a combination thereof.

As illustrated in FIGS. 2A and 2B, a plurality of source/drain contacts 174 and a plurality of source/drain via contacts 192 may be formed on the plurality of first and second source/drain regions SD1 and SD2 in the first device region RX1 and the second device region RX2. The plurality of first and second source/drain regions SD1 and SD2 may be connected to an upper conductive line (not shown) through the plurality of source/drain contacts 174 and the plurality of source/drain via contacts 192.

A metal silicide layer 172 may be formed between the first and second source/drain regions SD1 and SD2 and the source/drain contact 174. In some embodiments, the metal silicide layer 172 may include Ti, W, Ru, Nb, Mo, Hf, Ni, Co, Pt, Yb, Tb, Dy, Er, and/or Pd. For example, the metal silicide layer 172 may include titanium silicide.

The plurality of source/drain contacts 174 may penetrate the inter-gate insulating layer 144 and the insulating liner 142 in the vertical direction (e.g., the Z direction) to contact the metal silicide layer 172. The plurality of source/drain via contacts 192 may penetrate the interlayer insulating layer 190 in the vertical direction (e.g., the Z direction) to contact the top surface of the source/drain contact 174. The plurality of source/drain contacts 174 may include a conductive barrier layer 174A and a metal plug 174B. The plurality of source/drain via contacts 192 may include a conductive barrier layer 192A and a metal plug 192B.

As illustrated in FIG. 2C, a gate contact 184 and a gate via contact 194 may be formed on the gate line 160. The gate line 160 may be connected to an upper conductive line (not shown) through the gate contact 184 and the gate via contact 194. The gate contact 184 may include a conductive barrier layer 184A and a metal plug 184B. The gate via contact 194 may include a conductive barrier layer 194A and a metal plug 194B.

The conductive barrier layers 174A, 184A, 192A, and 194A may include Ti, Ta, TiN, TaN, or a combination thereof, and the metal plugs 174B, 184B, 192B, and 194B may include W, Co, Cu, Ru, Mn, or a combination thereof, but the inventive concepts are not limited thereto.

The gate contact 184 and the gate via contact 194 may be disposed in the inter-device isolation area DTA and configured to be connected to the main gate portion 160M of the gate line 160. However, the embodiments of the inventive concepts are not limited thereto. For example, the gate contact 184 and the gate via contact 194 may be disposed in at least one of the first device region RX1 and the second device region RX2, and may be configured to be connected to the main gate portion 160M.

The gate contact 184 may penetrate the capping insulating pattern 164 in the vertical direction (e.g., the Z direction) to contact the top surface of the gate line 160. The gate via contact 194 may penetrate the interlayer insulating layer 190 in the vertical direction (e.g., the Z direction) to contact the top surface of the gate contact 184.

In some embodiments, a sidewall of each of the plurality of source/drain contacts 174, the plurality of source/drain via contacts 192, the gate contact 184, and the gate via contact 194 may be surrounded by a contact insulating spacers (not shown). The contact insulating spacer may include SiCN, SiCON, silicon nitride (SiN), or a combination thereof, but is not limited thereto.

The integrated circuit device 100 illustrated in FIGS. 1 and 2A to 2D may include the first insulating structure ST1 filled in the device isolation trench STR in each of the first device region RX1 and the second device region RX2 and covering a sidewall of each of the plurality of fin-type active regions F1 and F2. The first insulating structure ST1 may include a first upper insulating liner 114S and a first upper buried insulating layer 116S covering a top surface of the first lower buried insulating layer 112C. A level of a top surface of the first upper buried insulating layer 116S may be equal to or higher than a level of an uppermost portion of the second insulating liner 112B. Therefore, even when a level of the top surface of the first lower buried insulating layer 112C is lower than the level of the uppermost portion of the second insulating liner 112B during a manufacturing process of the integrated circuit device 100, a space of a level lower than the level of the uppermost portion of the second insulating liner 112B on the top surface of the first lower buried insulating layer 112C may be filled by the first upper insulating liner 114S and the first upper buried insulating layer 116S. Accordingly, a sufficient insulating space may be secured between the fin-type active regions F1 and F2 and the gate line 160 by the first insulating structure ST1, and thus a parasitic capacitance generated by coupling between the fin-type active regions F1 and F2 and the gate line 160 may be reduced. Accordingly, an ON current characteristic and an OFF current characteristic of each of a plurality of transistors formed in the first device region RX1 and the second device region RX2 may be improved, which may contribute to improvement of the performance and reliability of the transistors.

Figure 3:
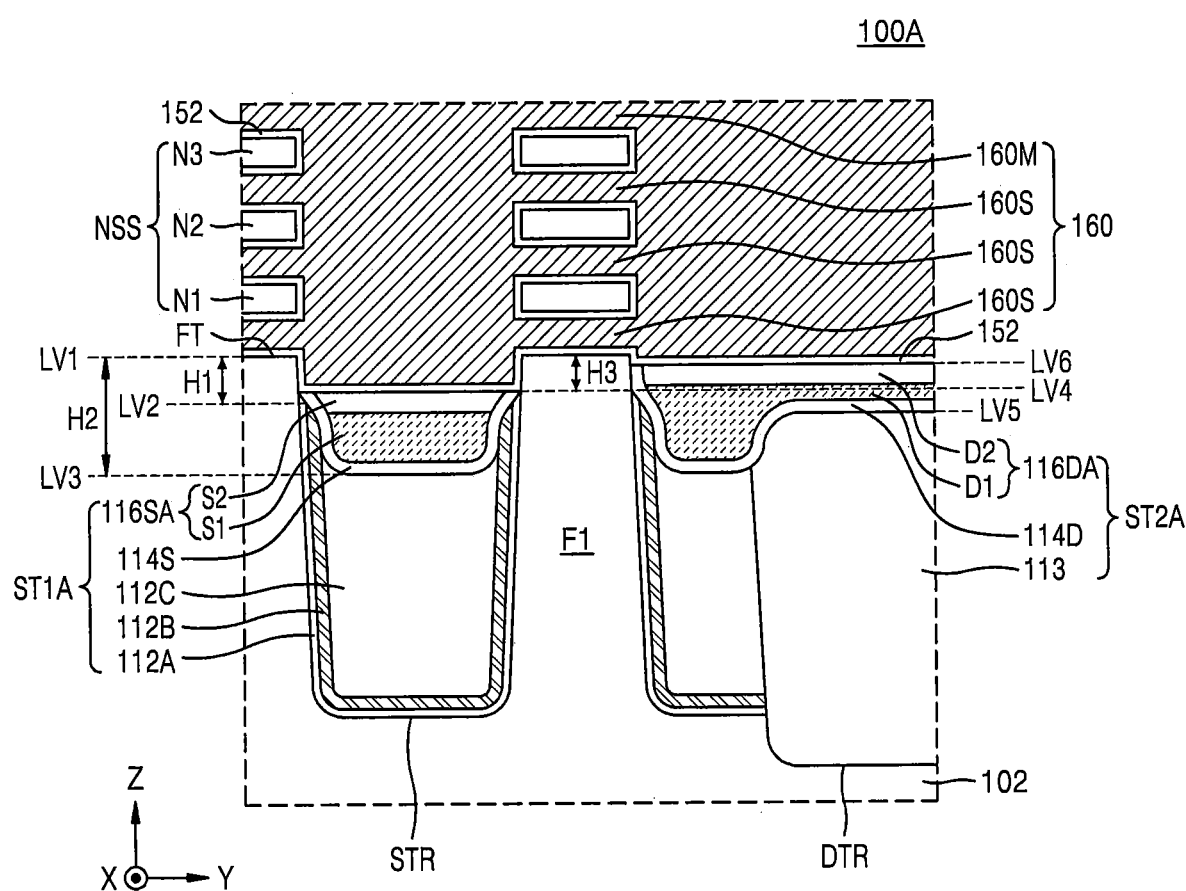
FIG. 3 is a cross-sectional view illustrating an integrated circuit device according to an embodiment of the inventive concepts.

FIG. 3 is a cross-sectional view illustrating an integrated circuit device 100A according to an embodiment of the inventive concepts. FIG. 3 illustrates a partial configuration of a portion corresponding to a region indicated as "EQ" in FIG. 2C.

Referring to FIG. 3, the integrated circuit device 100A may have substantially the same configuration as the integrated circuit device 100 described with reference to FIGS. 1 and 2A to 2D. However, the integrated circuit device 100A may include a first insulating structure ST1A and a second insulating structure ST2A instead of the first insulating structure ST1 and the second insulating structure ST2.

The first insulating structure ST1A may have substantially the same configuration as described with respect to the first insulating structure ST1 with reference to FIGS. 2C and 2D. However, the first insulating structure ST1A may include a first upper buried insulating layer 116SA instead of the first upper buried insulating layer 116S. The first upper buried insulating layer 116SA may include a first silicon oxide layer S1 and a second silicon oxide layer S2 sequentially stacked on the first upper insulating liner 114S. The second silicon oxide layer S2 may be interposed between the first silicon oxide layer S1 and the gate line 160. The first silicon oxide layer S1 may include at least one impurity element selected from a nitrogen (N) atom and a fluorine (F) atom, and the second silicon oxide layer S2 may not include the impurity element.

The second insulating structure ST2A may have substantially the same configuration as described with respect to the second insulating structure ST2 with reference to FIGS. 2C and 2D. However, the second insulating structure ST2A may include a second upper buried insulating layer 116DA instead of the second upper buried insulating layer 116D. The second upper buried insulating layer 116DA may include a first silicon oxide layer D1 and a second silicon oxide layer D2 sequentially stacked on the second upper insulating liner 114D. The second silicon oxide layer D2 may be interposed between the first silicon oxide layer D1 and the gate line 160. The first silicon oxide layer D1 may include at least one impurity element selected from a nitrogen (N) atom and a fluorine (F) atom, and the second silicon oxide layer D2 may not include the impurity element.

The second silicon oxide layers S2 and D2 respectively constituting uppermost portions of the first and second insulating structures ST1A and ST2A have a denser structure than the first silicon oxide layers Si and D1 including impurity elements. Therefore, to form a subsequent process after forming the first insulating structure ST1A and the second insulating structure ST2A during a manufacturing process of the integrated circuit device 100A, the first insulating structure ST1A and the second insulating structure ST2A may be prevented from being consumed or damaged in a cleaning or etching atmosphere by the first silicon oxide layers Si and D1 having a relatively dense structure when the first insulating structure ST1A and the second insulating structure ST2A are exposed to the cleaning or etching atmosphere.

Figure 4:
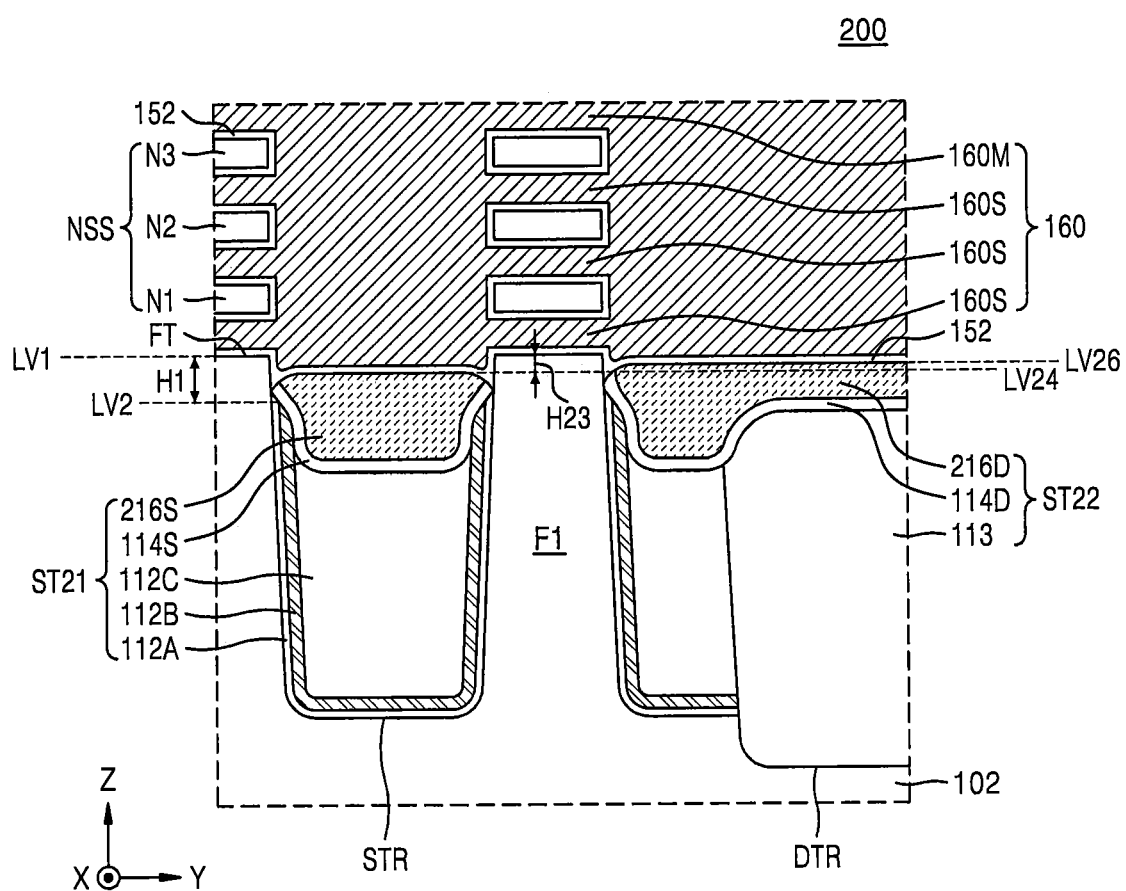
FIG. 4 is a cross-sectional view illustrating an integrated circuit device according to an embodiment of the inventive concepts.

FIG. 4 is a cross-sectional view illustrating an integrated circuit device 200 according to an embodiment of the inventive concepts. FIG. 4 illustrates a partial configuration of a portion corresponding to a region indicated as "EQ" in FIG. 2C.

Referring to FIG. 4, the integrated circuit device 200 may have substantially the same configuration as the integrated circuit device 100 described with reference to FIGS. 1 and 2A to 2D. However, the integrated circuit device 200 may include a first insulating structure ST21 and a second insulating structure ST22 instead of the first insulating structure ST1 and the second insulating structure ST2.

The first insulating structure ST21 may have substantially the same configuration as described with respect to the first insulating structure ST1 with reference to FIGS. 2C and 2D. However, the first insulating structure ST21 may include a first upper buried insulating layer 216S instead of the first upper buried insulating layer 116S. A top surface of the first upper buried insulating layer 216S may have a convex shape toward the gate line 160. A level of a lowermost portion of the top surface of the first upper buried insulating layer 216S may be equal to or higher than the second level LV2. A level LV24 of an uppermost portion of the top surface of the first upper buried insulating layer 216S may be higher than the second level LV2.

A third height H23 which is a distance in the vertical direction (e.g., the Z direction) from the fin top surface FT to the level LV24 of the uppermost portion of the top surface of the first upper buried insulating layer 216S may be equal to or greater than 0. In some embodiments, the third height H23 may be equal to or smaller than the first height H1.

The second insulating structure ST22 may have substantially the same configuration as described with respect to the second insulating structure ST2 with reference to FIGS. 2C and 2D. However, the second insulating structure ST22 may include a second upper buried insulating layer 216D instead of the second upper buried insulating layer 116D. The second upper buried insulating layer 216D may have a top surface in a convex shape toward the gate line 160. A level LV26 of an uppermost portion of the top surface of the second upper buried insulating layer 216D may be higher than the level LV24 of the uppermost portion of the top surface of the first upper buried insulating layer 216S.

Figure 5:
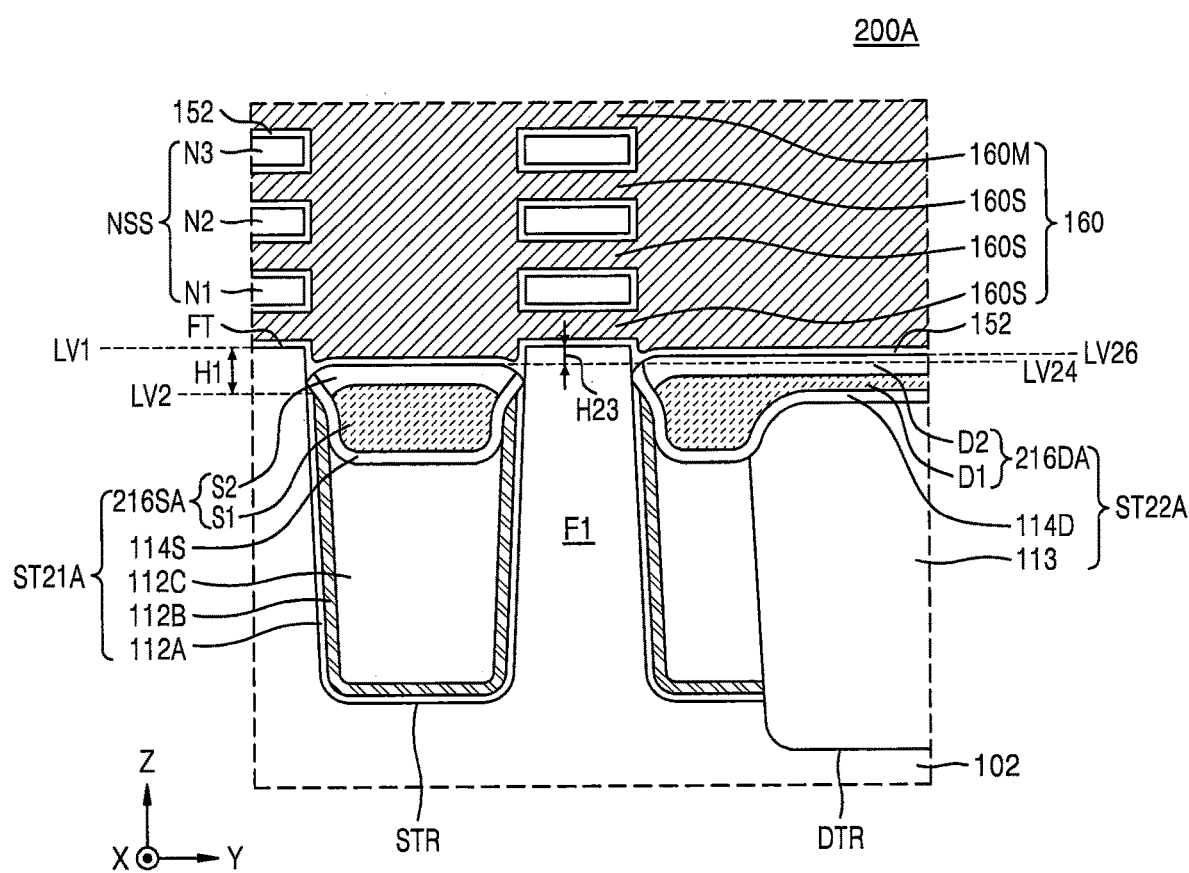
FIG. 5 is a cross-sectional view illustrating an integrated circuit device according to an embodiment of the inventive concepts.

FIG. 5 is a cross-sectional view illustrating an integrated circuit device 200A according to an embodiment of the inventive concepts. FIG. 5 illustrates a partial configuration of a portion corresponding to a region indicated as "EQ" in FIG. 2C.

Referring to FIG. 5, the integrated circuit device 200A may have substantially the same configuration as the integrated circuit device 200 described with reference to FIG. 4. However, the integrated circuit device 200A may include a first insulating structure ST21A and a second insulating structure ST22A instead of the first insulating structure ST21 and the second insulating structure ST22.

The first insulating structure ST21A may have substantially the same configuration as described with respect to the first insulating structure ST21 with reference to FIG. 4. However, the first insulating structure ST21A may include a first upper buried insulating layer 216SA instead of the first upper buried insulating layer 216S. The first upper buried insulating layer 216SA may include a first silicon oxide layer Si and a second silicon oxide layer S2 sequentially stacked on the first upper insulating liner 114S. The second insulating structure ST22A may have substantially the same configuration as described with respect to the second insulating structure ST22 with reference to FIG. 4. However, the second insulating structure ST22A may include a second upper buried insulating layer 216DA instead of the second upper buried insulating layer 216D. The second upper buried insulating layer 216DA may include a first silicon oxide layer D1 and a second silicon oxide layer D2 sequentially stacked on the second upper insulating liner 114D. More detailed configurations and effects of the first silicon oxide layers Si and D1 and the second silicon oxide layers S2 and D2 are the same as described with reference to FIG. 3.

Figure 6:
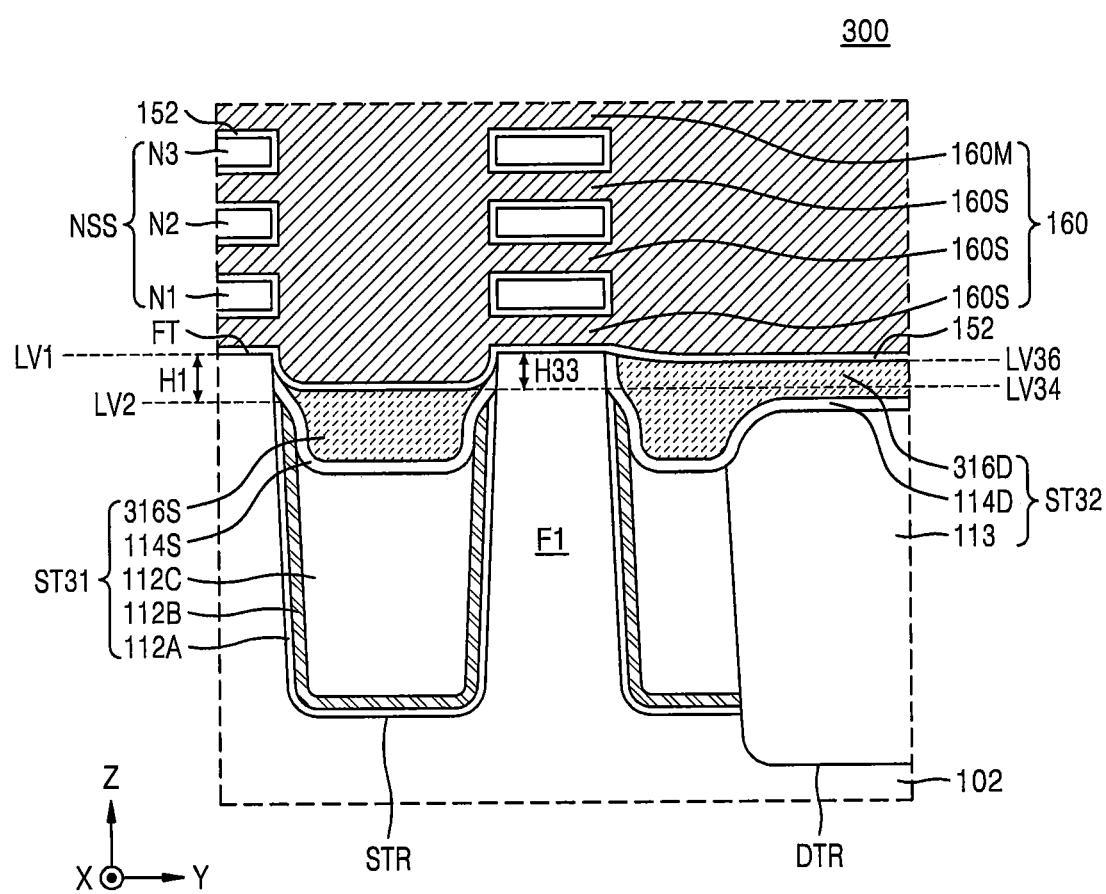
FIG. 6 is a cross-sectional view illustrating an integrated circuit device according to an embodiment of the inventive concepts.

FIG. 6 is a cross-sectional view illustrating an integrated circuit device 300 according to an embodiment of the inventive concepts. FIG. 6 illustrates a partial configuration of a portion corresponding to a region indicated as "EQ" in FIG. 2C.

Referring to FIG. 6, the integrated circuit device 300 may have substantially the same configuration as the integrated circuit device 100 described with reference to FIGS. 1 and 2A to 2D. However, the integrated circuit device 300 may include a first insulating structure ST31 and a second insulating structure ST32 instead of the first insulating structure ST1 and the second insulating structure ST2.

The first insulating structure ST31 may have substantially the same configuration as described with respect to the first insulating structure ST1 with reference to FIGS. 2C and 2D. However, the first insulating structure ST31 may include the first upper buried insulating layer 316S instead of the first upper buried insulating layer 116S. A top surface of the first upper buried insulating layer 316S may have a concave shape toward the gate line 160. A level of the top surface of the first upper buried insulating layer 316S may be equal to or higher than the second level LV2. In particular, a level LV34 of a lowermost portion of the top surface of the first upper buried insulating layer 316S may be equal to or higher than the second level LV2.

A third height H33 which is a distance in the vertical direction (e.g., the Z direction) from the fin top surface FT to the level LV34 of the lowermost portion of the top surface of the first upper buried insulating layer 316S may be equal to or greater than zero. In some embodiments, the third height H33 may be equal to or smaller than the first height H1.

The second insulating structure ST32 may have substantially the same configuration as described with respect to the second insulating structure ST2 with reference to FIGS. 2C and 2D. However, the second insulating structure ST32 may include a second upper buried insulating layer 316D instead of the second upper buried insulating layer 116D. The second upper buried insulating layer 316D may have a top surface in a concave shape toward the gate line 160. A level LV36 of a lowermost portion of the top surface of the second upper buried insulating layer 316D may be higher than the level LV34 of the lowermost portion of the top surface of the first upper buried insulating layer 316S.

Figure 7:
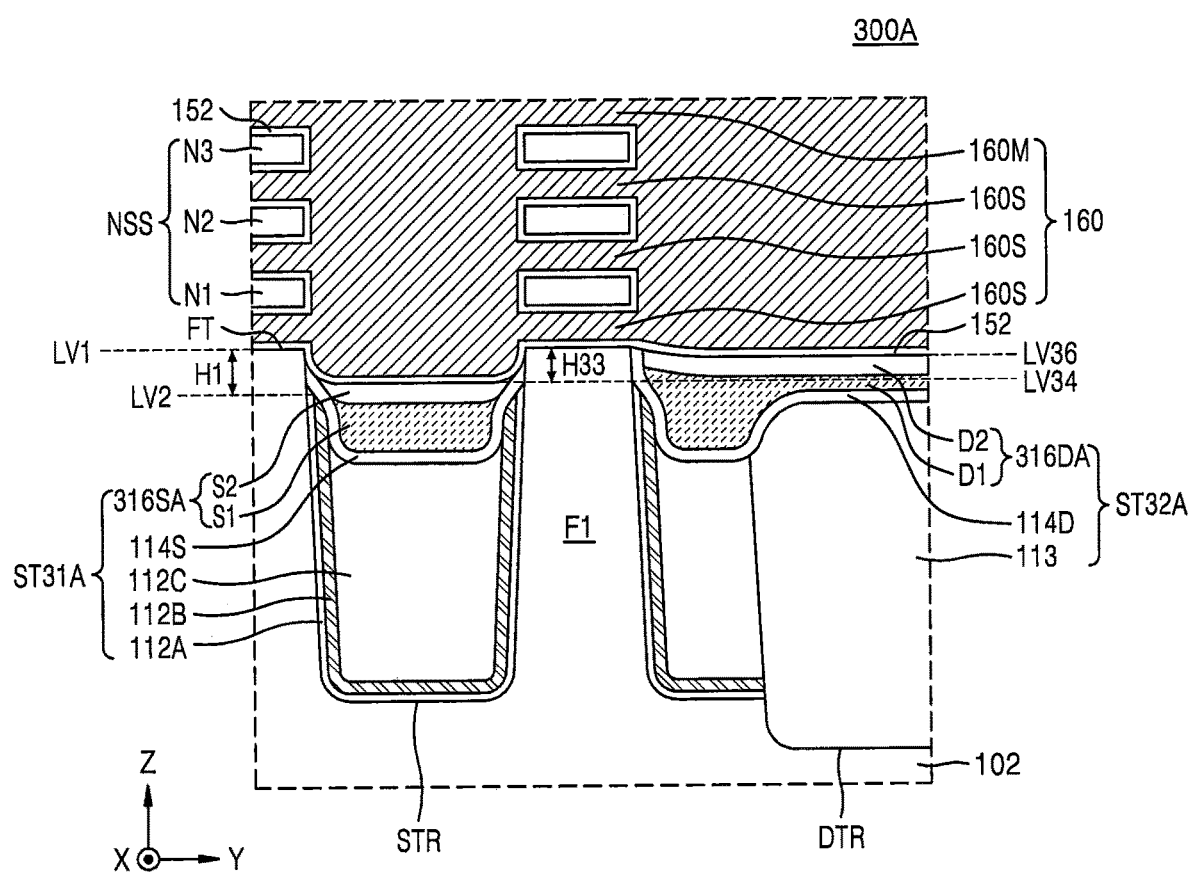
FIG. 7 is a cross-sectional view illustrating an integrated circuit device according to an embodiment of the inventive concepts.

FIG. 7 is a cross-sectional view illustrating an integrated circuit device 300A according to an embodiment of the inventive concepts. FIG. 7 illustrates a partial configuration of a portion corresponding to a region indicated as "EQ" in FIG. 2C.

Referring to FIG. 7, the integrated circuit device 300A may have substantially the same configuration as the integrated circuit device 300 described with reference to FIG. 6. However, the integrated circuit device 300A may include a first insulating structure ST31A and a second insulating structure ST32A instead of the first insulating structure ST31 and the second insulating structure ST32.

The first insulating structure ST31A may have substantially the same configuration as described with respect to the first insulating structure ST31 with reference to FIG. 6. However, the first insulating structure ST31A may include the first upper buried insulating layer 316SA instead of the first upper buried insulating layer 316S. The first upper buried insulating layer 316SA may include a first silicon oxide layer Si and a second silicon oxide layer S2 sequentially stacked on the first upper insulating liner 114S. The second insulating structure ST32A may have substantially the same configuration as described with respect to the second insulating structure ST32 with reference to FIG. 6. However, the second insulating structure ST32A may include a second upper buried insulating layer 316DA instead of the second upper buried insulating layer 316D. The second upper buried insulating layer 316DA may include a first silicon oxide layer D1 and a second silicon oxide layer D2 sequentially stacked on the second upper insulating liner 114D. More detailed configurations and effects of the first silicon oxide layers Si and D1 and the second silicon oxide layers S2 and D2 are the same as described with reference to FIG. 3.

Although FIGS. 3 to 7 illustrate only the first fin-type active region F1 in the first device region RX1 and peripheral components thereof, the descriptions of the integrated circuit devices 100A, 200, 200A, 300, and 300A given with reference to FIGS. 3 to 7 may be applied to the second fin-type active region F2 in the second device region RX2 and peripheral components thereof in the same manner.

Figure 8:
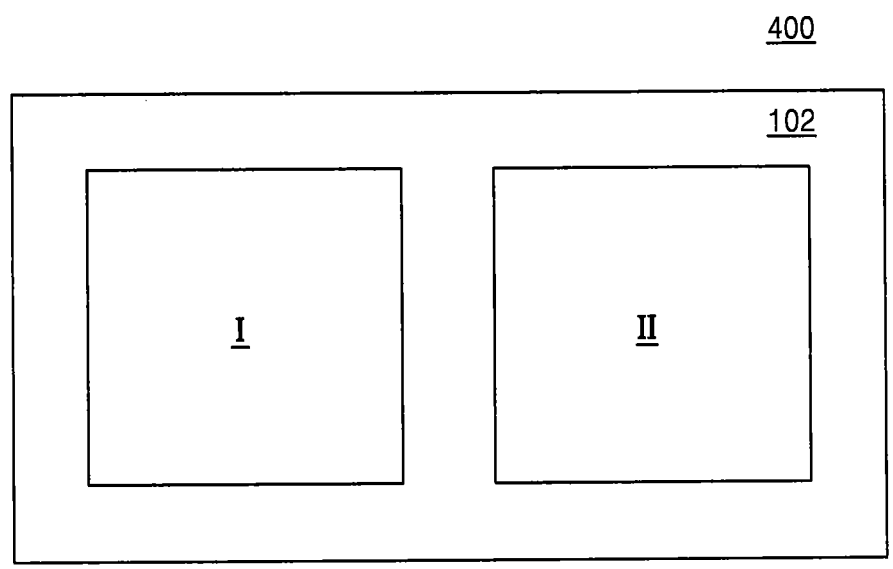
FIG. 8 is a block diagram of an integrated circuit device according to an embodiment of the inventive concept.

FIG. 8 is a block diagram of an integrated circuit device 400 according to an embodiment of the inventive concepts.

Referring to FIG. 8, the integrated circuit device 400 may include the substrate 102 including a first region I and a second region II. The first region I and the second region II of the substrate 102 refer to different regions of the substrate 102 and may be regions on the substrate 102 where different operations are performed. The first region I and the second region II may be regions spaced apart from each other in a horizontal direction.

In some embodiments, the first device region I may be a region in which devices operating in a low power mode are formed, and the second device region II may be a region in which devices operating in a high power mode are formed. In some embodiments, the first device region I may be a region in which a memory device or a non-memory device is formed, and the second device region II may be a region in which a peripheral circuit such as an input/output device (I/O) is formed.

In some embodiments, the first region I may be a region constituting a volatile memory device such as a dynamic random access memory (DRAM) or a static RAM (SRAM), or a nonvolatile memory device such as a read only memory (ROM), a mask ROM (MROM), a programmable memory device (PROM), an erasable ROM (EPROM), an electrically erasable ROM (EEPROM), a ferromagnetic ROM (FRAM), a phase change RAM (PRAM), a magnetic RAM (MRAM), a resistive RAM (RRAM), flash memory, etc. In some embodiments, the first region I may be a region in which a non-memory device such as a logic device is formed. The logic device may include standard cells that perform a desired logical function such as a counter and a buffer. The standard cells may include various types of logic cells including a plurality of circuit elements such as transistors and resistors. The logical cells may constitute, for example, AND, NAND, OR, NOR, exclusive OR (XOR), exclusive NOR (XNOR), an inverter INV, an adder ADD, a buffer BUF, a delay DLY, a filter FIL, multiplexer MXT/MXIT, OR/AND/INVERTER (OAI), AND/OR (AO), AND/OR/INVERTER (AOI), a D flip-flop, a reset flip-flop, a master-slaver flip-flop, a latch, etc.

In the integrated circuit device 400, a pattern formation density in the second device region II may be smaller than a pattern formation density in the first device region I.

In some embodiments, at least one selected from the structures described with respect to the integrated circuit devices 100, 100A, 200, 200A, 300, and 300A described with reference to FIGS. 1 to 7 may be included in the first region I.

Figure 9:
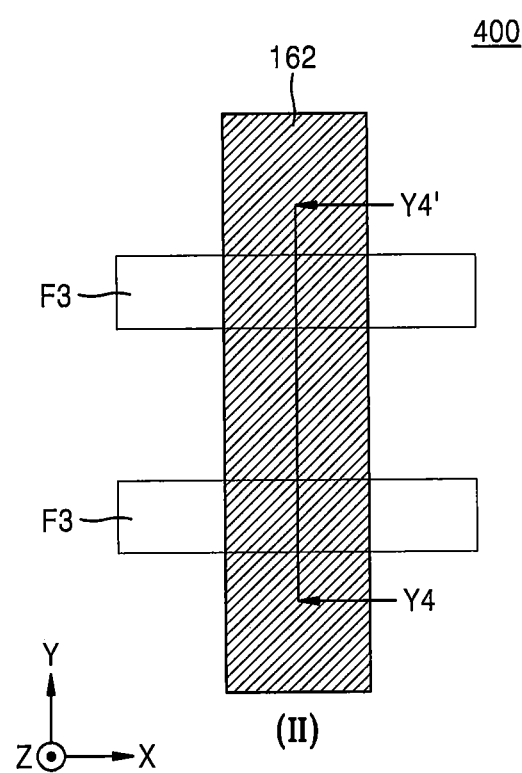
FIG. 9 is a plan layout diagram illustrating a partial configuration of a second region of the integrated circuit device illustrated in FIG. 8.
Figure 10:
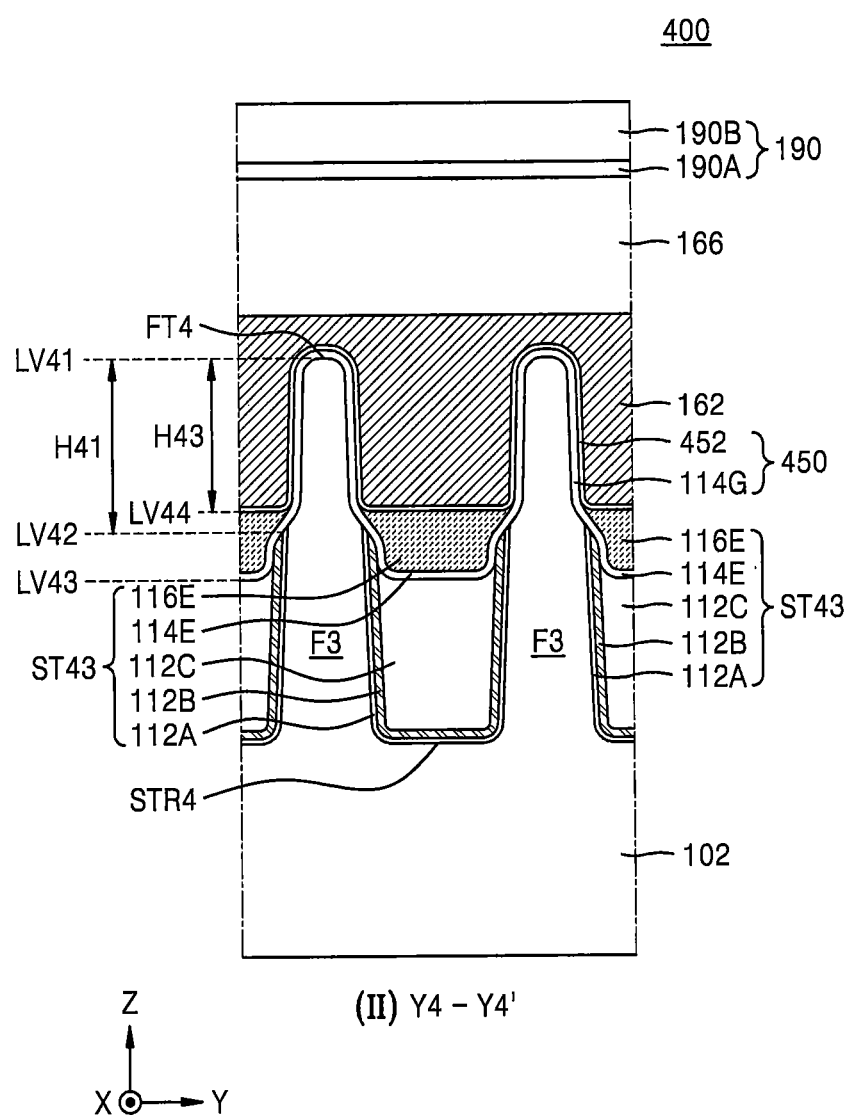
FIG. 10 is a cross-sectional view showing a partial configuration of a cross-section taken along line Y4-Y4' of FIG. 9.

FIG. 9 is a plan layout diagram illustrating a partial configuration of the second region II of the integrated circuit device 400 illustrated in FIG. 8. FIG. 10 is a cross-sectional view showing a partial configuration of a cross-section taken along line Y4-Y4' of FIG. 9.

Referring to FIGS. 9 and 10, the integrated circuit device 400 may include a plurality of fin-type active regions F3 protruding in the vertical direction (e.g., the Z direction) from the substrate 102 in the second region II. The plurality of fin-type active regions F3 may extend parallel to each other in the first horizontal direction (e.g., the X direction). Each of the plurality of fin-type active regions F3 may be defined by a device isolation trench STR4 formed in the substrate 102.

The plurality of fin-type active regions F3 may have the fin top surface FT4 of a first level LV41. A gate line 162 may extend long in (e.g., have a longitudinal axis extending in) the second horizontal direction (e.g., the Y direction) on the plurality of fin-type active regions F3. FIGS. 9 and 10 illustrate two fin-type active regions F3 and one gate line 162 disposed on the two fin-type active regions F3, but the number of each of the fin-type active region F3 and the gate line 162 is not limited to the illustrated example and may be variously selected.

The device isolation trench STR4 in the second region II may be filled with a third insulating structure ST43. The third insulating structure ST43 may be interposed between the substrate 102 and the gate line 162 and may be on a sidewall of the fin-type active region F3.

The third insulating structure ST43 may include the first insulating liner 112A, the second insulating liner 112B, the first lower buried insulating layer 112C, the third upper insulating liner 114E and the third upper buried insulating layer 116E sequentially stacked on the substrate 102 in the second region II.

Detailed configurations of the first insulating liner 112A, the second insulating liner 112B, and the first lower buried insulating layer 112C are substantially the same as those described with reference to FIGS. 2A to 2D. However, in the second region II, the first insulating liner 112A may contact the sidewall of the fin-type active region F3. An uppermost portion of the first insulating liner 112A may be lower than the first level LV41 of the fin top surface FT4. The second insulating liner 112B may face the sidewall of the fin-type active region F3 with the first insulating liner 112A therebetween. The second insulating liner 112B may have an uppermost portion of the second level LV42 lower than the first level LV41.

The first lower buried insulating layer 112C may face the sidewall of the fin-type active region F3 with the first insulating liner 112A and the second insulating liner 112B therebetween. A top surface of the first lower buried insulating layer 112C facing the gate line 162 may non-linearly extend in a second horizontal direction (e.g., the Y direction) at a level lower than the second level LV42. The top surface of the first lower buried insulating layer 112C facing the gate line 162 may have a concave shape toward the gate line 162. A lowermost portion of the top surface of the first lower buried insulating layer 112C may be a third level LV43 lower than the second level LV42.

A distance in the vertical direction (e.g., the Z direction) from the fin top surface FT4 of the fin-type active region F3 to the third level LV43 which is a level of the lowermost portion of the top surface of the first lower buried insulating layer 112C may be greater than a vertical height H41 from the fin top surface FT4 of the fin-type active region F3 to the second level LV42 which is a level of the uppermost portion of the second insulating liner 112B.

The third upper insulating liner 114E may be interposed between the second insulating liner 112B and the third upper buried insulating layer 116E, and between the first lower buried insulating layer 112C and the third upper buried insulating layer 116E. The third upper insulating liner 114E may include a portion in contact with the uppermost portion of the second insulating liner 112B and a portion in contact with the top surface of the first lower buried insulating layer 112C.

The third upper buried insulating layer 116E may be interposed between the first lower buried insulating layer 112C and the gate line 162. The third upper insulating liner 114E may be interposed between the top surface of the first lower buried insulating layer 112C and a bottom surface of the third upper buried insulating layer 116E.

The third upper buried insulating layer 116E may have a top surface flatly extending in the horizontal direction (e.g., the X direction and the Y direction) at a fourth level LV44 higher than the second level LV42. The bottom surface of the third upper buried insulating layer 116E may face the top surface of the first lower buried insulating layer 112C with the third upper insulating liner 114E therebetween, and have a convex shape toward the substrate 102 corresponding to a concave shape of the top surface of the first lower buried insulating layer 112C.

A vertical height H43 from the fin top surface FT4 of the fin-type active region F3 to the fourth level LV44 which is a level of the top surface of the third upper buried insulating layer 116E may be equal to or smaller than the vertical height H41 from the fin top surface FT4 to the second level LV42. That is, the level of the top surface of the third upper buried insulating layer 116E may be equal to or higher than the level of the uppermost portion of the second insulating liner 112B.

In some embodiments, the fourth level LV44 which is the level of the top surface of the third upper buried insulating layer 116E in the second region II may be higher than the fourth level LV4 (see FIG. 2D) which is the level of the top surface of the first upper insulating liner 114S in the first region I and may be lower than the sixth level LV6 (see FIG. 2D) which is the level of the top surface of the second upper buried insulating layer 116D in the first region I, but embodiments of the inventive concepts are not limited thereto. 1001191A material of the third upper insulating liner 114E may be the same as the material of the first upper insulating liner 114S described with reference to FIGS. 2A to 2D. The material of the third upper buried insulating layer 116E may be the same as the material of the first upper buried insulating layer 116S described with reference to FIGS. 2A to 2D. In some embodiments, the first upper insulating liner 114S and the third upper insulating liner 114E may include a silicon oxide layer, and the first upper buried insulating layer 116S and the third upper buried insulating layer 116E may include a silicon oxide layer including at least one impurity element selected from a nitrogen (N) atom and a fluorine (F) atom. In some embodiments, a content of the impurity element in each of the first upper buried insulating layer 116S and the third upper buried insulating layer 116E may be about 0.1 atomic % to about 20 atomic %, but is not limited thereto. More detailed configurations of the third upper insulating liner 114E and the third upper buried insulating layer 116E are the same as described with respect to the first upper insulating liner 114S and the first upper buried insulating layer 116S with reference to FIGS. 2A to 2D.

In some embodiments, the third upper buried insulating layer 116E may include the first silicon oxide layer S1 and the second silicon oxide layer S2 sequentially stacked on the third upper insulating liner 114E, similar to the description of the first upper buried insulating layer 116SA with reference to FIG. 3. In some embodiments, the third upper buried insulating layer 116E may have a top surface of a convex shape toward the gate line 162, similar to the description of the first upper buried insulating layer 216S with reference to FIG. 4. In some embodiments, the third upper buried insulating layer 116E may have a top surface of a concave shape toward the gate line 162, similar to the description of the first upper buried insulating layer 316S with reference to FIG. 6.

In the second region II, the gate line 162 may extend long in the second horizontal direction (e.g., the Y direction) on the fin-type active region F3 and the third insulating structure ST43 while covering the fin top surface FT4 and both sidewalls of the fin-type active region F3. As illustrated in FIG. 9, in the first horizontal direction (e.g., the X direction), a width of the gate line 162 in the second region II may be greater than a width of the gate line 160 in the first region I.

In the second region II, the gate dielectric layer 450 may be interposed between the fin-type active region F3 and the gate line 162. The gate dielectric layer 450 may include a lower gate dielectric layer 114G in contact with the fin-type active region F3, and an upper gate dielectric layer 452 covering the lower gate dielectric layer 114G and in contact with the bottom surface of the gate line 162.

The lower gate dielectric layer 114G may be integrally connected to the third upper insulating liner 114E, and may include the same material as the material of the third upper insulating liner 114E. For example, each of the lower gate dielectric layer 114G and the third upper insulating liner 114E may include a silicon oxide layer.

The upper gate dielectric layer 452 may be in contact with the lower gate dielectric layer 114G on the fin-type active region F3, and may be spaced apart from the third upper insulating liner 114E in the vertical direction (e.g., the Z direction) on the device isolation trench STR4 with the third upper buried insulating layer 116E therebetween. The material of the upper gate dielectric layer 452 may be the same as the material of the gate dielectric layer 152 (see FIGS. 2A to 2D) in the first region I. For example, the upper gate dielectric layer 452 may include a high dielectric layer. A detailed description of the high dielectric layer is the same as described with reference to FIGS. 2A to 2D.

The top surface of the gate line 162 may be covered with a capping insulating pattern 166. The capping insulating pattern 166 may have substantially the same configuration as described with respect to the capping insulating pattern 164 with reference to FIGS. 2A to 2C. The capping insulating pattern 166 may be covered with an interlayer insulating layer 190.

The integrated circuit device 400 described with reference to FIGS. 8 to 10 may include the first insulating structure ST1 and the third insulating structure ST43 covering sidewalls of each of the fin-type active regions F1, F2, and F3 between the substrate 102 and the gate lines 160 and 162 in the first region I and the second region II. The first insulating structure ST1 and the third insulating structure ST43 may include first and third upper insulating liners 114S and 114E and first and third upper buried insulating layers 116S and 116E covering the top surface of the first lower buried insulating layer 112C, respectively, and a level of a top surface of each of the first and third upper buried insulating layers 116S and 116E may be equal to or higher than the level of the uppermost portion of the second insulating liner 112B. Accordingly, even when the level of the top surface of the first lower buried insulating layer 112C is lower than the level of the uppermost portion of the second insulating liner 112B, a space of a level lower than the level of the uppermost portion of the second insulating liner 112B on the top surface of the first lower buried insulating layer 112C may be filled by the first and third upper insulating liners 114S and 114E and the first and third upper buried insulating layers 116S and 116E. Accordingly, a sufficient insulating space may be secured between the fin-type active regions F1, F2, and F3 and the gate lines 160 and 162 by the first insulating structure ST1 and the third insulating structure ST43 in the first region I and the second region II, and thus unwanted parasitic capacitance between the fin-type active regions F1, F2, and F3 and the gate lines 160 and 162 may be reduced. Accordingly, the performance and reliability of transistors included in the integrated circuit device 400 may be improved.

Figure 11A:
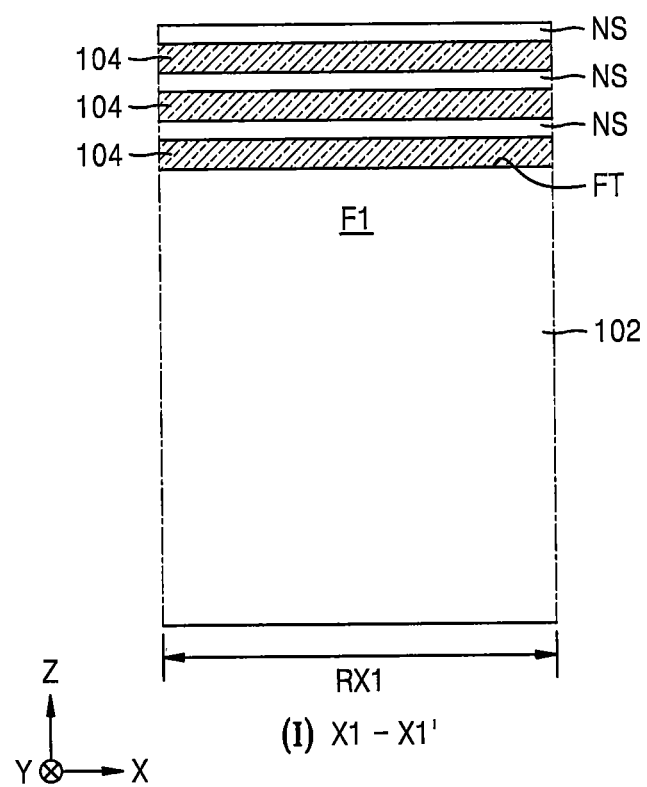
FIGS. 11A to 20D are cross-sectional views illustrating methods of manufacturing an integrated circuit device according to embodiments of the inventive concepts, wherein FIGS. 11A, 12A, . . . , and 20A are cross-sectional views showing a partial configuration of a portion corresponding to a cross-section taken along line X1-X1' of FIG. 1, FIGS. 11B, 12B, . . . , and 20B are cross-sectional views showing a partial configuration of a portion corresponding to a cross-section taken along line X2-X2' of FIG. 1, FIGS. 11C, 12C, . . . , and 20C are cross-sectional views showing a partial configuration of a portion corresponding to a cross-section taken along line Y1-Y1' of FIG. 1, and FIGS. 11D, 12D, . . . , and 20D are cross-sectional views showing a partial configuration of a portion corresponding to a cross-section taken along line Y4-Y4' of FIG. 9.
Figure 11B:
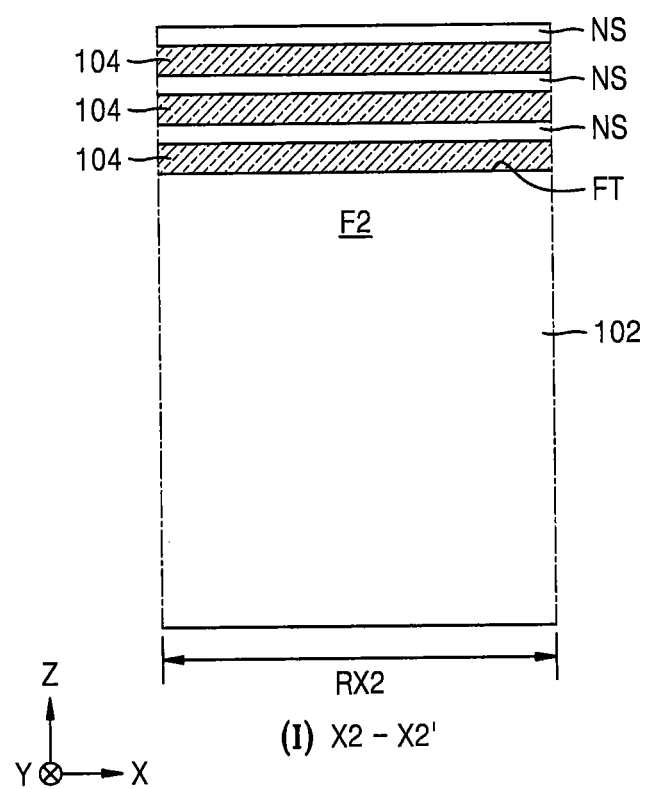
Figure 11D:
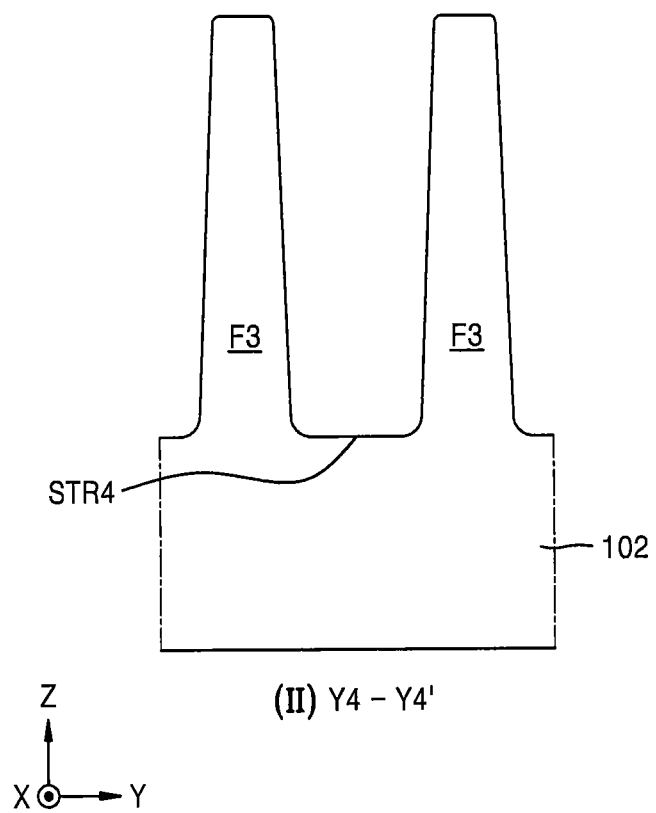
Figure 12A:
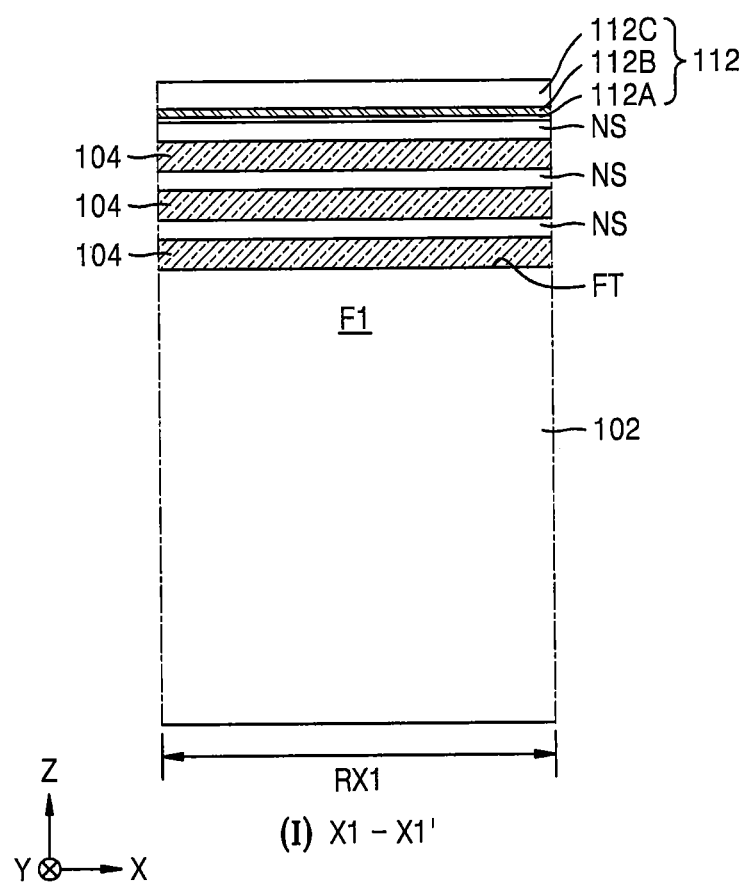
Figure 12B:
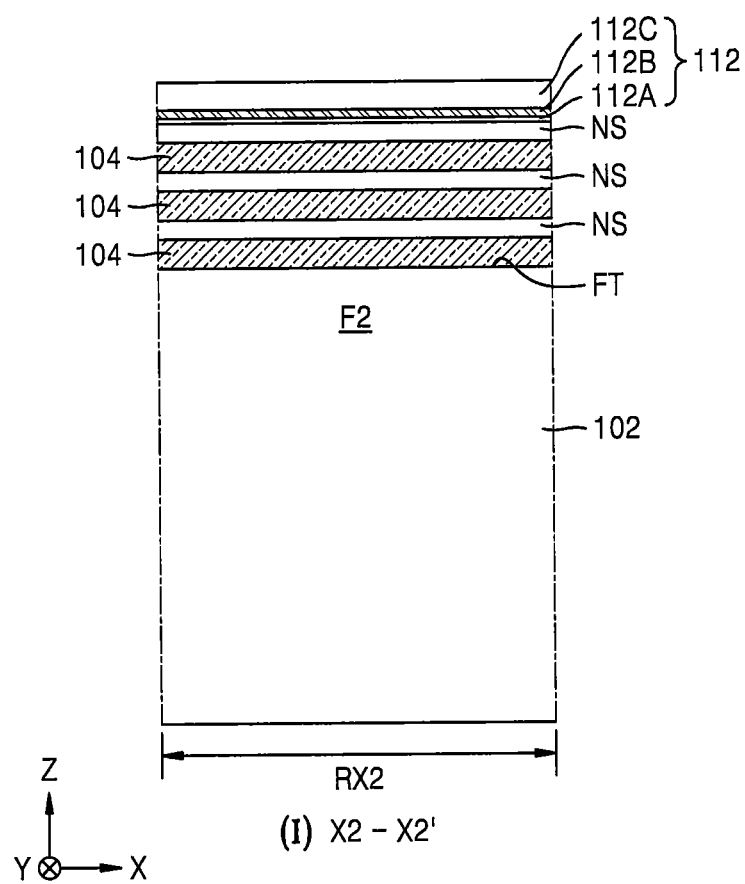
Figure 12C:
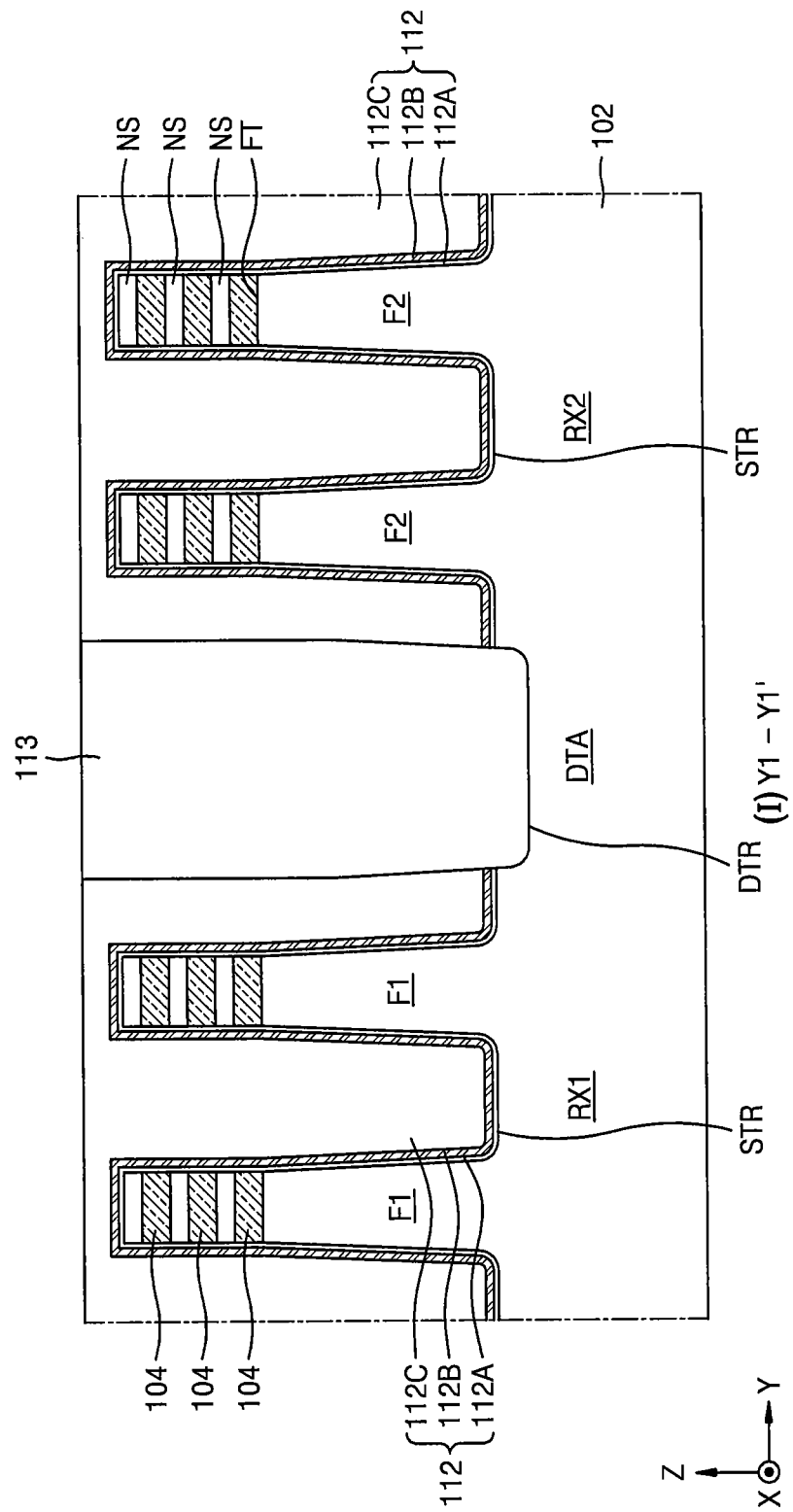
Figure 12D:
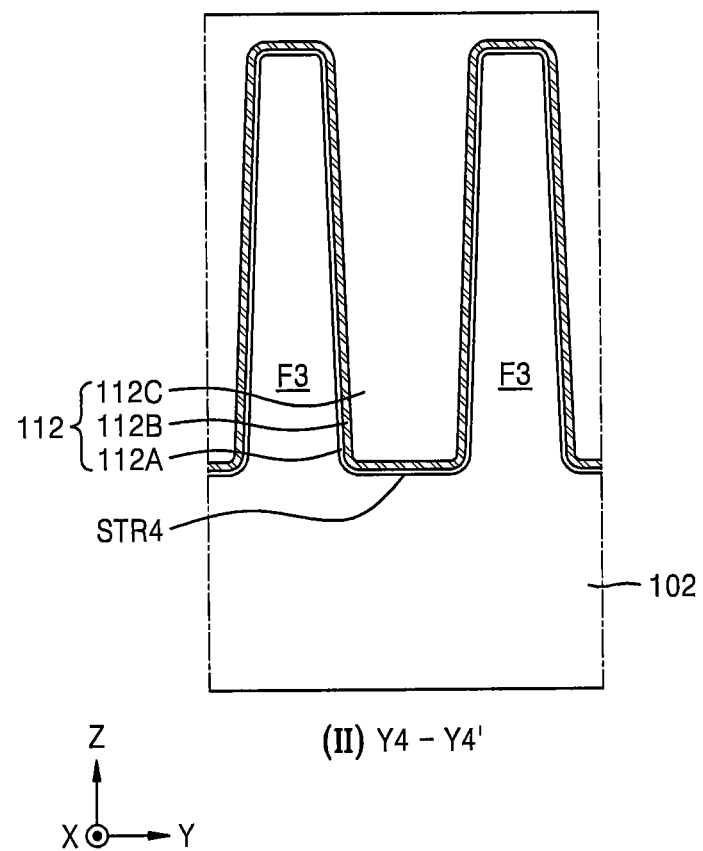
Figure 13A:
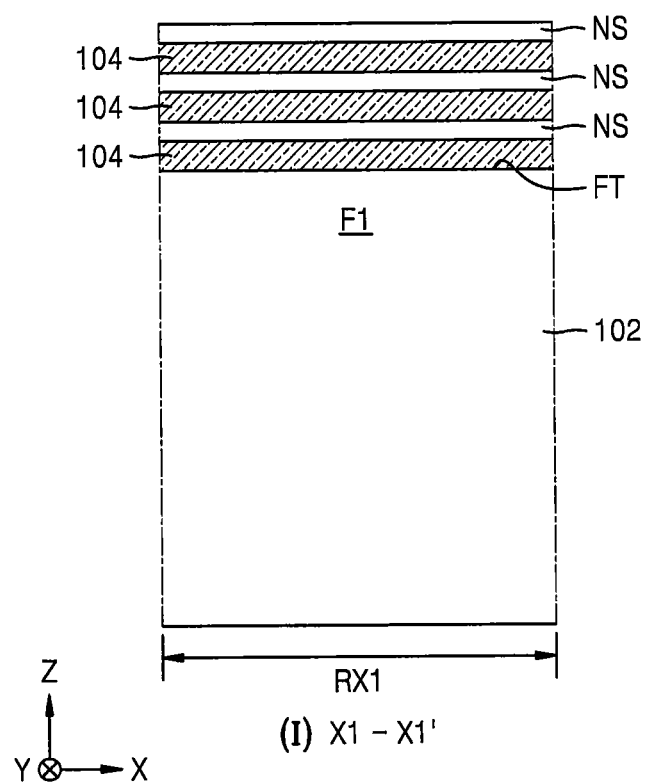
Figure 13B:
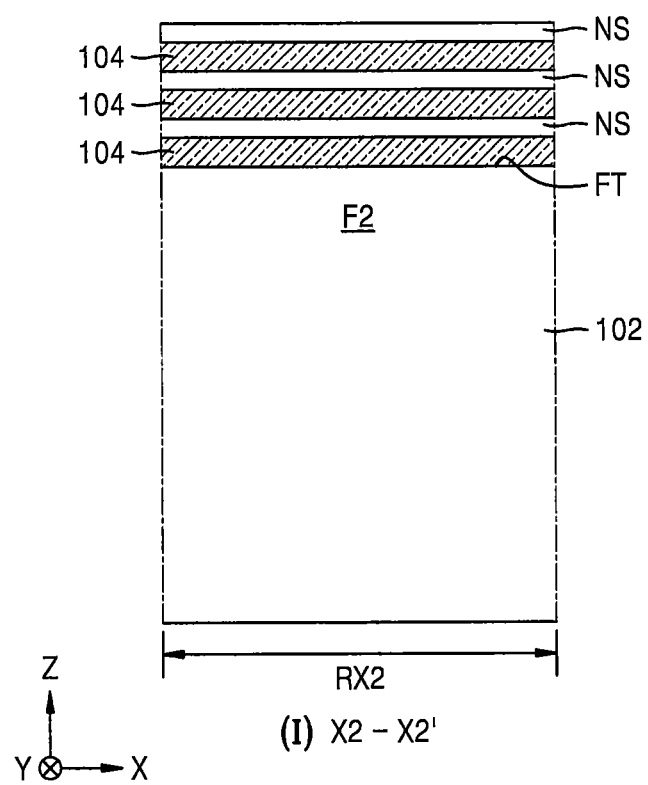
Figure 13C:
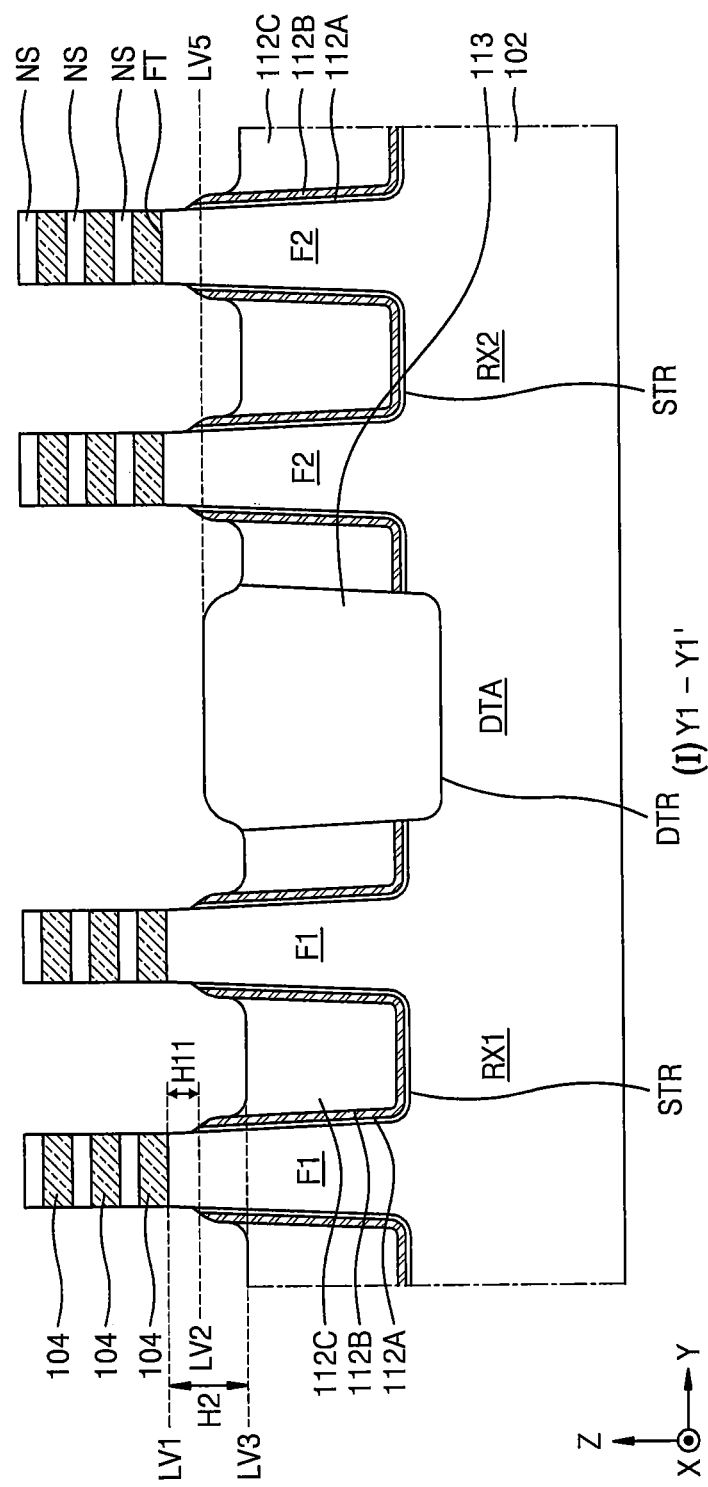
Figure 13D:
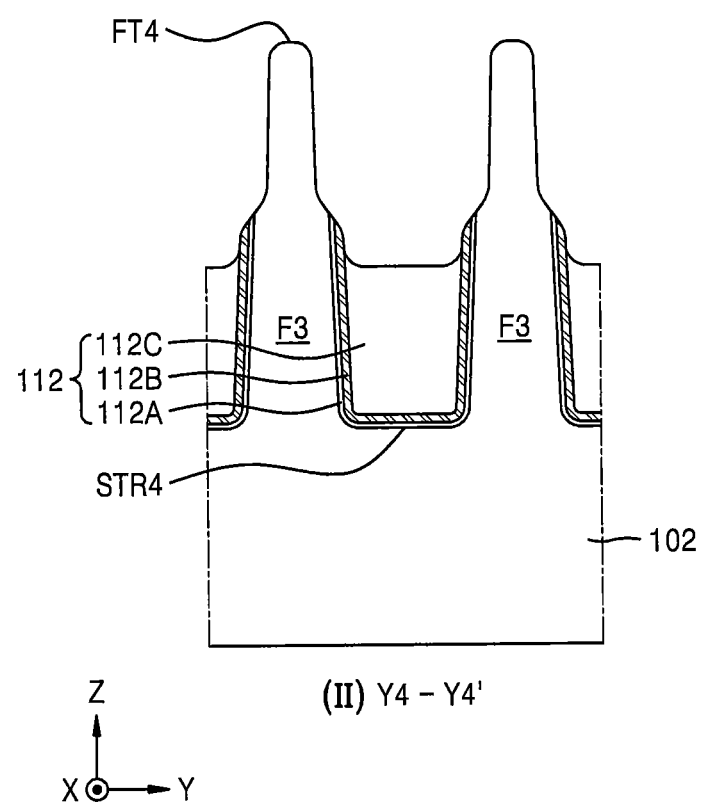
Figure 14A:
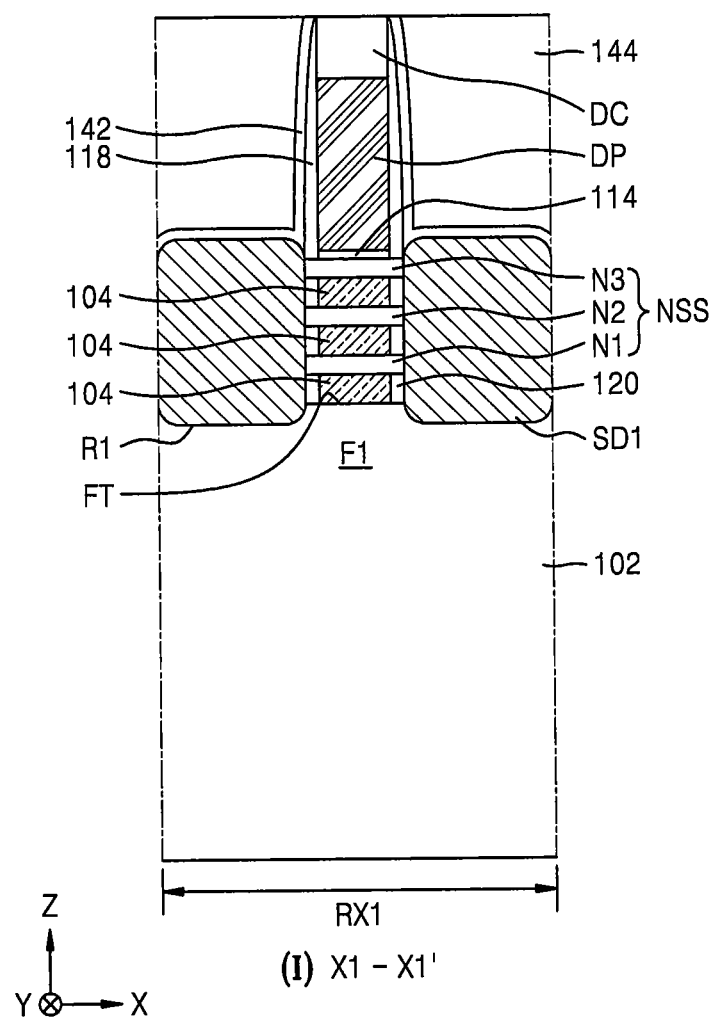
Figure 14B:
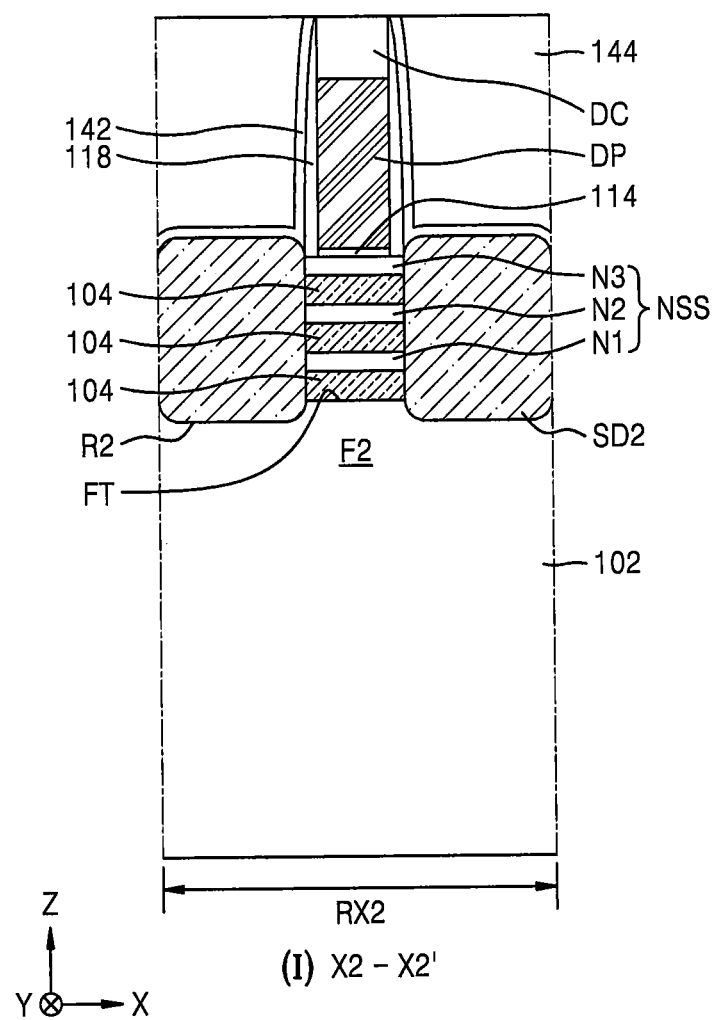
Figure 14C:
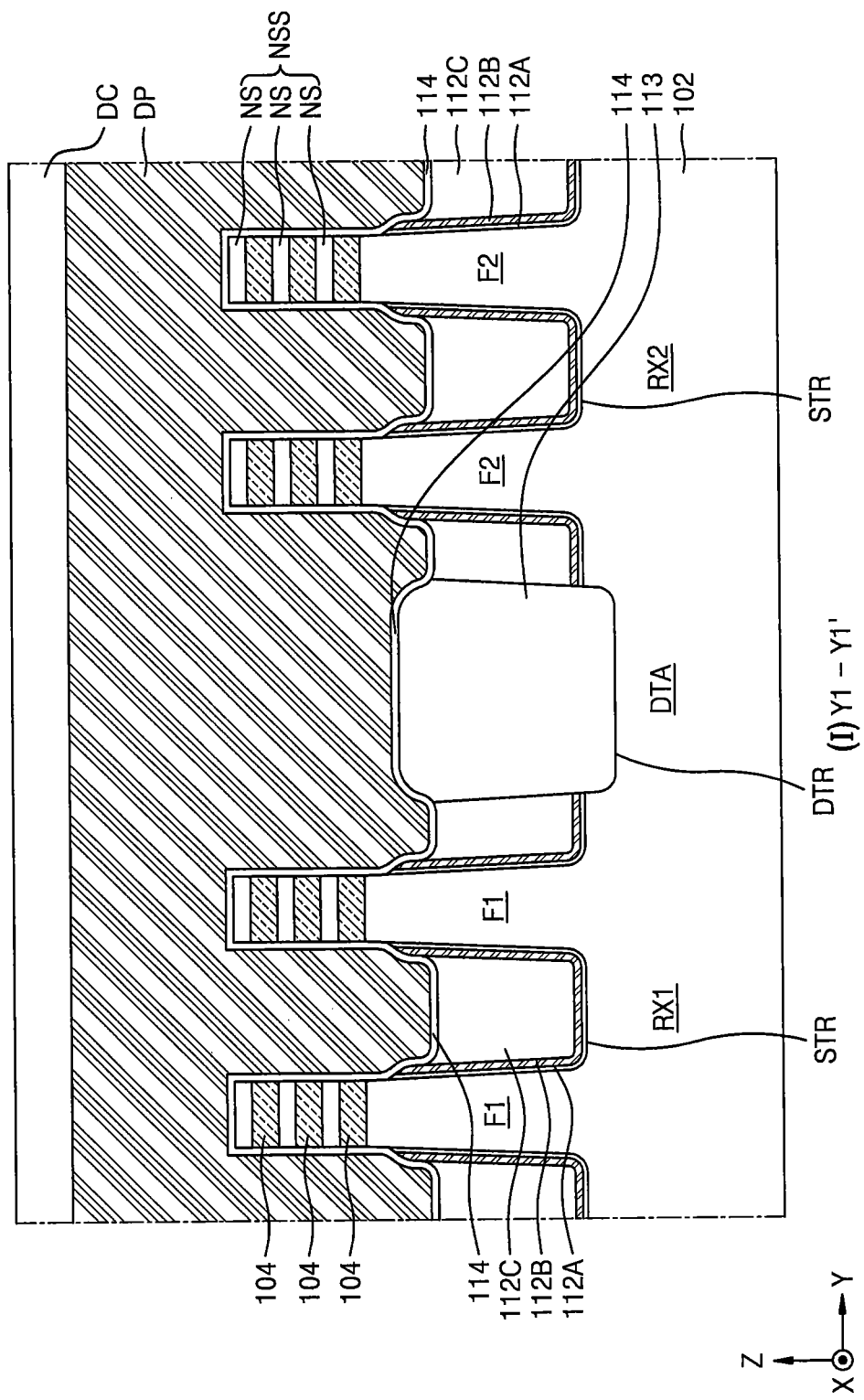
Figure 14D:
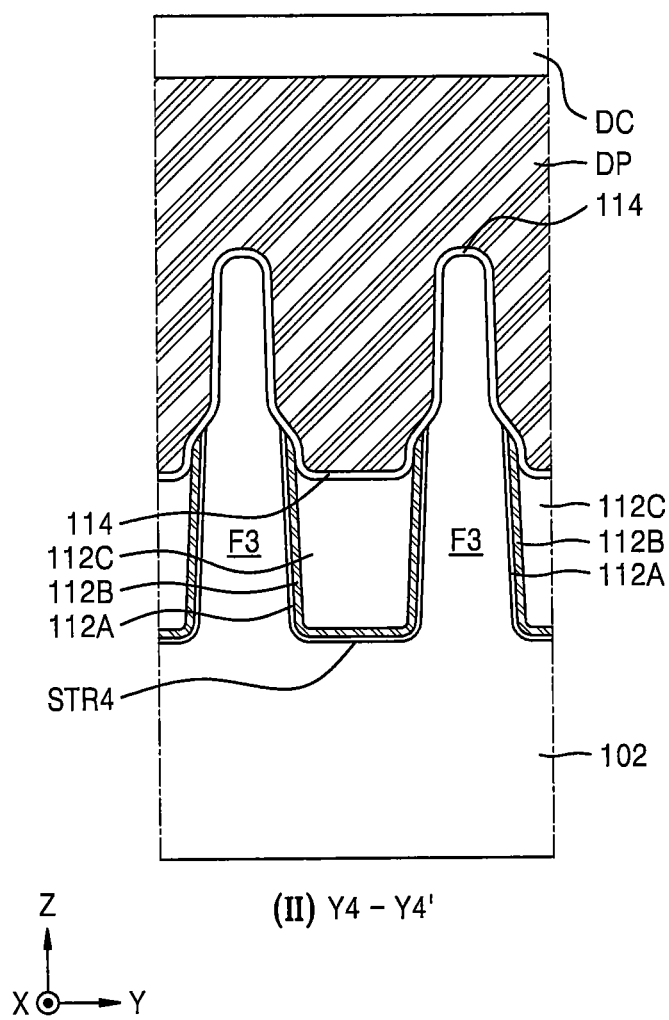
Figure 15A:
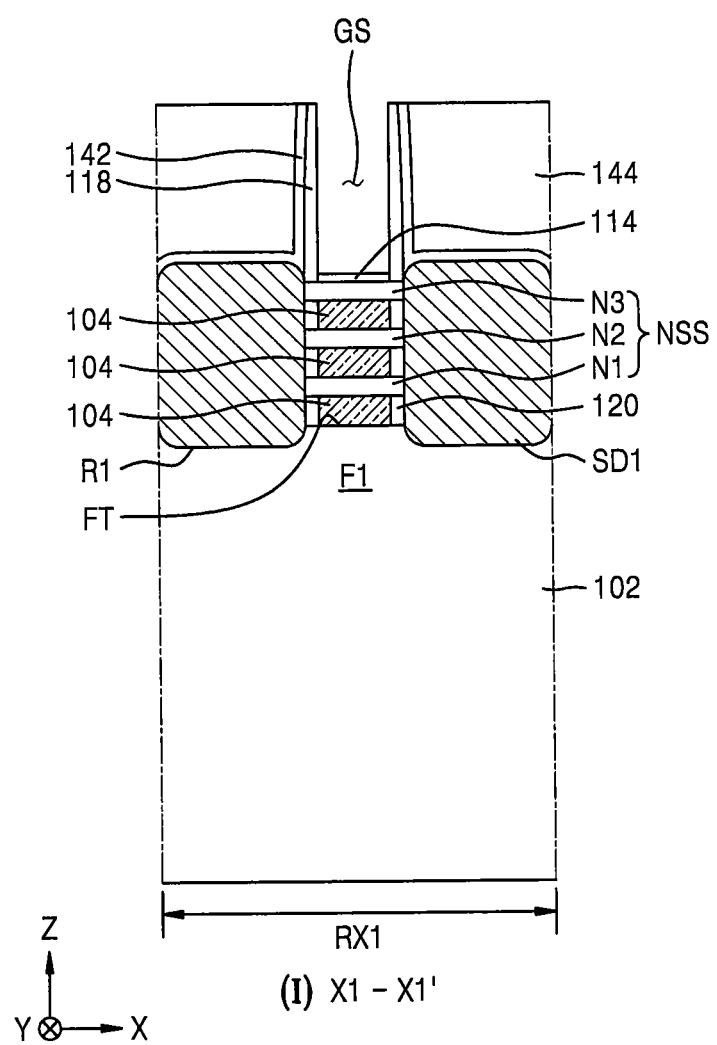
Figure 15B:
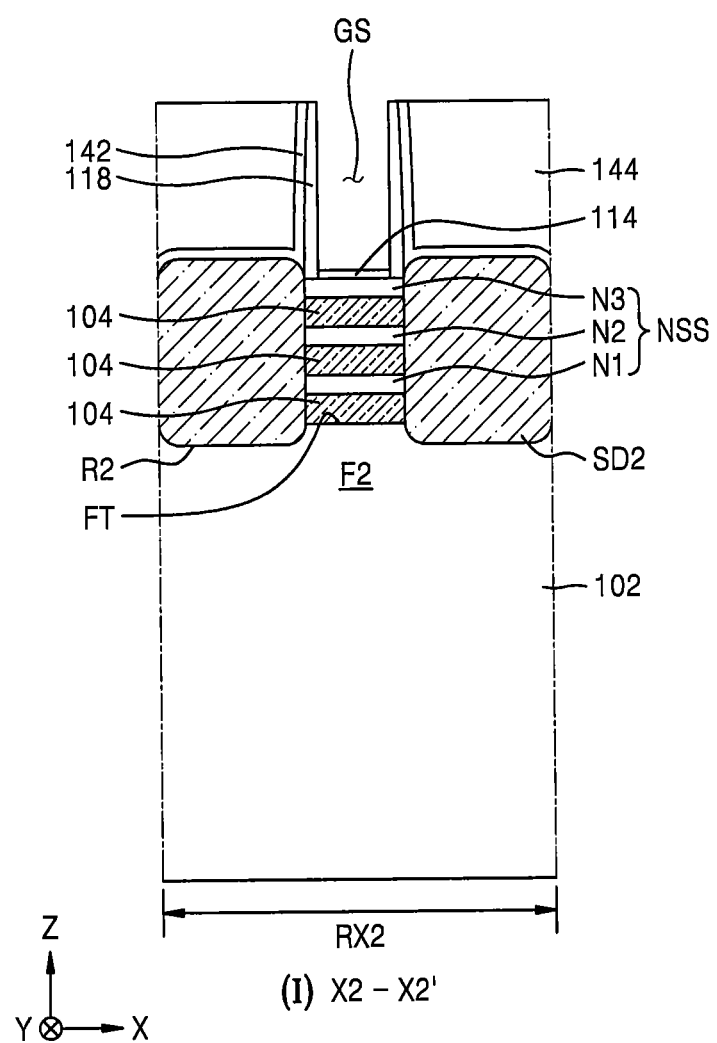
Figure 15C:
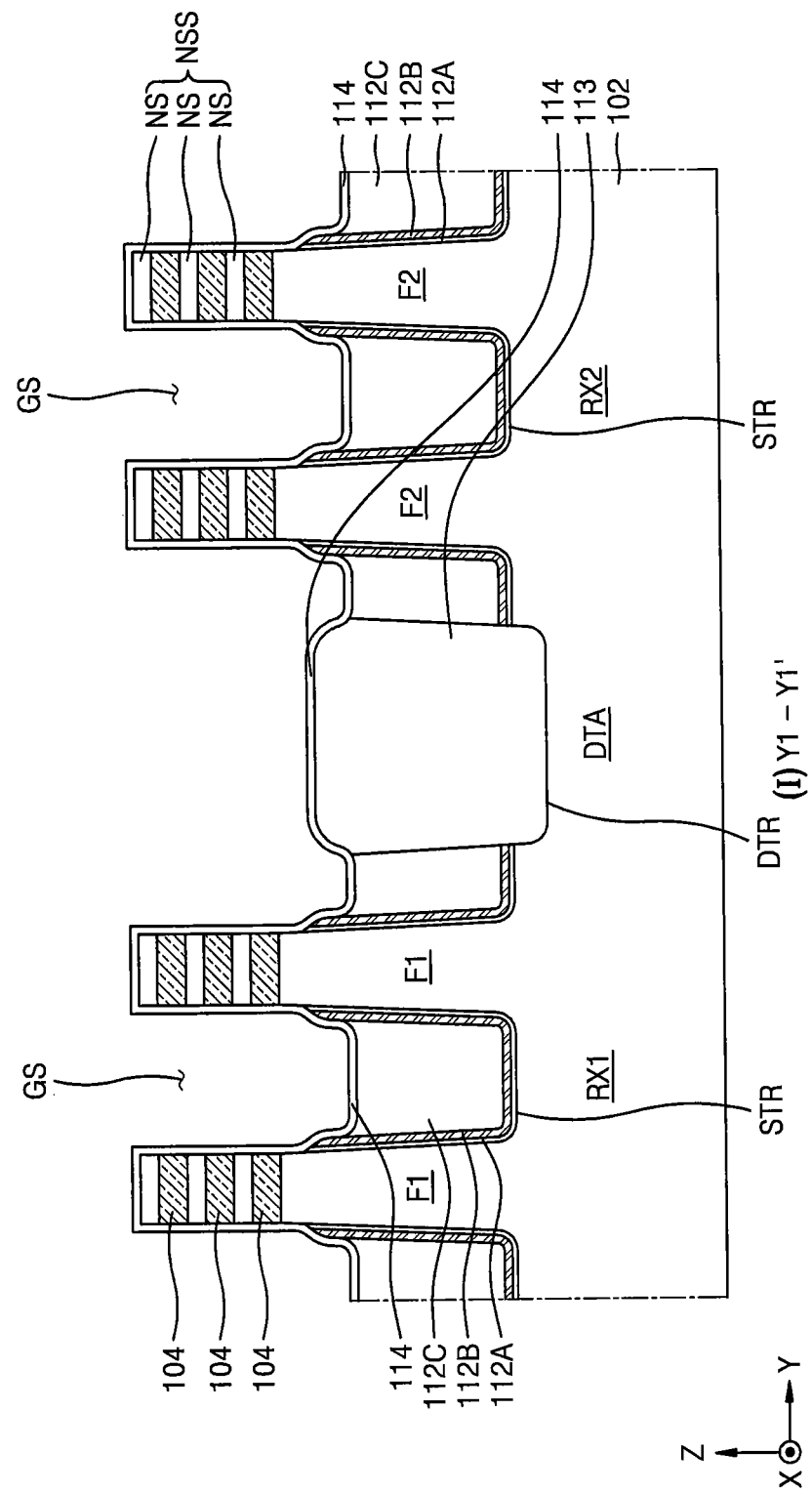
Figure 15D:
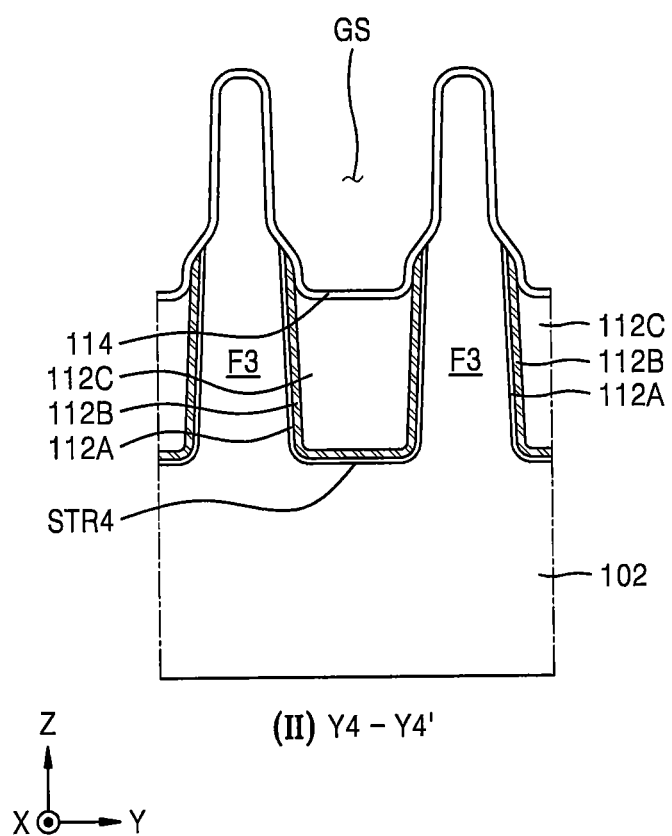
Figure 16A:
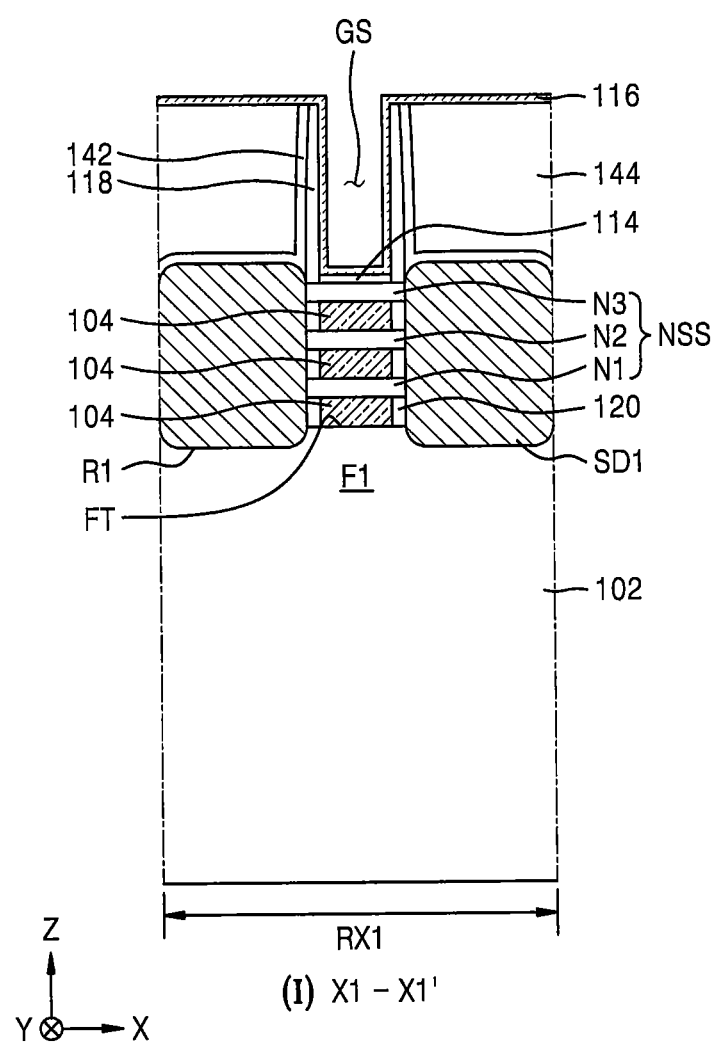
Figure 16B:
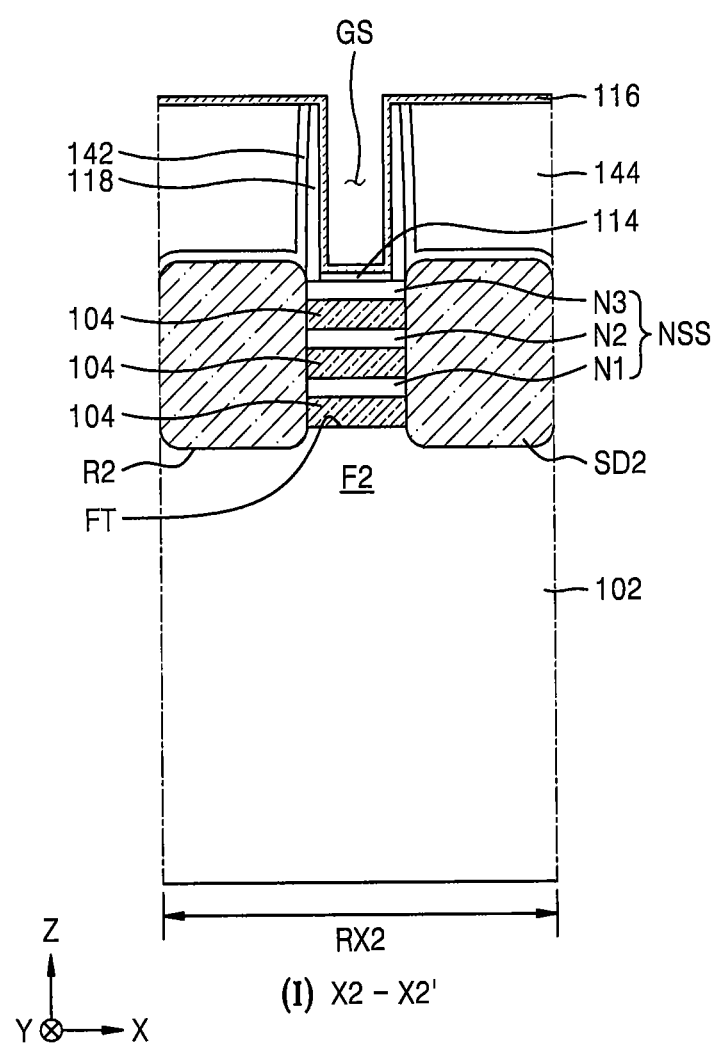
Figure 16C:
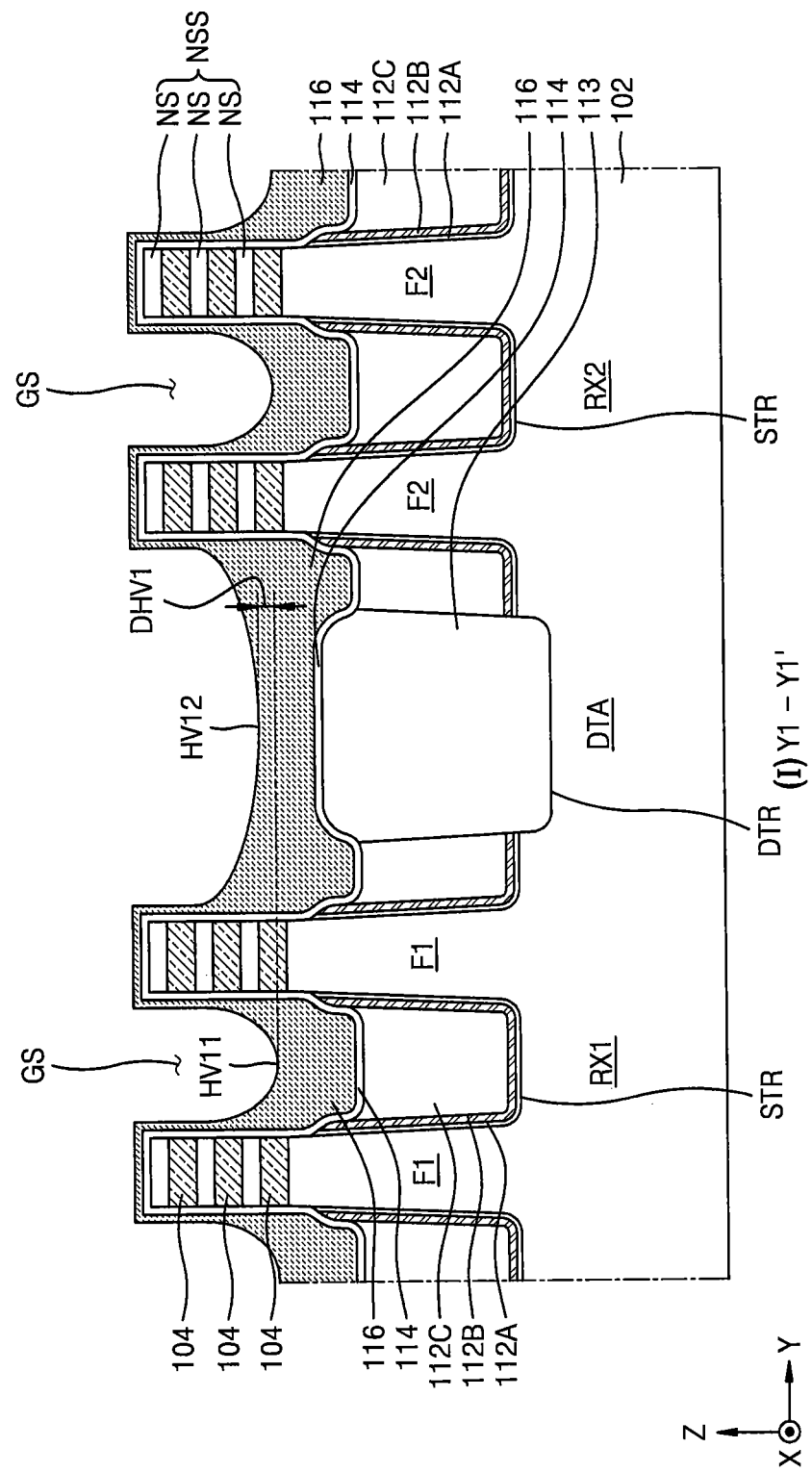
Figure 16D:
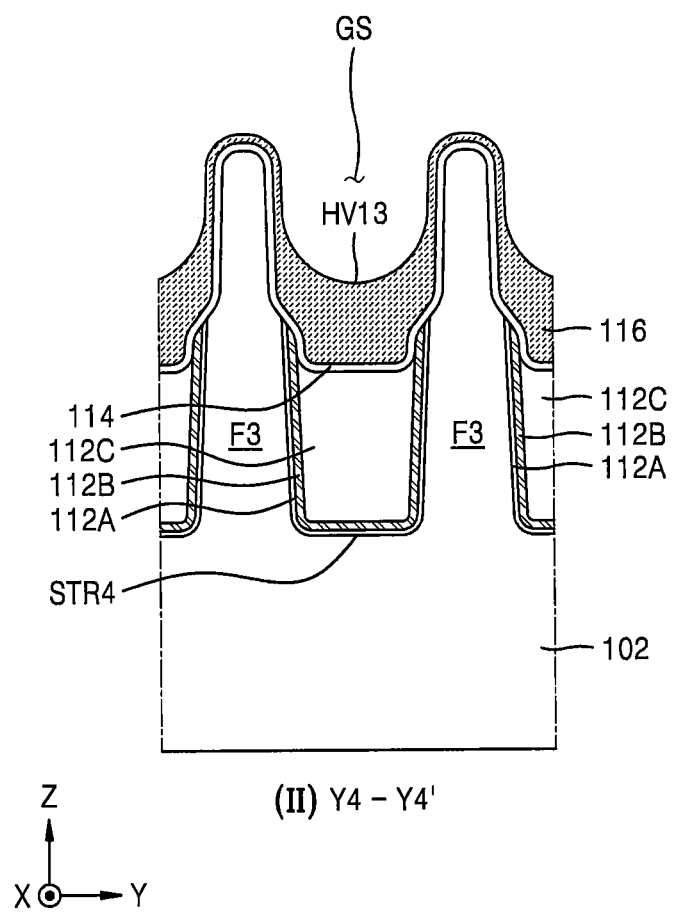
Figure 17A:
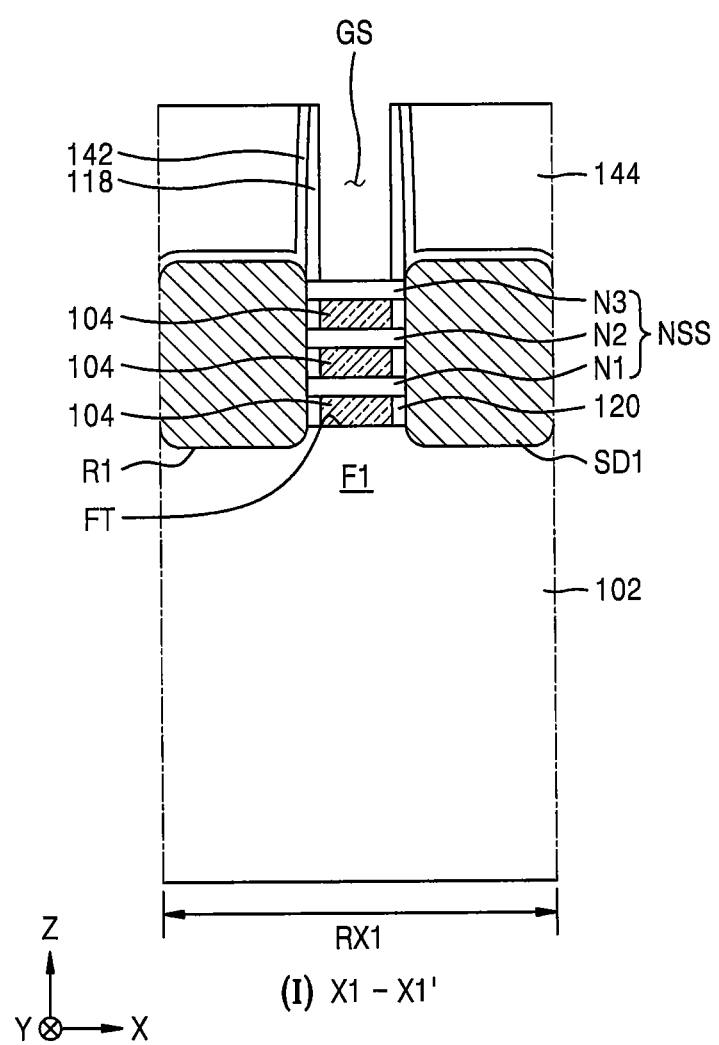
Figure 17B:
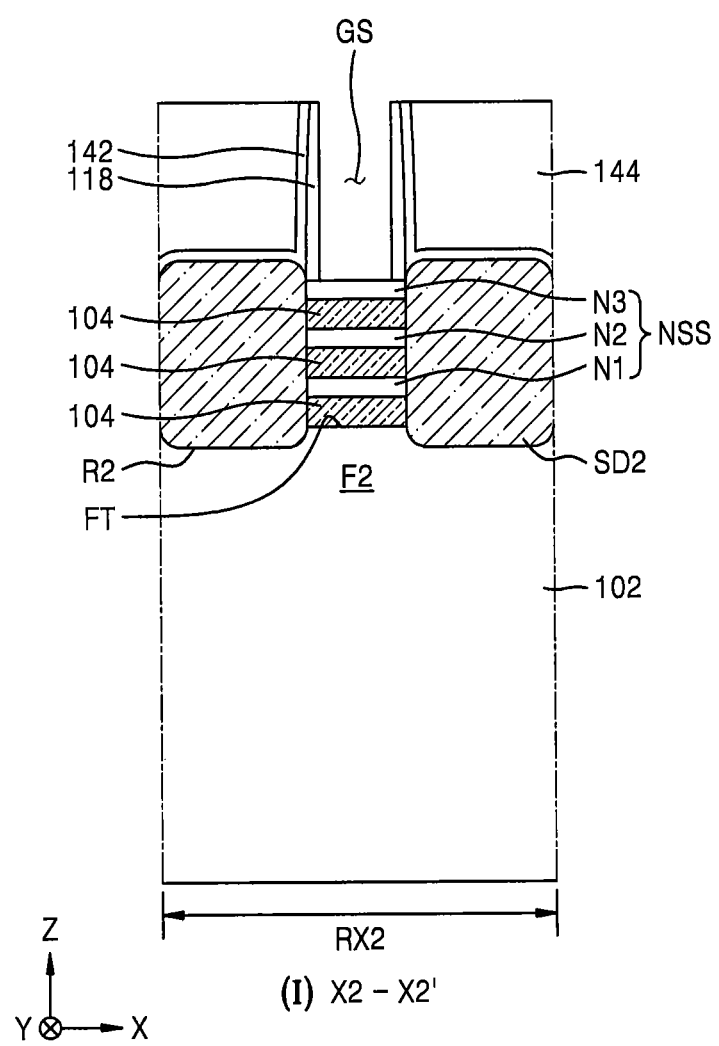
Figure 17C:
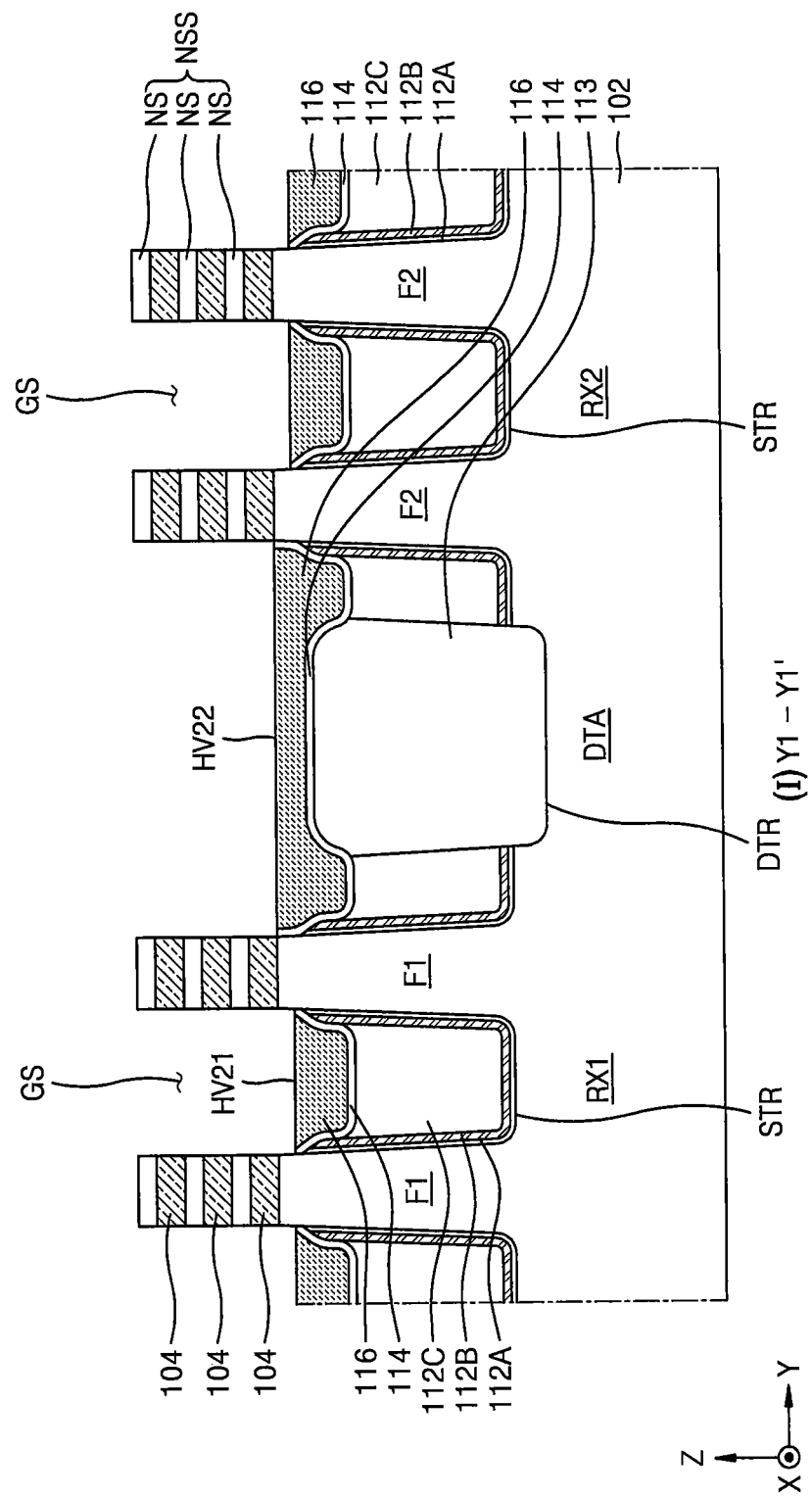
Figure 17D:
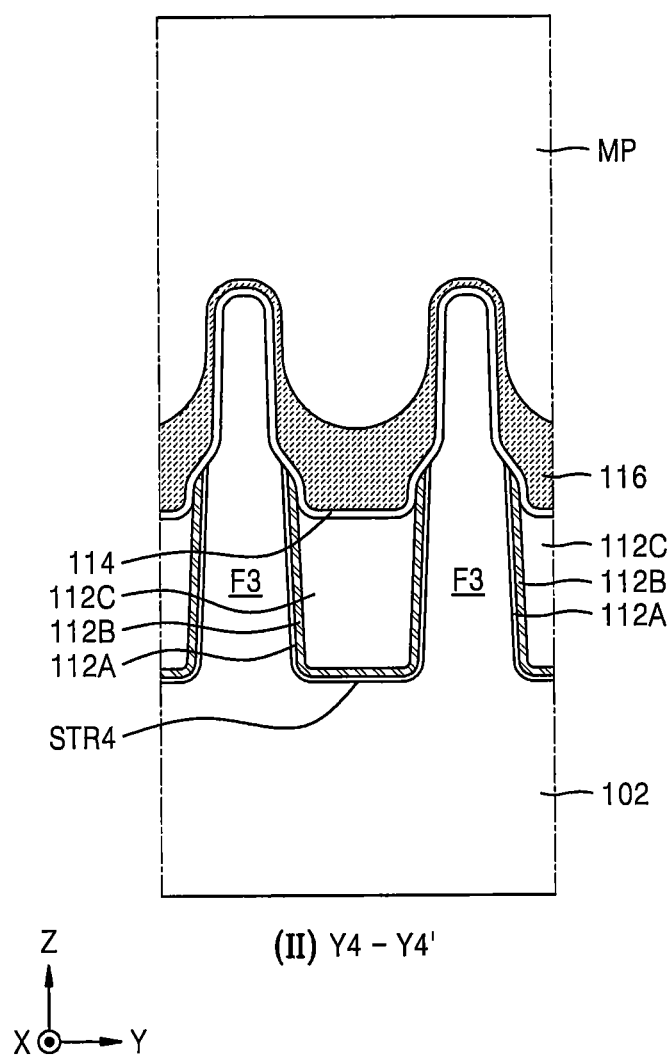
Figure 18A:
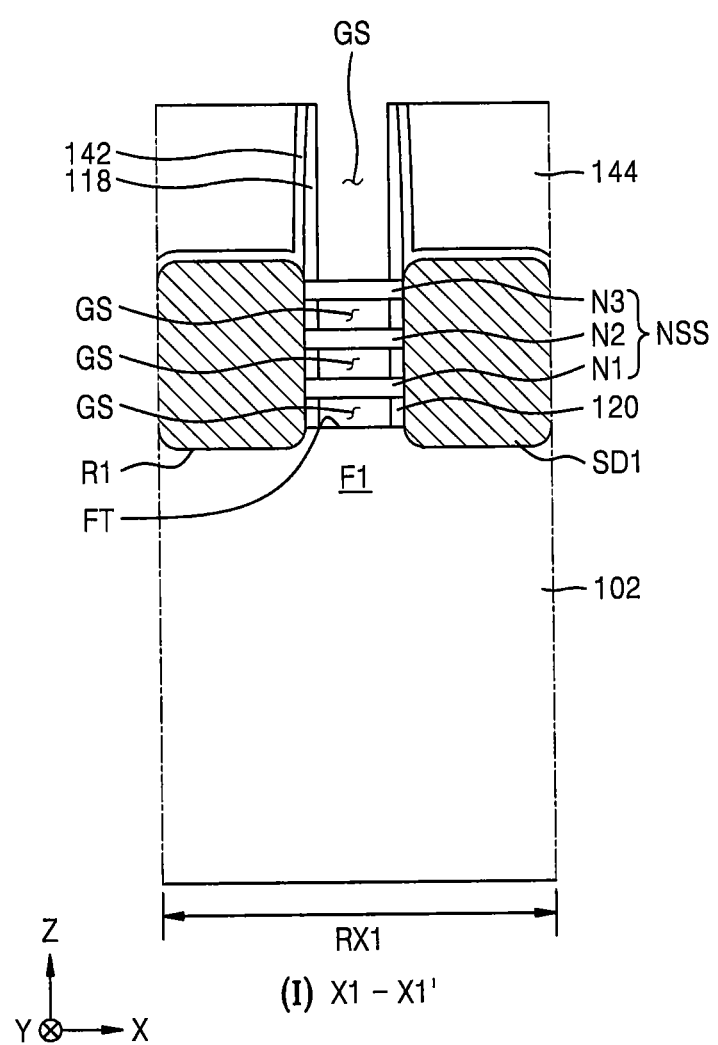
Figure 18B:
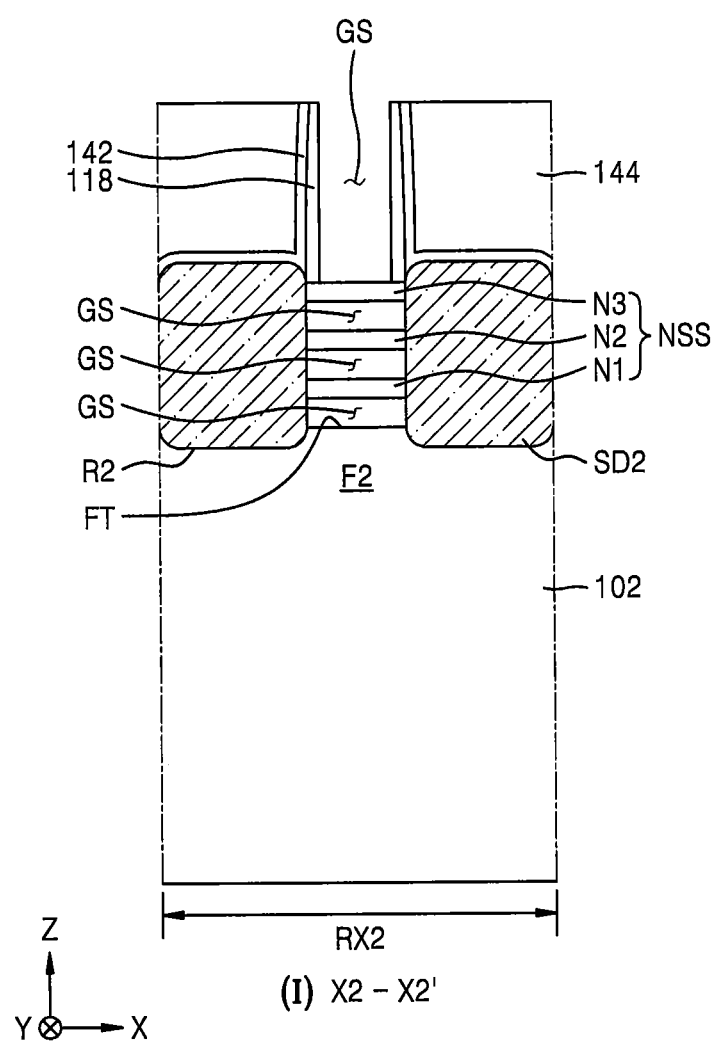
Figure 18C:
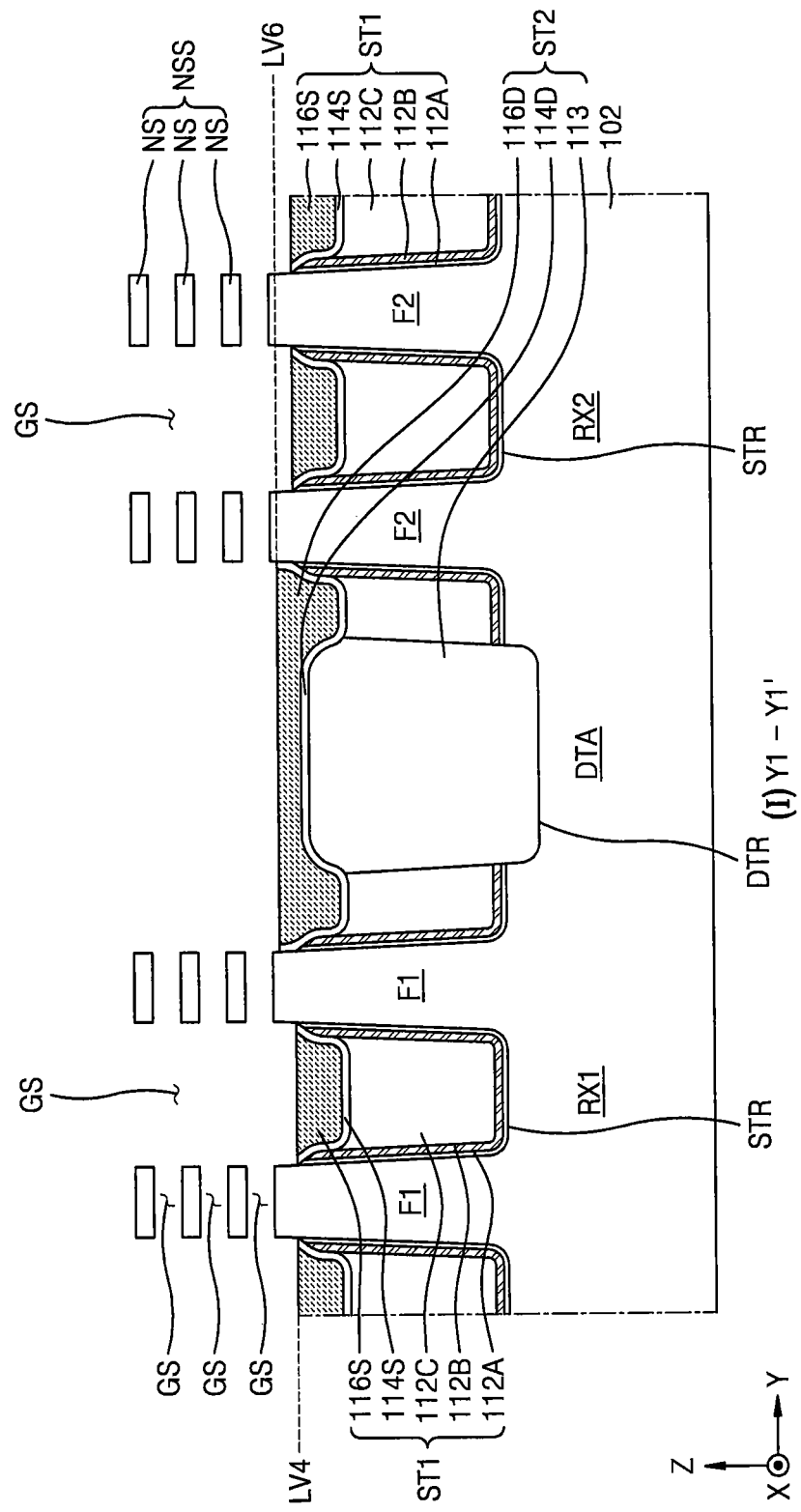
Figure 18D:
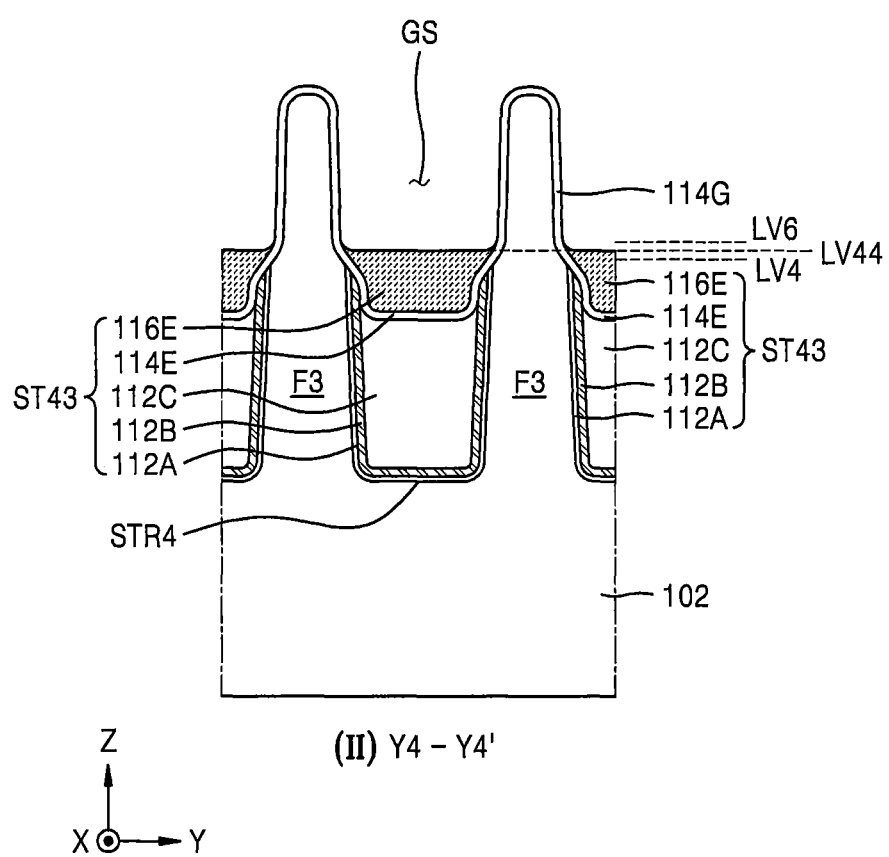
Figure 19A:
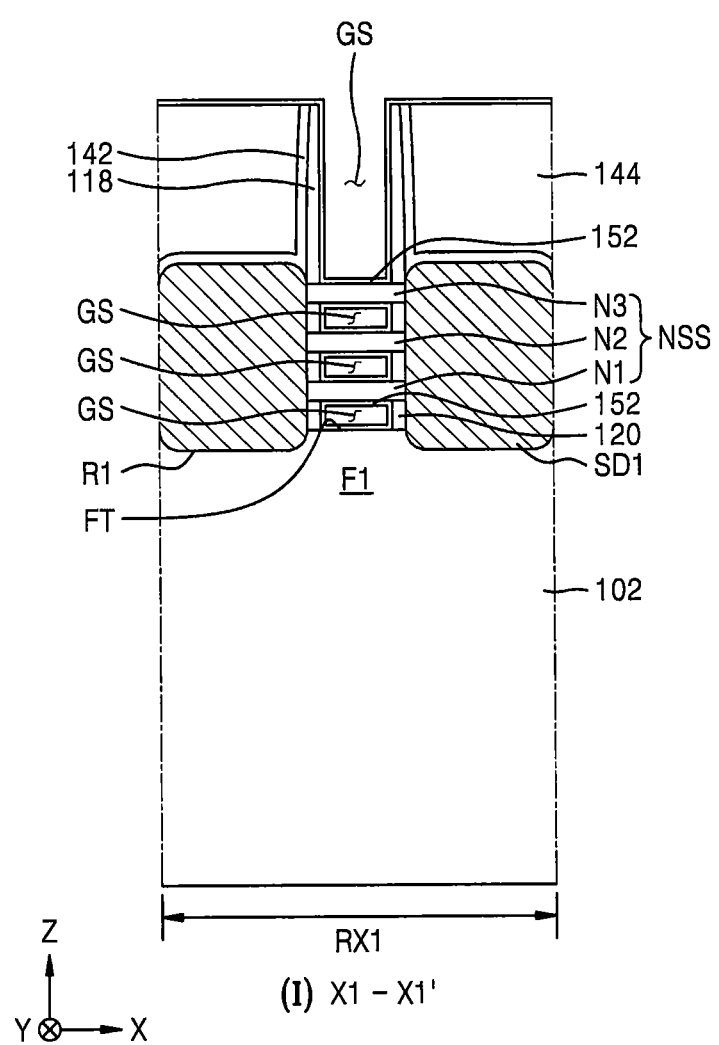
Figure 19B:
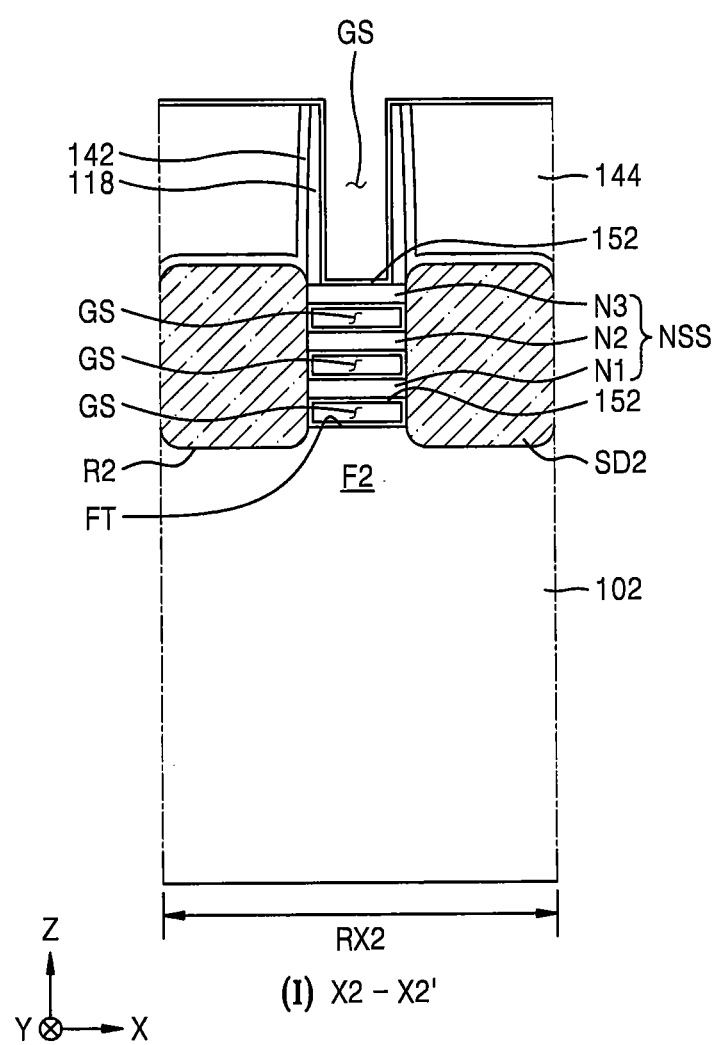
Figure 19C:
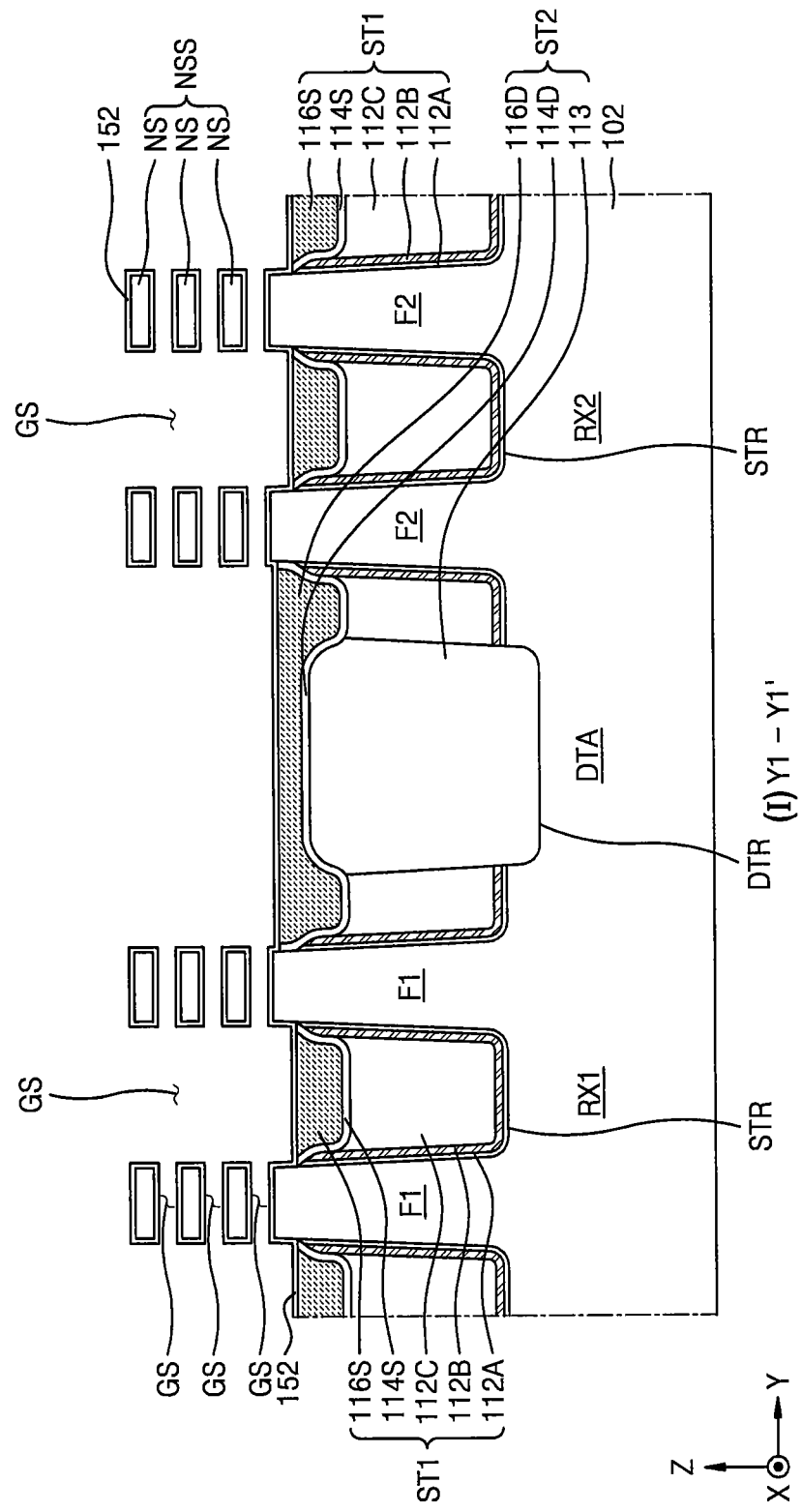
Figure 19D:
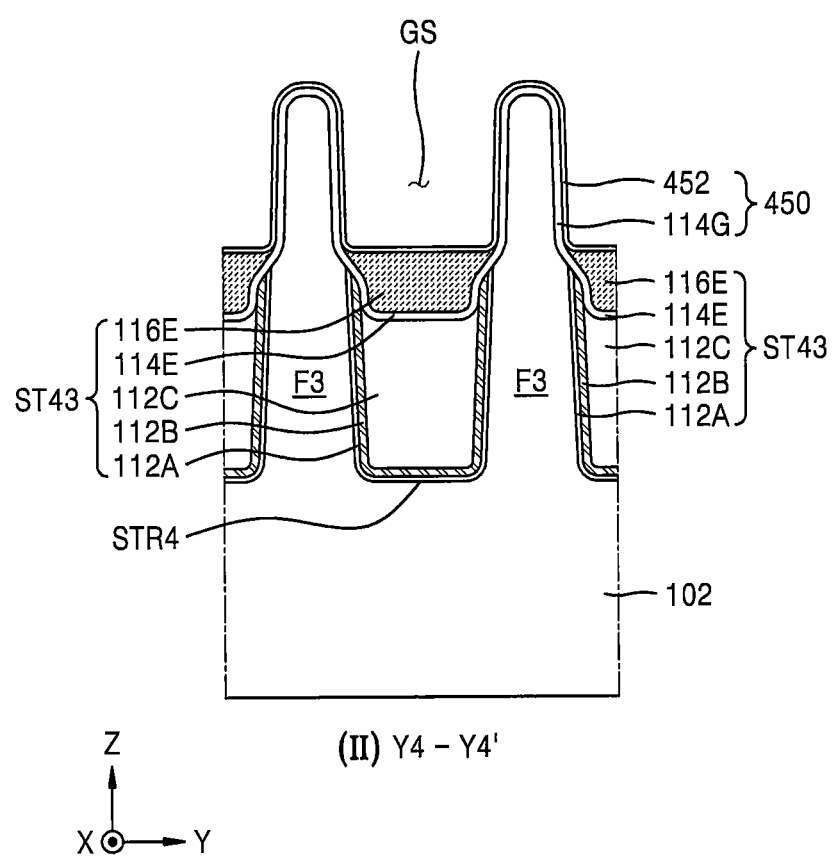
Figure 20A:
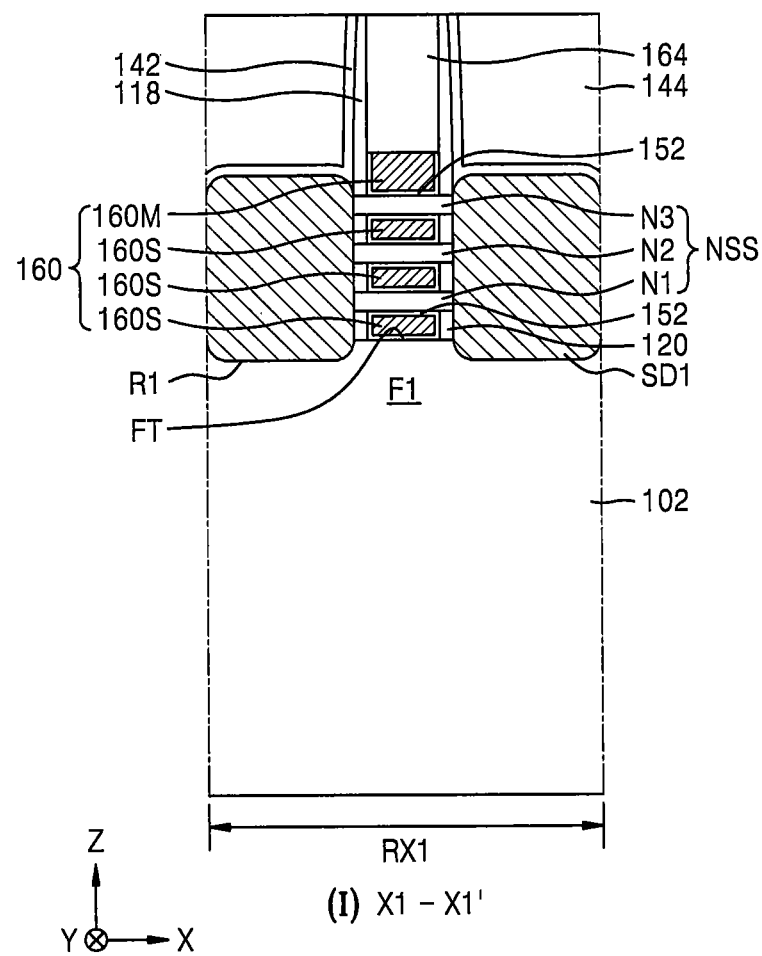
Figure 20B:
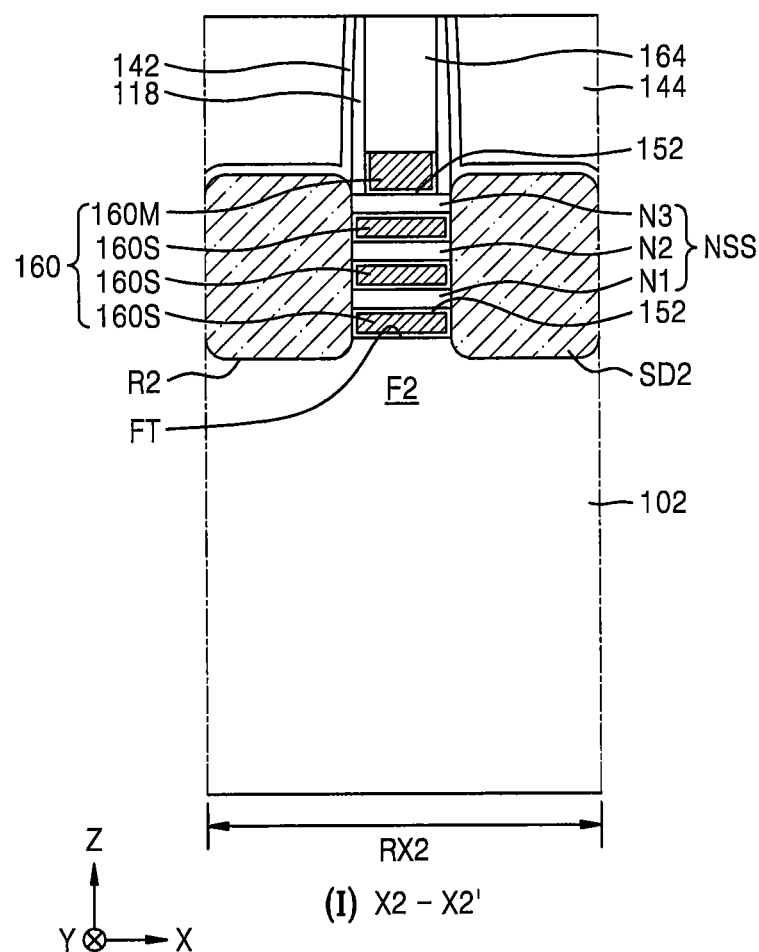
Figure 20C:
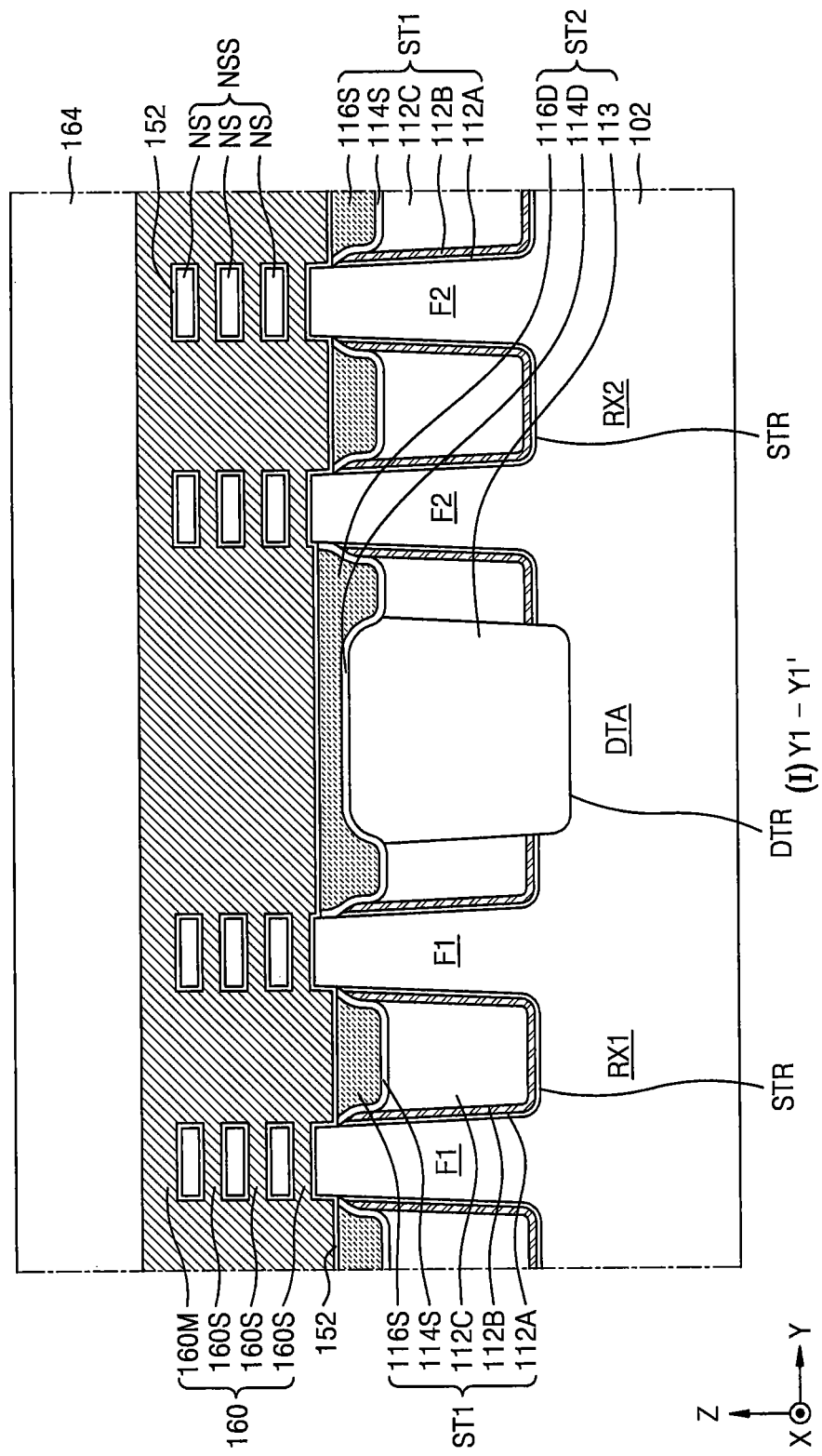
Figure 20D:
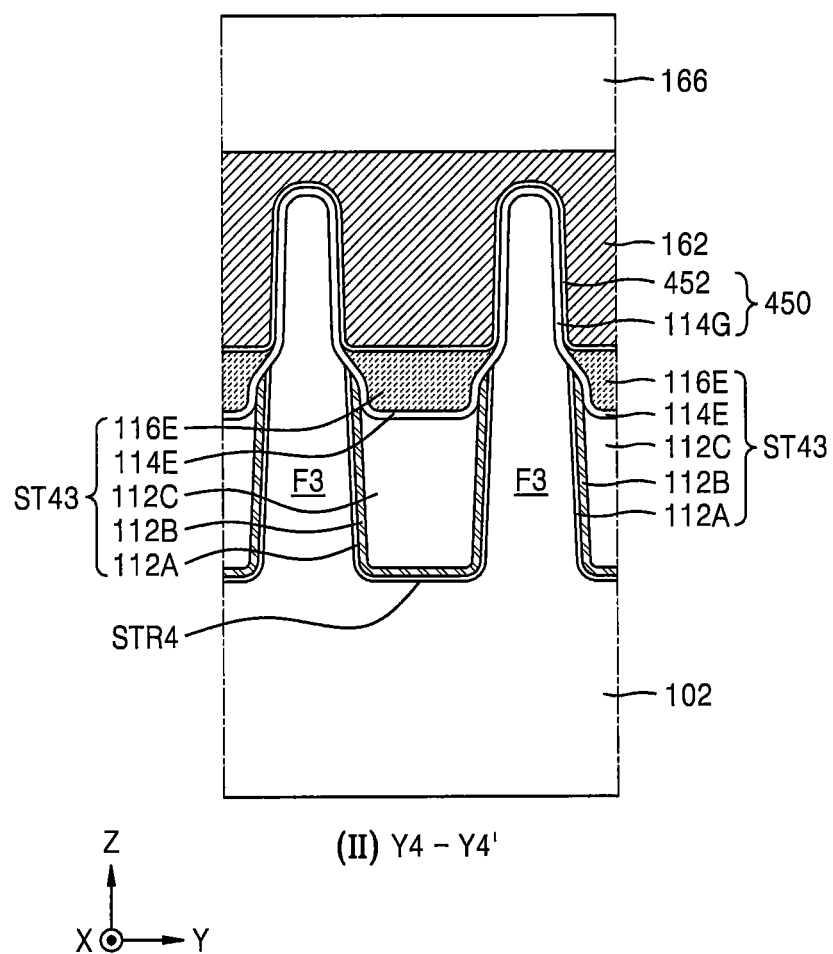

FIGS. 11A to 20D are cross-sectional views illustrating a method of manufacturing an integrated circuit device according to embodiments of the inventive concepts. FIGS. 11A, 12A, ..., and 20A are cross-sectional views showing a partial configuration of a portion corresponding to a cross-section taken along line X1-X1' of FIG. 1, FIGS. 11B, 12B, ..., and 20B are cross-sectional views showing a partial configuration of a portion corresponding to a cross-section taken along line X2-X2' of FIG. 1, FIGS. 11C, 12C, ..., and 20C are cross-sectional views showing a partial configuration of a portion corresponding to a cross-section taken along line Y1-Y1' of FIG. 1, and FIGS. 11D, 12D, ..., and 20D are cross-sectional views showing a partial configuration of a portion corresponding to a cross-section taken along line Y4-Y4' of FIG. 9. The method of manufacturing the integrated circuit device 400 illustrated in FIGS. 8 to 10 will be described with reference to FIGS. 11A to 20D. Here, a case where the first region I of the integrated circuit device 400 includes the configuration as described with respect to the integrated circuit device 100 with reference to FIGS. 1 to 2D is described as an example. In FIGS. 11A to 20D, the same reference numerals as in FIGS. 1 to 10 denote the same members, and detailed descriptions thereof are omitted here.

Referring to FIGS. 11A to 11D, the device isolation trench STR is formed in the substrate 102 by alternately stacking a plurality of sacrificial semiconductor layers 104 and a plurality of nanosheet semiconductor layers NS on the substrate 102 in the first region I, and then etching a part of each of the sacrificial semiconductor layer 104, the plurality of nanosheet semiconductor layers NS, and the substrate 102. As a result, the plurality of fin-type active regions F1 and F2 protruding upward from the substrate 102 may be formed in the vertical direction (e.g., the Z direction) in a first device region RX1 and a second device region RX2 of the first region I. A stack structure of the plurality of sacrificial semiconductor layers 104 and the plurality of nanosheet semiconductor layers NS may remain on the fin top surface FT of each of the plurality of fin-type active regions F1 and F2.

The plurality of sacrificial semiconductor layers 104 and the plurality of nanosheet semiconductor layers NS may include semiconductor materials having different etch selectivities. In some embodiments, the plurality of nanosheet semiconductor layers NS may include a Si layer, and the plurality of sacrificial semiconductor layers 104 may include a SiGe layer. In some embodiments, the Ge content in the plurality of sacrificial semiconductor layers 104 may be constant. The SiGe layer constituting the plurality of sacrificial semiconductor layers 104 may have a constant Ge content selected within a range of about 5 atomic % to about 60 atomic %, for example, about 10 atomic % to about 40 atomic %. The Ge content in the SiGe layer constituting the plurality of sacrificial semiconductor layers 104 may be variously selected as necessary.

A part of the substrate 102 is etched in the second region II to form the device isolation trench STR4 in the substrate 102. As a result, the plurality of fin-type active regions F3 protruding upward from the substrate 102 in the vertical direction (e.g., the Z direction) and extending parallel to each other in the first horizontal direction (e.g., the X direction) may be formed in the first region II.

Referring to FIGS. 12A to 12D, the deep trench DTR defining the first device region RX1 and the second device region RX2 may be formed in the first region I by forming a composite insulating layer 112 on a resultant of FIGS. 11A to 11D in the first region I and the second region II, then etching a part of the composite insulating layer 112 in the inter-device isolation area DTA of the first region I and, as a result, etching a part of the exposed substrate 102, and the deep trench DTR may be filled with the second lower buried insulating layer 113.

In some embodiments, a process of forming the composite insulating layer 112 may include forming the first insulating liner 112A conformally covering exposed surfaces of the resultant of FIGS. 11A to 11D, forming the second insulating liner 112B conformally covering a top surface of the first insulating liner 112A, and forming the first lower buried insulating layer 112C in spaces between the plurality of fin-type active regions F1, F2, and F3 on the second insulating liner 112B. The first lower buried insulating layer 112C may be formed to have a top surface extending flatly at a level higher than that of the plurality of fin-type active regions F1, F2, and F3.

In some embodiments, the first insulating liner 112A may include a silicon oxide layer, and the second insulating liner 112B may include a silicon nitride layer. The first lower buried insulating layer 112C may include a silicon oxide layer formed using a flowable chemical vapor deposition (FCVD) process or a spin coating process. The second lower buried insulating layer 113 may include a silicon oxide layer formed using a plasma deposition method. A density of the silicon oxide layer constituting the second lower buried insulating layer 113 may be greater than a density of the silicon oxide layer constituting the first lower buried insulating layer 112C.

Referring to FIGS. 13A to 13D, the composite insulating layer 112 and the second lower buried insulating layer 113 in the resultant of FIGS. 12A to 12D may be etched back in the first region I and the second region II such that sidewalls of each of the plurality of sacrificial semiconductor layers 104 and the plurality of nanosheet semiconductor layers NS are exposed in the first region I, and the fin top surface FT4 of each of the plurality of fin-type active regions F3 and both sidewalls of an upper portion of each of the plurality of fin-type active regions F3 may be exposed in the second region II.

In this regard, the density of the second lower buried insulating layer 113 may be higher than the density of the first lower buried insulating layer 112C so that a top surface of the second lower buried insulating layer 113 remaining on the substrate 102 after etching back the composite insulating layer 112 and the second lower buried insulating layer 113 may be higher than the top surface of the first lower buried insulating layer 112C.

Similar to the description with reference to FIG. 2D, after etching back the composite insulating layer 112 and the second lower buried insulating layer 113 in the first region I and the second region II, the second insulating liner 112B may have an uppermost portion of the second level LV2 lower than the first level LV1 of the fin top surface FT, the top surface of the first lower buried insulating layer 112C may have a lowermost portion of the third level LV3 lower than the second level LV2, and the top surface of the second lower buried insulating layer 113 may have an uppermost portion of the fifth level LV5 higher than the third level LV3. In the first region I, a second height H2 which is a distance in the vertical direction (e.g., the Z direction) from the fin top surface FT of each of the plurality of fin-type active regions F1 and F2 to the third level LV3 may be greater than the first height H1 which is a distance in the vertical direction (e.g., the Z direction) from the fin top surface FT to the second level LV2.

After the composite insulating layer 112 is etched back in the second region II, an upper portion of each of the plurality of fin-type active regions F3 may protrude from an upper portion of the composite insulating layer 112. While the composite insulating layer 112 is etched back in the second region II, the upper portion of each of the plurality of fin-type active regions F3 is exposed to an etch atmosphere of the composite insulating layer 112, and thus a width and a height of each of the plurality of fin-type active regions F3 may be reduced. In the resultant of etching back the composite insulating layer 112 in the second region II, a level of the fin top surface FT4 of each of the plurality of fin-type active regions F3 may be higher than a level of the fin top surface FT of each of the plurality of fin-type active regions F1 and F2.

Referring to FIGS. 14A to 14D, a stack pattern including the upper insulating liner 114, the dummy gate pattern DP, and the dummy capping pattern DC may be formed on the resultant of FIGS. 13A to 13D in the first region I and the second region II, and the outer insulating spacers 118 may be formed to cover both sidewalls of the stack pattern in the second horizontal direction (e.g., the X direction). In the first region I, the stack pattern may be formed to extend long in the second horizontal direction (e.g., the Y direction) at a position corresponding to the gate line 160 illustrated in FIG. 1. In the second region II, the stack pattern may be formed to extend long in the second horizontal direction (e.g., the Y direction) at a position corresponding to the gate line 162 illustrated in FIG. 9. In some embodiments, the upper insulating liner 114 may include a silicon oxide layer formed using a plasma deposition method, the dummy gate pattern DP may include a polysilicon layer, and the dummy capping pattern DC may include a silicon nitride layer. A density of the upper insulating liner 114 may be greater than that of the first lower buried insulating layer 112C.

Thereafter, the nanosheet stack NSS including the first to third nanosheets N1, N2, and N3 may be formed from the plurality of nanosheet semiconductor layers NS in the first device region RX1 by selectively removing a part of each of the plurality of sacrificial semiconductor layers 104 and the plurality of nanosheet semiconductor layers NS in the first device region RX1 of the first region I in the resultant in which the stack pattern and the outer insulating spacers 118 are formed, a plurality of first recesses R1 may be formed in an upper portion of the first fin-type active region F1 by etching a partial region of the first fin-type active region F1 on both sides of the nanosheet stack NSS, after providing indent spaces by selectively removing parts of the plurality of sacrificial semiconductor layers 104 exposed from both sides of the nanosheet stack NSS through the plurality of first recesses R1, the plurality of inner insulating spacers 120 filled in the indent spaces may be formed, and a plurality of first source/drain regions SD1 filled in the plurality of first recesses R1 may be formed on both sides of the nanosheet stack NSS.

To form the plurality of first source/drain regions SD1, the surface of the first fin-type active region F1 exposed from bottom surfaces of the plurality of first recesses R1 and a semiconductor material from each sidewall of each of the first to third nanosheets N1, N2, and N3 may be epitaxially grown. In some embodiments, to form the plurality of first source/drain regions SD1, a low-pressure chemical vapor deposition (LPCVD) process, a selective epitaxial growth (SEG) process, or a cyclic deposition and etching (CDE) process may be performed using raw materials including an elemental semiconductor precursor. In some embodiments, the plurality of first source/drain regions SD1 may include a Si layer doped with an n-type dopant. To form the plurality of first source/drain regions SD1, silane ($SiH_4$), disilane ($Si_2H_6$), trisilane ($Si_3H_8$), dichlorosilane ($SiH_2Cl_2$), etc. may be used as a Si source. The n-type dopant may be selected from P (phosphorus), As (arsenic), and Sb (antimony).

In some embodiments, while the plurality of first source/drain regions SD1 are formed in the first device region RX1 of the first region I, a plurality of third source/drain regions (not shown) may be formed on both sides of the stack pattern on a partial region of the plurality of fin-type active regions F3 in the second region II.

In addition, the nanosheet stack NSS including the first to third nanosheets N1, N2, and N3 may be formed from the plurality of nanosheet semiconductor layers NSS by selectively removing a part of each of the plurality of sacrificial semiconductor layers 104 and the plurality of nanosheet semiconductor layers NSS from the second device region RX2 of the first region I, a plurality of second recesses R2 may be formed in the upper portion of the second fin-type active region F2 by etching the second fin-type active region F2 exposed from both sides of the nanosheet stack NSS, and the plurality of source/drain regions SD2 filled in the plurality of second recesses R2 may be formed in both sides of the nanosheet stack NSS. Similar to the description of the plurality of first source/drain regions SD1, to form the plurality of second source/drain regions SD2, the surface of the second fin-type active region F2 exposed from bottom surfaces of the plurality of second recesses R2 and a semiconductor material from each sidewall of each of the first to third nanosheets N1, N2, and N3 may be epitaxially grown. In some embodiments, the plurality of second source/drain regions SD2 may include a SiGe layer doped with a p-type dopant. Si source and Ge source may be used to form the plurality of second source/drain regions SD2. As the Si source, silane ($SiH_4$), disilane ($Si_2H_6$), trisilane ($Si_3H_8$), dichlorosilane ($SiH_2Cl_2$), etc. may be used. As the Ge source, germain ($GeH_4$), desermain ($Ge_2H_6$), trigermain ($Ge_3H_8$), tetragermain ($Ge_4H_{10}$), dichlorogermain ($Ge_2H_2Cl_2$), etc. may be used. The p-type dopant may be selected from B (boron) and Ga (gallium).

In some embodiments, while the plurality of second source/drain regions SD2 are formed in the second device region RX2 of the first region I, a plurality of fourth source/drain regions (not shown) may be formed on both sides of the stack pattern on a partial region of the plurality of fin-type active regions F3 in the second region II.

Thereafter, in the first region I, the insulating liner 142 covering a surface of each of the plurality of first and second source/drain regions SD1 and SD2 and a surface of each of the plurality of outer insulating spacers 118 may be formed, and the inter-gate insulating layer 144 may be formed on the insulating liner 142. Similarly to the first region I, the insulating liner 142 and the inter-gate insulating layer 144 may be formed to cover each of a plurality of third and fourth source/drain regions (not shown) on both sides of the second horizontal direction (e.g., the X direction) of the stack pattern in the second region II.

Referring to FIGS. 15A to 15D, a top surface of the dummy gate pattern DP may be exposed by removing the dummy capping pattern DC from the resultant of FIGS. 14A to 14D, and the plurality of outer insulating spacers 118, the insulating liner 142 and the inter-gate insulating layer 144 may be planarized. Thereafter, a gate space GS may be provided by removing the dummy gate pattern DP, and the upper insulating liner 114 may be exposed through the gate space GS.

Referring to FIGS. 16A to 16D, the upper buried insulating layer 116 may be formed on the upper insulating liner 114 in the resultant of FIGS. 15A to 15D. The upper buried insulating layer 116 may be formed to have a larger thickness as the upper buried insulating layer 116 is closer to the substrate 102. The upper buried insulating layer 116 may include a silicon oxide layer.

In some embodiments, to form the upper buried insulating layer 116, an inhibitor plasma exposure process and a vapor deposition process including at least one atomic layer deposition (ALD) cycle may be alternately repeated with respect to the resultant of FIGS. 15A to 15D a plurality of times. The inhibitor plasma exposure process may be performed before and after the ALD process of 1 cycle, or may be performed once every ALD cycle of a certain number of times.

During the inhibitor plasma exposure process, a partial surface of an upper side of a structure including the resultant of FIGS. 15A to 15D may be passivated by an inhibitor plasma, which may suppress deposition in some regions of the upper side relatively far from the substrate 102 when a subsequent deposition process is performed. In some embodiments, a nitrogen atom source may be used to form the inhibitor plasma. In some embodiments, the nitrogen atom source may include $NF_3$, $N_2$, or a combination thereof, but is not limited thereto.

During the inhibitor plasma exposure process in the first region I and the second region II, an upper region of each of the plurality of fin-type active regions F1, F2, and F3 at a position relatively far from the substrate 102 may have a great passivation effect by the inhibitor plasma, and the passivation effect by the inhibitor plasma may be gradually reduced or there may be almost no passivation effect as the upper region is closer to the substrate 102.

During the deposition process including the at least one ALD cycle, the upper buried insulating layer 116 may be deposited to a larger thickness in parts closer to the substrate 102 than in the upper region of each of the plurality of fin-type active regions F1, F2, and F3 having the relatively great passivation effect by the inhibitor plasma, a bottom-up filling effect may be improved in forming the upper buried insulating layer 116.

After the upper buried insulating layer 116 is formed, a level of the top surface HV12 of the portion of the upper buried insulating layer 116 covering the second lower buried insulating layer 113 in the first region I may be higher than a level of the top surfaces HV11 and HV13 of each of the portions covering the first lower buried insulating layer 112C by a first height DHV1 in the first region I and the second region II.

In some embodiments, when N2 is used as the nitrogen atom source for forming the inhibitor plasma in forming the upper buried insulating layer 116, the upper buried insulating layer 116 may include a silicon oxide layer including impurity elements including a nitrogen (N) atom. In some embodiments, when $NF_3$ is used as the nitrogen atom source for forming the inhibitor plasma, the upper buried insulating layer 116 may include a silicon oxide layer including impurity elements including a fluorine (F) atom. In some embodiments, when a combination of $N_2$ and $NF_3$ is used as the nitrogen atom source for forming the inhibitor plasma, the upper buried insulating layer 116 may include a silicon oxide layer including impurity elements including a nitrogen (N) atom and a fluorine (F) atom.

Referring to FIGS. 17A to 17D, a mask pattern MP covering the second region II may be formed in the resultant of FIGS. 16A to 16D. In some embodiments, the mask pattern MP may include a photoresist pattern. Thereafter, while the second region II is covered with the mask pattern MP, sidewalls of each of the plurality of nanosheets N1, N2, and N3 and the plurality of sacrificial semiconductor layers 104 may be exposed in the gate space GS of the first region I by removing a part of an upper side of each of the upper buried insulating layer 116 and the upper insulating liner 114 in the first region I. As a result, a height of the top surface of each of the upper buried insulating layer 116 and the upper insulating liner 114 may be lowered.

After the part of an upper side of each of the upper buried insulating layer 116 and the upper insulating liner 114 is removed in the first region, a level of the top surface HV22 of a part of the upper buried insulating layer 116 covering the second lower buried insulating layer 113 in the first region I may be higher than the level of the top surface HV21 of each of parts covering the first lower buried insulating layer 112C.

Referring to FIGS. 18A to 18D, after removing the mask pattern MP from the second region II in the resultant of FIGS. 17A to 17D, the gate space GS may extend to a space between the plurality of nanosheets N1, N2, and N3 and a space between the first nanosheet N1 and the fin top surface FT by selectively removing the plurality of sacrificial semiconductor layers 104 remaining on the plurality of fin-type active regions F1 and F2 through the gate space GS of the upper portion of the nanosheet stack NSS in the first region I.

In some embodiments, to selectively remove the plurality of sacrificial semiconductor layers 104, a difference in etch selectivity between the plurality of nanosheets N1, N2, and N3 and the plurality of sacrificial semiconductor layers 104 may be used. A liquid or gaseous etchant may be used to selectively remove the plurality of sacrificial semiconductor layers 104. In some embodiments, to selectively remove the plurality of sacrificial semiconductor layers 104, a $CH_3COOH$-based etchant, for example, an etchant including a mixture of $CH_3COOH$, $HNO_3$, and HF, or an etchant including a mixture of $CH_3COOH$, $H_2O_2$, and HF may be used, but is not limited to the above-described examples.

During the etching process to selectively remove the plurality of sacrificial semiconductor layers 104, the upper buried insulating layer 116 and the upper insulating liner 114 may also be exposed to the etching atmosphere in the first region I and the second region II, and as a result, a small amount of a part of the upper side of each of the upper buried insulating layer 116 and the upper insulating liner 114 may be consumed by the etching atmosphere.

After the plurality of sacrificial semiconductor layers 104 are removed, as described with reference to FIG. 2D, the first upper buried insulating layer 116S having the top surface of the fourth level LV4 and the second upper buried insulating layer 116D having the top surface of the sixth level LV6 may be obtained from the upper buried insulating layer 116, and the first upper insulating liner 114S and the second upper insulating liner 114D may be obtained from the upper insulating liner 114 in the first region I. In the second region II, as described with reference to FIG. 10, the third upper buried insulating layer 116E having the top surface of the fourth level LV44 may be obtained from the upper buried insulating layer 116, and the upper insulating liner 114 may remain as the third upper insulating liner 114E interposed between the first lower buried insulating layer 112C and the third upper buried insulating layer 116E, and the lower gate dielectric layer 114G in contact with the fin-type active region F3. The fourth level LV44 of the top surface of the third upper buried insulating layer 116E in the second region II may be higher than the fourth level LV4 of the top surface of the first upper buried insulating layer 116S and may be lower than the sixth level LV6 of the top surface of the second upper buried insulating layer 116D in the first region I.

Referring to FIGS. 19A to 19D, the gate dielectric layer 152 covering exposed surfaces of the plurality of nanosheets N1, N2, N3 and the plurality of fin-type active regions F1 may be formed in the first region I by forming a high dielectric layer on the resultant of FIGS. 18A to 18D, and the upper gate dielectric layer 452 covering the upper portion of the fin-type active region F3 may be formed with the lower gate dielectric layer 114G therebetween in the second region II.

In the first region I, the gate dielectric layer 152 may be formed to conformally cover surfaces of the plurality of outer insulating spacers 118 exposed through the gate space GS. In the second region II, the lower gate dielectric layer 114G and the upper gate dielectric layer 452 may form the gate dielectric layer 450.

Referring to FIGS. 20A to 20D, a conductive layer may be formed so that the gate space GS is filled in the resultant of FIGS. 19A to 19D, and then etched back so that a part of an upper side of the gate space GS is empty again. As a result, the gate line 160 covering the gate dielectric layer 152 may be formed in the first region I, and the gate line 162 covering the gate dielectric layer 450 may be formed in the second region II. Thereafter, the capping insulating patterns 164 and 166 filled in the gate space GS may be formed on the gate lines 160 and 162 in the first region I and the second region II.

Thereafter, a plurality of source/drain contact holes (not shown) penetrating the inter-gate insulating layer 144 and the insulating liner 142 in the vertical direction (e.g., the Z direction) respectively in the first device region RX1 and the second device region RX2 of the first region I and exposing the plurality of first and second source/drain regions SD1 and SD2 may be formed, and then the plurality of metal silicide layers 172 (see FIGS. 2A and 2B) covering the plurality of source/drain regions SD1 and SD2 in lower portions of the plurality of source/drain contact holes and the plurality of source/drain contacts 174 (see FIGS. 2A and 2B) filled in the plurality of source/drain contact holes may be formed. In addition, the gate contact 184 (see FIG. 2C) penetrating the capping insulating pattern 164 in the vertical direction (e.g., the Z direction) and connected to the gate line 160 may be formed.

Thereafter, as illustrated in FIGS. 2A to 2D and 10, the interlayer insulating layer 190 may be formed on the resultant in which the source/drain contact 174 and the gate contact 184 are formed. Thereafter, as illustrated in FIGS. 2A to 2C, the plurality of source/drain via contacts 192 penetrating the interlayer insulating layer 190 and connected to the plurality of source/drain contacts 174 and the gate via contact 194 penetrating the interlayer insulating layer 190 and connected to the gate contact 184 may be formed in the first region I.

The methods of manufacturing the integrated circuit device 400 including the structure described with reference to FIGS. 2A to 2D in the first region I and the structure described with reference to FIGS. 9 and 10 in the second region are described above, but it will be understood that the integrated circuit devices 100A, 200, 200A, 300, and 300A illustrated in FIGS. 3 to 7, and integrated circuit devices having various structures modified and changed therefrom may be manufactured through various modifications and changes made within the scope of the embodiment of the inventive concept from those described with reference to FIGS. 11A to 20D.

In some embodiments, to manufacture the integrated circuit devices 200 and 300 illustrated in FIGS. 4 and 6, in the process described with reference to FIGS. 17A to 17D, by controlling the etching atmosphere of the upper buried insulating layer 116, the first upper buried insulating layer 216S and the second upper buried insulating layer 216D having a convex top surface toward the gate line 160 as illustrated in FIG. 4 may be formed or the first upper buried insulating layer 316S and the second upper buried insulating layer 316D having a concave top surface toward the gate line 160 as illustrated in FIG. 6 may be formed. Thereafter, subsequent processes described with reference to FIGS. 18A to 20D may be performed to manufacture the integrated circuit devices 200 and 300 illustrated in FIGS. 4 and 6.

In some embodiments, to manufacture the integrated circuit devices 100A, 200A, and 300A illustrated in FIGS. 3, 5, and 7, the first silicon oxide layer S1 and the second silicon oxide layer S2 may be formed from the upper buried insulating layer 116 or the first and second upper buried insulating layers 116S and 116D by performing the process described with reference to FIGS. 17A to 17D, or performing the process described with reference to FIGS. 18A to 18D, then performing a purge process using a gas including $H_2$, $N_2$, Ar, He, or a combination thereof on the resultant, and removing an impurity element, such as a nitrogen (N) atom and/or a fluorine (F) atom, from the exposed surface of the upper buried insulating layer 116 or the exposed surface of each of the first and second upper buried insulating layers 116S and 116D at a partial thickness. Here, the second silicon oxide layer S2 may correspond to a part of the upper buried insulating layer 116 or the first and second upper buried insulating layers 116S and 116D from which the impurity element is removed by the purge process, and the first silicon oxide layer S1 may correspond to a remaining part of the upper buried insulating layer 116 or the first and second upper buried insulating layers 116S and 116D that is not affected by the purge process.

While the inventive concepts have been particularly shown and described with reference to embodiments thereof, it will be understood that various changes in form and details may be made therein without departing from the scope of the following claims.

What is claimed is:

1. An integrated circuit device, comprising:
a fin-type active region extending in a first horizontal direction on a substrate and comprising a fin top surface;
a nanosheet stack comprising at least one nanosheet on the fin top surface, the nanosheet stack being spaced apart from the fin top surface in a vertical direction;
a gate line extending in a second horizontal direction crossing the first horizontal direction on the fin-type active region, the gate line surrounding the at least one nanosheet; and
an insulating structure between the substrate and the gate line and on a sidewall of the fin-type active region,
wherein the insulating structure comprises:
a lower buried insulating layer comprising a first top surface facing the gate line, the first top surface being closer to a bottom surface of the substrate than the fin top surface;
an upper buried insulating layer between the lower buried insulating layer and the gate line, the upper buried insulating layer comprising a second top surface facing the gate line, the second top surface being farther from the bottom surface of the substrate than the first top surface; and
an upper insulating liner between the sidewall of the fin-type active region and the upper buried insulating layer and between the lower buried insulating layer and the upper buried insulating layer.

2. The integrated circuit device of claim 1, wherein the upper buried insulating layer is spaced apart from the fin-type active region with the upper insulating liner between the upper buried insulating layer and the fin-type active region.

3. The integrated circuit device of claim 1, wherein the upper insulating liner comprises a first part overlying the lower buried insulating layer in the vertical direction, and a second part that is closer to the sidewall of the fin-type active region than both of the lower buried insulating layer and the upper buried insulating layer.

4. The integrated circuit device of claim 1, wherein the upper buried insulating layer comprises a silicon oxide layer comprising at least one impurity element comprising at least one of nitrogen (N) and fluorine (F).

5. The integrated circuit device of claim 1, wherein the upper buried insulating layer comprises:
a first silicon oxide layer comprising at least one of nitrogen (N) atom and fluorine (F); and
a second silicon oxide layer between the first silicon oxide layer and the gate line.

6. The integrated circuit device of claim 1, wherein the first top surface of the lower buried insulating layer has a concave shape toward the gate line, and
wherein a bottom surface of the upper buried insulating layer faces the first top surface of the lower buried insulating layer and has a convex shape toward the substrate.

7. The integrated circuit device of claim 1, wherein at least a portion of the second top surface of the upper buried insulating layer has a planar shape extending in the second horizontal direction.

8. The integrated circuit device of claim 1, wherein at least a portion of the second top surface of the upper buried insulating layer has a convex shape toward the gate line.

9. The integrated circuit device of claim 1, wherein at least a portion of the second top surface of the upper buried insulating layer has a concave shape toward the gate line.

10. The integrated circuit device of claim 1, wherein each of the lower buried insulating layer and the upper insulating liner comprises a silicon oxide layer,
wherein the upper buried insulating layer comprises a silicon oxide layer comprising at least one of nitrogen (N) and fluorine (F), and wherein a density of the lower buried insulating layer is lower than a respective density of each of the upper insulating liner and the upper buried insulating layer.

11. An integrated circuit device, comprising:
a substrate comprising a device region and an inter-device isolation region defining the device region;
a fin-type active region extending in a first horizontal direction in the device region and comprising a fin top surface;
a nanosheet stack comprising at least one nanosheet on the fin top surface, the nanosheet stack being spaced apart from the fin top surface in a vertical direction;
a gate line extending in a second horizontal direction crossing the first horizontal direction in the device region and the inter-device isolation region, the gate line surrounding the at least one nanosheet on the fin-type active region;
a first insulating structure between the substrate and the gate line in the device region and on a sidewall of the fin-type active region; and
a second insulating structure between the substrate and the gate line in the inter-device isolation region,
wherein the first insulating structure comprises:
a first lower buried insulating layer on the sidewall of the fin-type active region, the first lower buried insulating layer comprising a first top surface facing the gate line, the first top surface being closer to a bottom surface of the substrate than the fin top surface;
a first upper buried insulating layer between the first lower buried insulating layer and the gate line, the first upper buried insulating layer comprising a second top surface facing the gate line, the second top surface being farther from the bottom surface of the substrate than the first top surface; and
a first upper insulating liner between the sidewall of the fin-type active region and the first upper buried insulating layer and between the first lower buried insulating layer and the first upper buried insulating layer.

12. The integrated circuit device of claim 11, wherein the second insulating structure comprises:
a second lower buried insulating layer between the substrate and the gate line, the second lower buried insulating layer comprising a third top surface facing the gate line, the third top surface being farther from the bottom surface of the substrate than the first top surface of the first lower buried insulating layer; and
a second upper buried insulating layer between the second lower buried insulating layer and the gate line, the second upper buried insulating layer comprising a fourth top surface facing the gate line, the fourth top surface being farther from the bottom surface of the substrate than the second top surface of the first upper buried insulating layer.

13. The integrated circuit device of claim 11, wherein the second insulating structure comprises:
a second lower buried insulating layer between the substrate and the gate line; and
a second upper buried insulating layer between the second lower buried insulating layer and the gate line, and
wherein each of the first upper buried insulating layer and the second upper buried insulating layer comprises a silicon oxide layer comprising at least one of nitrogen (N) and fluorine (F).

14. The integrated circuit device of claim 11, wherein the second insulating structure comprises:
a second lower buried insulating layer between the substrate and the gate line; and
a second upper buried insulating layer between the second lower buried insulating layer and the gate line, and
wherein each of the first upper buried insulating layer and the second upper buried insulating layer comprises:
a first silicon oxide layer comprising at least one of nitrogen (N) and fluorine (F); and
a second silicon oxide layer between the first silicon oxide layer and the gate line.

15. The integrated circuit device of claim 11, wherein the second insulating structure comprises:
a second lower buried insulating layer between the substrate and the gate line, the second lower buried insulating layer comprising a third top surface facing the gate line, the third top surface being farther from the bottom surface of the substrate than the first top surface of the first lower buried insulating layer;
a second upper buried insulating layer between the second lower buried insulating layer and the gate line, the second upper buried insulating layer comprising a fourth top surface facing the gate line, the fourth top surface being farther from the bottom surface of the substrate than the second top surface of the first upper buried insulating layer; and
a second upper insulating liner between the second lower buried insulating layer and the second upper buried insulating layer,
wherein the first upper buried insulating layer is spaced apart from the fin-type active region with the first upper insulating liner between the first upper buried insulating layer and the fin-type active region, and
wherein the second upper buried insulating layer is spaced apart from the fin-type active region with the second upper insulating liner between the second upper buried insulating layer and the fin-type active region.

16. The integrated circuit device of claim 11, wherein the second insulating structure comprises:
a second lower buried insulating layer between the substrate and the gate line; and
a second upper buried insulating layer between the second lower buried insulating layer and the gate line,
wherein the first lower buried insulating layer comprises a first silicon oxide layer having a first density, and
wherein the second lower buried insulating layer comprises a second silicon oxide layer having a second density greater than the first density.

17. An integrated circuit device, comprising:
a substrate comprising a first region and a second region spaced apart from each other;
a first fin-type active region defined by a first device isolation trench in the first region, the first fin-type active region comprising a first fin top surface at a first level;
at least one nanosheet on the first fin top surface;
a first gate line on the first fin-type active region, the first gate line surrounding the at least one nanosheet on the first fin top surface;
a second fin-type active region defined by a second device isolation trench in the second region, the second fin-type active region comprising a second fin top surface higher, relative to a bottom surface of the substrate, than the first fin top surface;
a second gate line on the second fin-type active region, the second gate line surrounding the second fin top surface and sidewalls of the second fin-type active region;
a first insulating structure on a sidewall of the first fin-type active region in the first region; and a second insulating structure on a sidewall of the second fin-type active region in the second region, wherein each of the first insulating structure and the second insulating structure comprises:

a lower buried insulating layer comprising a first top surface closer to a bottom surface of the substrate than the first level;

an upper buried insulating layer comprising a second top surface farther from the bottom surface of the substrate than the first top surface; and an upper insulating liner between the lower buried insulating layer and the upper buried insulating layer.

18. The integrated circuit device of claim 17, wherein the upper buried insulating layer is spaced apart from the first fin-type active region with the upper insulating liner between the upper buried insulating layer and the first fin-type active region in the first region.

19. The integrated circuit device of claim 17, wherein the upper insulating liner comprises a first part overlying the lower buried insulating layer in the vertical direction, and a second part that is closer to the sidewall of the first fin-type active region than both of the lower buried insulating layer and the upper buried insulating layer.

20. The integrated circuit device of claim 17, wherein the upper buried insulating layer comprises a silicon oxide layer comprising at least one of nitrogen (N) and fluorine (F) in each of the first region and the second region.

\* \* \* \* \*